(12) United States Patent
Akimoto

(10) Patent No.: US 8,043,796 B2
(45) Date of Patent: Oct. 25, 2011

(54) MANUFACTURING METHOD OF SEMICONDUCTOR DEVICE

(75) Inventor: Kengo Akimoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 789 days.

(21) Appl. No.: 11/957,884

(22) Filed: Dec. 17, 2007

(65) Prior Publication Data

US 2008/0153039 A1 Jun. 26, 2008

(30) Foreign Application Priority Data

Dec. 20, 2006 (JP) ................. 2006-343418

(51) Int. Cl.
*G03F 7/26* (2006.01)
(52) U.S. Cl. ...................................... 430/313
(58) Field of Classification Search ............. 430/313, 430/320
See application file for complete search history.

(56) References Cited

U.S. PATENT DOCUMENTS

| | | | |
|---|---|---|---|
| 4,861,694 A | 8/1989 | Aoki et al. | |
| 4,861,964 A | 8/1989 | Sinohara | |
| 4,865,686 A | 9/1989 | Sinohara | |
| RE33,947 E | 6/1992 | Shinohara | |
| 5,188,706 A * | 2/1993 | Hori et al. ................ | 216/12 |
| 5,708,252 A | 1/1998 | Shinohara et al. | |
| 5,912,187 A * | 6/1999 | Blasko et al. ............. | 438/719 |
| 6,149,988 A | 11/2000 | Shinohara et al. | |
| 6,261,856 B1 | 7/2001 | Shinohara et al. | |
| 2005/0064675 A1 | 3/2005 | Kim | |
| 2006/0246279 A1 | 11/2006 | Urairi et al. | |
| 2007/0281247 A1* | 12/2007 | Phillips et al. ............ | 430/311 |
| 2008/0087629 A1* | 4/2008 | Shimomura et al. ......... | 216/11 |
| 2008/0182207 A1* | 7/2008 | Yamazaki et al. .......... | 430/311 |

FOREIGN PATENT DOCUMENTS

| | | |
|---|---|---|
| JP | 63-84789 | 4/1988 |
| JP | 2000-133636 | 5/2000 |

* cited by examiner

*Primary Examiner* — Kathleen Duda
*Assistant Examiner* — Caleen Sullivan
(74) *Attorney, Agent, or Firm* — Husch Blackwell LLP

(57) ABSTRACT

A light absorption layer is formed over a substrate, the light absorption layer is selectively irradiated with a laser beam, and a region of the light absorption layer, which is irradiated with the laser beam, is removed. By adding an impurity element imparting one conductivity type or an inert element to a remaining part of the light absorption layer, a tensile stress of the light absorption layer is made lower than that before irradiation with the laser beam.

36 Claims, 36 Drawing Sheets

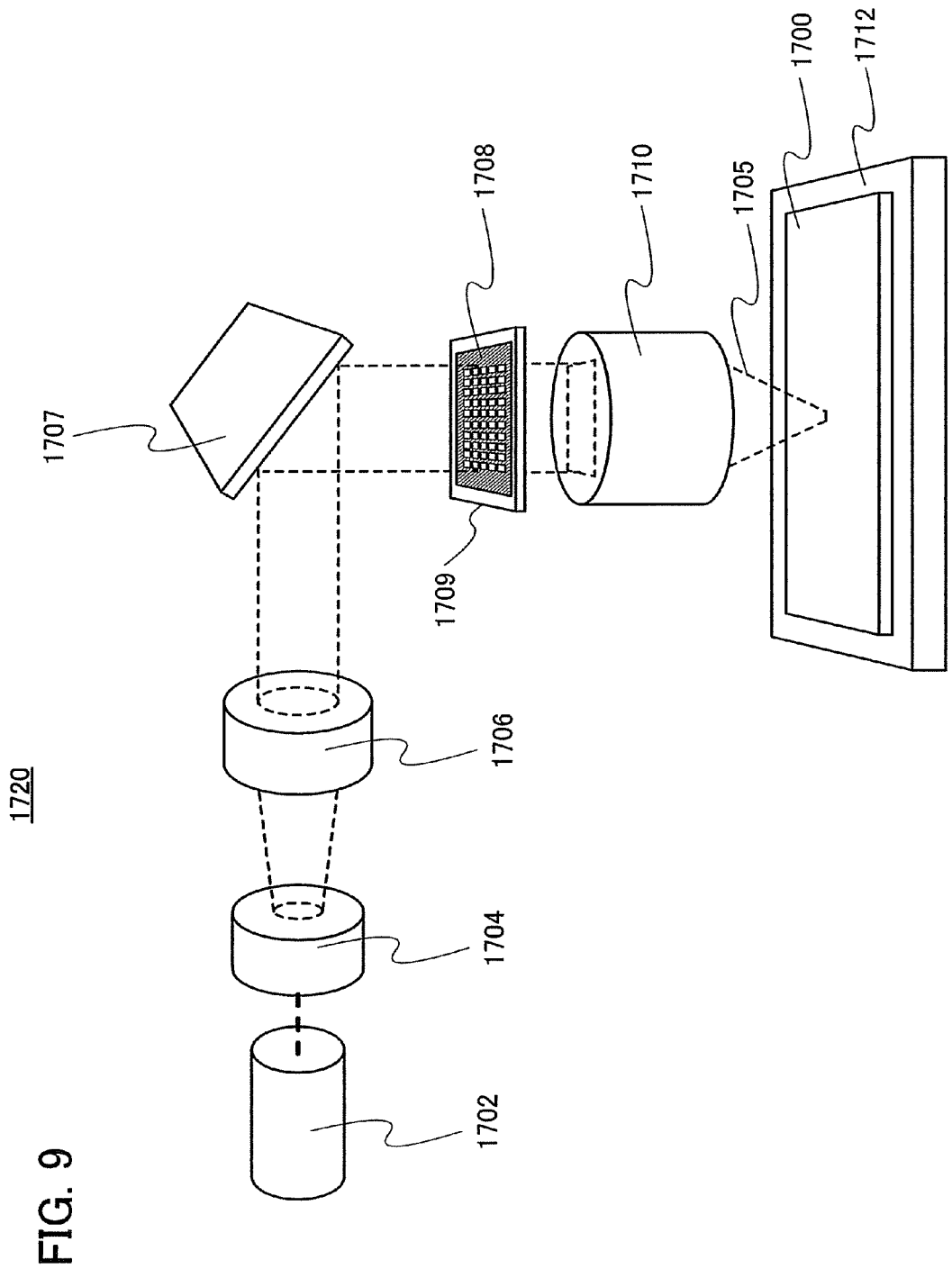

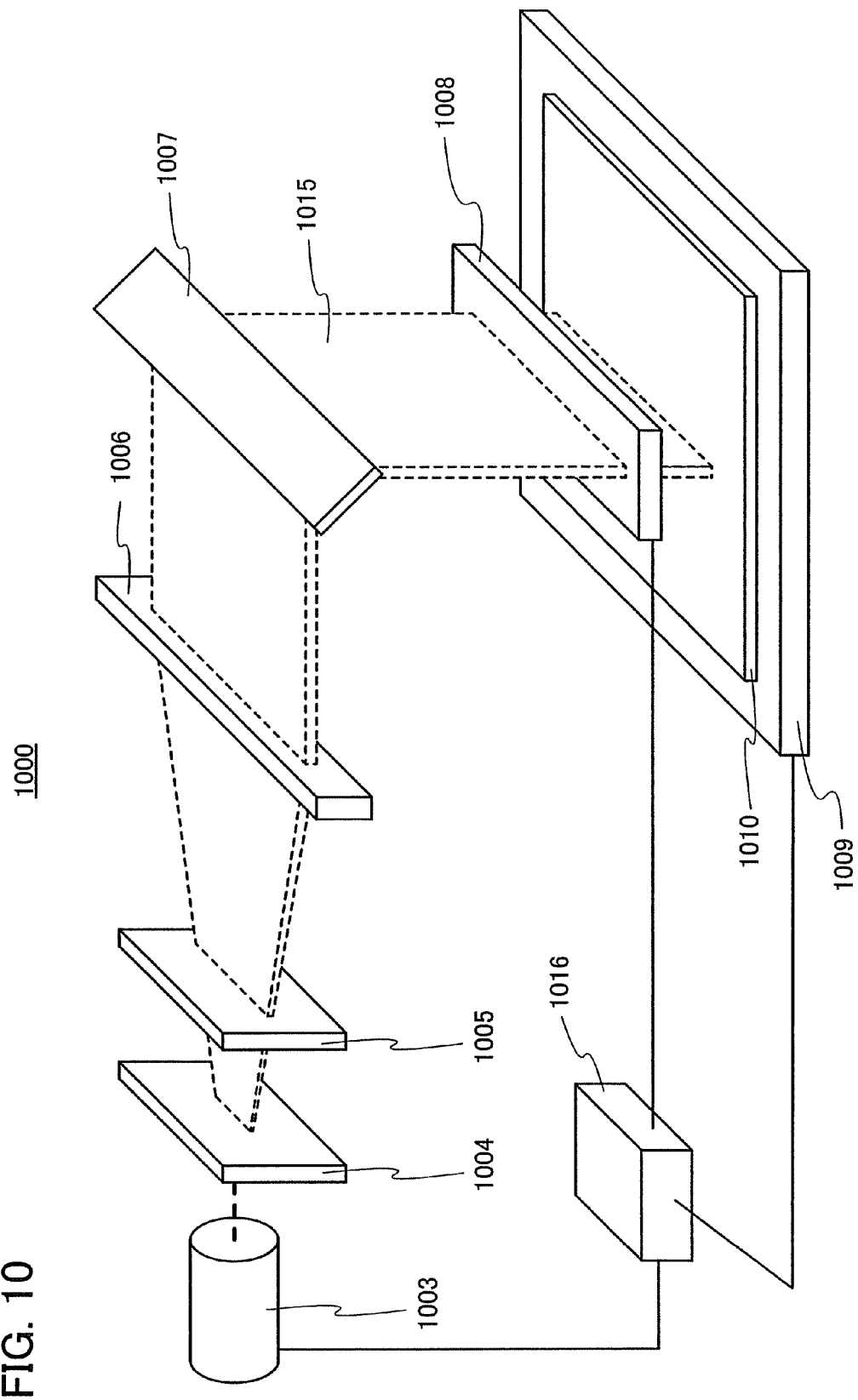

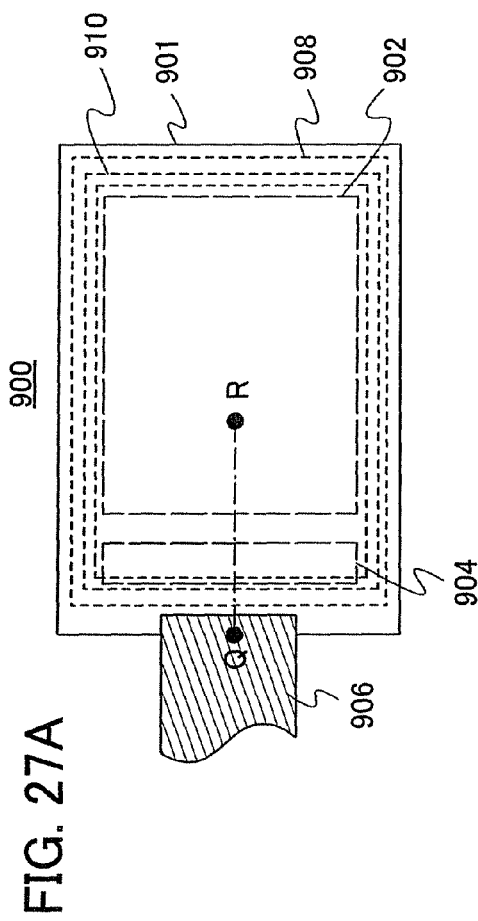
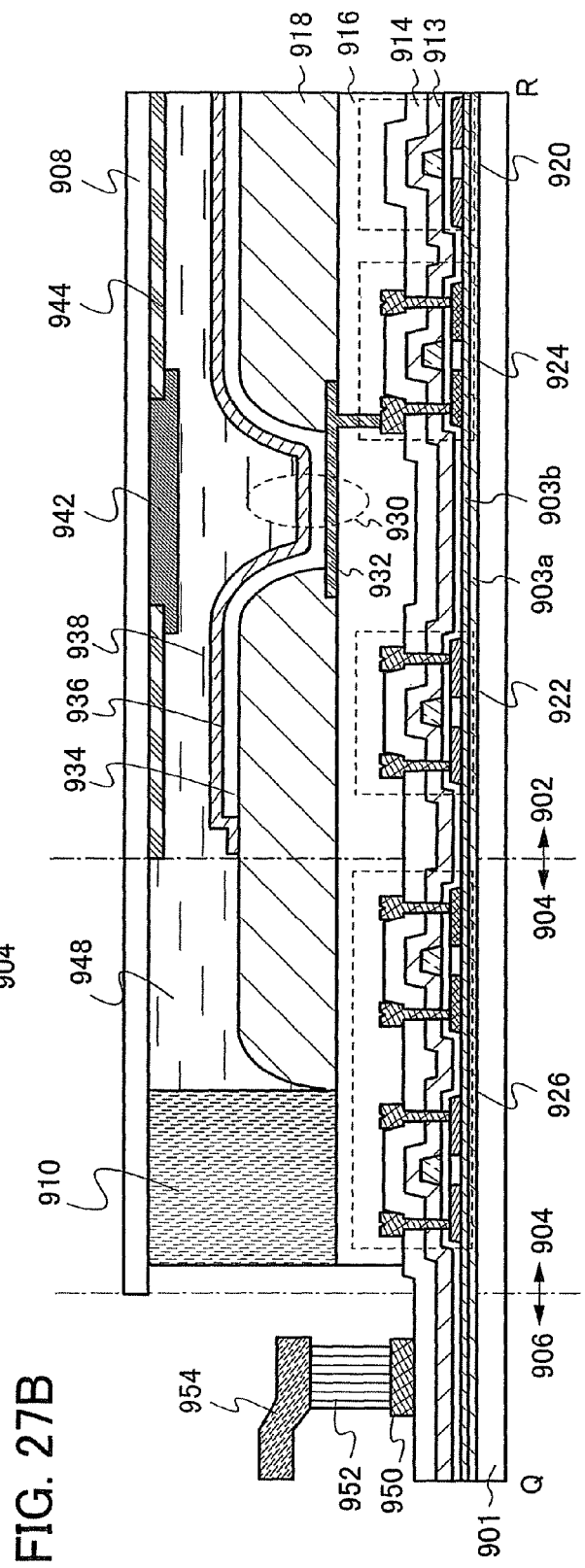
FIG. 27A
FIG. 27B

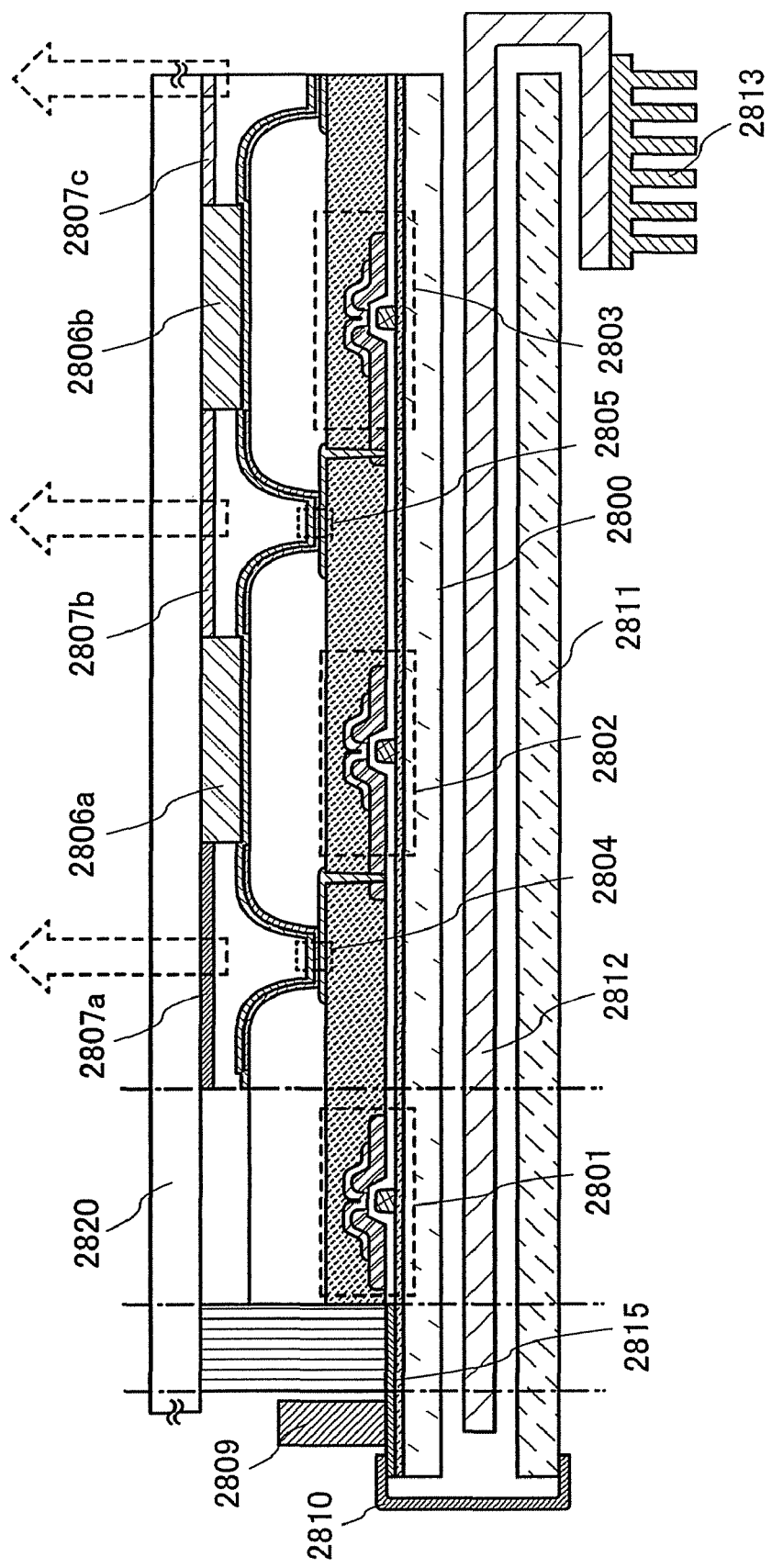

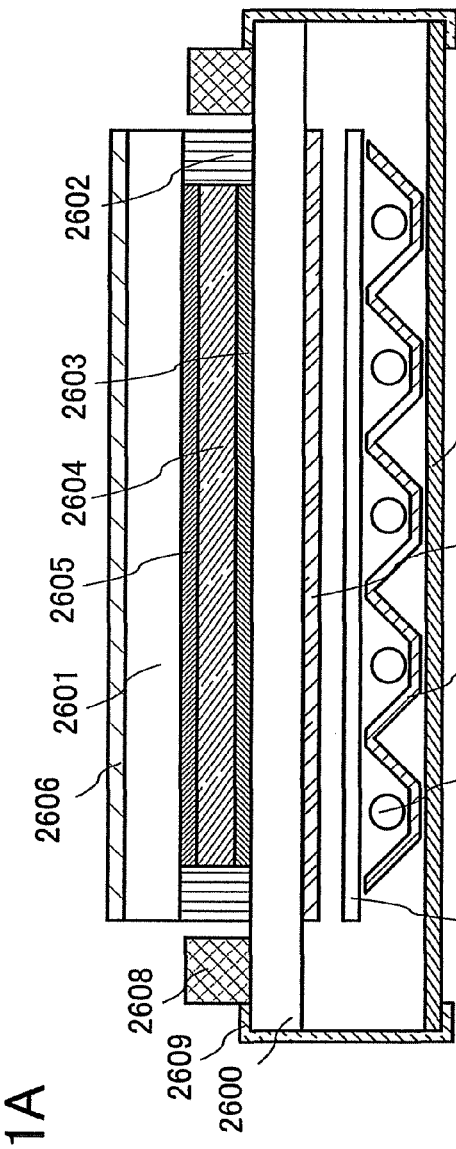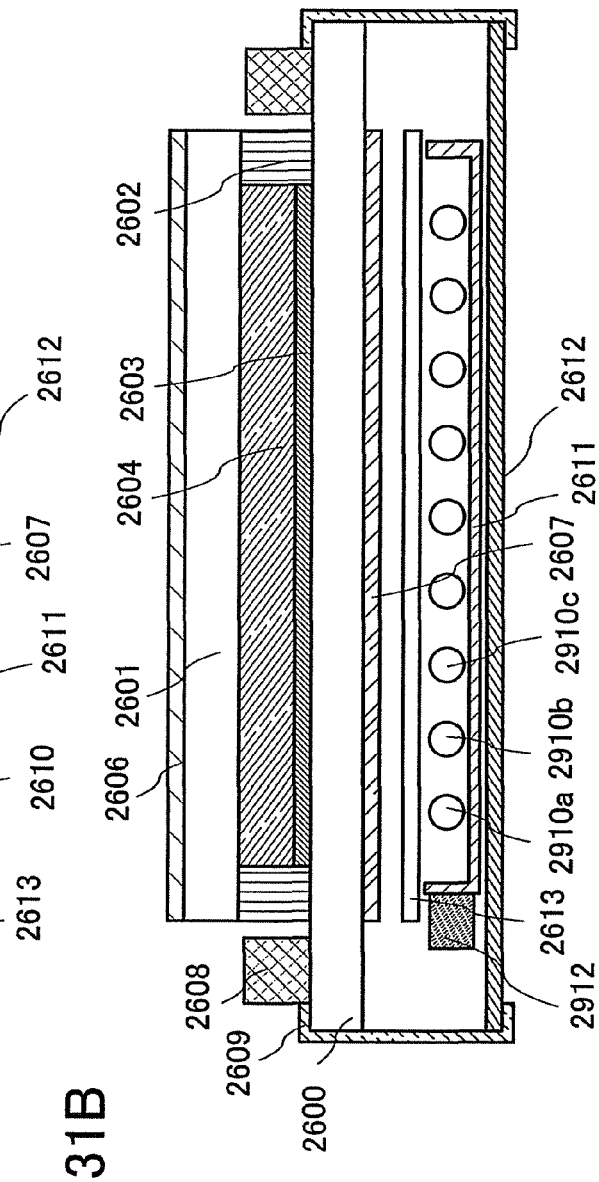
FIG. 31A
FIG. 31B

MANUFACTURING METHOD OF SEMICONDUCTOR DEVICE

BACKGROUND OF THE INVENTION

1. Field of the Invention

The present invention relates to a manufacturing method of a semiconductor device, and particularly relates to a laser processing method for a thin film such as a conductive layer or an insulating layer.

2. Description of the Related Art

Conventionally, a MOS transistor, a thin film transistor, and a semiconductor device including such a transistor is manufactured in such a manner that thin films such as an insulating layer and a conductive layer are formed over a substrate and processed into a desired pattern by a lithography technique. A lithography technique is a technique in which a pattern of a circuit or the like called a photomask, which is formed using a light-blocking material over a transparent flat plate, is transferred to an aimed object by utilizing light. The lithography technique is widely used in a process of manufacturing a semiconductor integrated circuit and the like.

However, the manufacturing process using the lithography technique requires multiple steps such as resist application using a photosensitive resin called a photoresist, pattern light exposure, development, and resist removal. Therefore, as the number of lithography processes is increased, cost is increased and throughput is decreased.

For example, Patent Document 1 (Japanese Published Patent Application No. S63-84789) proposes a technique for forming a linear pattern without using a photoresist. Specifically, a technique is proposed, in which a transparent conductive film (ITO) is linearly irradiated with an excimer laser beam to form a linear opening, so that a pattern is formed.

In Patent Document 2 (Japanese Published Patent Application No. 2000-133636), a method is described, in which two kinds of patterns are formed in a photolithography process by expanding in volume a resist mask that is once used as an etching mask to form an etching mask having a different shape.

SUMMARY OF THE INVENTION

It is an object of the present invention to provide a processing method for a thin film without using a photoresist, and a manufacturing method of a semiconductor device using the processing method. It is another object to provide a method for processing a thin film easily, a method by which a defect of a thin film after processing is prevented, and a manufacturing method of a semiconductor device using the processing method.

One feature of the present invention is to control the stress of a processing thin film. Another feature of the present invention is to process a thin film such as a semiconductor layer, a conductive layer, or an insulating layer by utilizing a laser beam, without using a photoresist. The thin film processing according to the present invention includes thin film processing that utilizes ablation by laser beam irradiation and thin film processing that utilizes a layer (separation layer) whose adhesiveness is decreased by laser beam irradiation.

At least a layer that absorbs a laser beam is formed over a substrate, and the layer that absorbs a laser beam or a layer in contact with the layer that absorbs a laser beam is processed into a desired shape. Laser beam irradiation is utilized for the thin film processing. As a thin film to be processed, a layer having a tensile stress before processing is preferably used. By using a layer having a tensile stress as the thin film before processing, a desired region can be removed easily. In addition, the thin film after processing preferably has a lower tensile stress. More preferably, the thin film after processing has a compressive stress. By making the tensile stress of the thin film after processing lower, a defect such as film peeling can be prevented. The thin film after processing can have a lower tensile stress by adding an impurity element imparting one conductivity type or an inert element to the thin film.

In thin film processing according to the present invention, a process in which a pattern is formed by utilizing laser ablation is referred to as a laser ablation patterning process (LAPP) in this specification. Note that in this specification, ablation (also referred to as laser ablation) is a phenomenon that part of an irradiation region of a thin film changes from a solid state to a gas state by laser beam irradiation to be sublimated and is removed, or a phenomenon that part of an irradiation region of a thin film changes from a solid state to a gas state through a liquid state by laser beam irradiation to be evaporated and is removed.

One feature of the present invention is to include the steps of forming a light absorption layer over a substrate; selectively irradiating the light absorption layer with a laser beam to remove a region of the light absorption layer, with is irradiated with the laser beam; and adding an impurity element imparting one conductivity type or an inert element to a remaining part of the light absorption layer, so that a tensile stress of the light absorption layer is made lower than that before irradiation with the laser beam.

Another structure of the present invention is to include the steps of sequentially forming a light absorption layer and a light-transmitting layer over a substrate; selectively irradiating the light-transmitting layer and the light absorption layer with a laser beam to remove at least a region of the light-transmitting layer, which is irradiated with the laser beam; and adding an impurity element imparting one conductivity type or an inert element to a remaining part of the light-transmitting layer, so that tensile stresses of the light-transmitting layer and the light absorption layer are made lower than those before irradiation with the laser beam.

Another structure of the present invention is to include the steps of sequentially forming a first material layer and a light absorption layer over a substrate; selectively irradiating the light absorption layer with a laser beam to remove a region of the light absorption layer, which is irradiated with the laser beam; selectively etching the first material layer using a remaining part of the light absorption layer as a mask; and adding an impurity element imparting one conductivity type or an inert element to the remaining part of the light absorption layer, so that a tensile stress of the light absorption layer is made lower than that before irradiation with the laser beam.

Another structure of the present invention is to include the steps of sequentially forming a first material layer, a light absorption layer, and a light-transmitting layer over a substrate; selectively irradiating the light-transmitting layer and the light absorption layer with a laser beam to remove a region of the light-transmitting layer and the light absorption layer, which is irradiated with the laser beam; selectively etching the first material layer using a remaining part of the light-transmitting layer and the light absorption layer as a mask; and adding an impurity element imparting one conductivity type or an inert element to the remaining part of the light-transmitting layer and the light absorption layer, so that tensile stresses of the light-transmitting layer and the light absorption layer are made lower than those before irradiation with the laser beam.

Another structure of the present invention is to include the steps of sequentially forming a light absorption layer and a light-transmitting layer over a substrate; selectively irradiating the light-transmitting layer and the light absorption layer with a laser beam to remove at least a region of the light-transmitting layer, which is irradiated with the laser beam, and to form an opening; adding an impurity element imparting one conductivity type or an inert element to a remaining part of the light-transmitting layer, so that a tensile stress of the light-transmitting layer is made lower than that before irradiation with the laser beam; and forming a conductive layer in the opening so as to electrically connect to the light absorption layer.

Another structure of the present invention is to include the steps of sequentially forming a first material layer, a light absorption layer, and a light-transmitting layer over a substrate; selectively irradiating the light-transmitting layer and the light absorption layer with a laser beam to remove a region of the light-transmitting layer and the light absorption layer, which is irradiated with the laser beam, and to form an opening; adding an impurity element imparting one conductivity type or an inert element to a remaining part of the light-transmitting layer, so that a tensile stress of the light-transmitting layer is made lower than that before irradiation with the laser beam; and forming a conductive layer in the opening to electrically connect to the first material layer.

A layer that absorbs the laser beam is preferably formed as the light absorption layer. Specifically, the light absorption layer can be formed using a conductive material or a semiconductor material.

Another structure of the present invention is to include the steps of sequentially forming a first material layer and a separation layer over a substrate; selectively irradiating the separation layer with a laser beam to decrease adhesiveness of the separation layer and to remove a region of the separation layer, which is irradiated with the laser beam; selectively etching the first material layer using a remaining part of the separation layer as a mask; and adding an impurity element imparting one conductivity type or an inert element to the remaining part of the separation layer, so that a tensile stress of the separation layer is made lower than that before irradiation with the laser beam.

Another structure of the present invention is to include the steps of sequentially forming a first material layer, a separation layer, and a light-transmitting layer over a substrate; selectively irradiating the light-transmitting layer and the separation layer with a laser beam to decrease adhesiveness of the separation layer and to, remove a region of the separation layer and the light-transmitting layer in contact with the separation layer, which is irradiated with the laser beam; selectively etching the first material layer using a remaining part of the light-transmitting layer and the separation layer as a mask; and adding an impurity element imparting one conductivity type or an inert element to the remaining part of the light-transmitting layer and the separation layer, so that a tensile stress of the separation layer is made lower than that before irradiation with the laser beam.

A layer that absorbs the laser beam is preferably formed as the separation layer. Specifically, a metal oxide layer is preferably formed as the separation layer.

A layer that transmits the laser beam is preferably formed as the light-transmitting layer. The first material layer is preferably formed using a conductive material or a semiconductor material.

Phosphorus (P) or arsenic (As), which is an impurity element imparting n-type conductivity; or boron (B), aluminum (Al), or gallium (Ga), which is an impurity element imparting p-type conductivity, can be added as the impurity element imparting one conductivity type. Further, nitrogen (N), helium (He), neon (Ne), argon (Ar), krypton (Kr), or xenon (Xe) can be added as the inert element.

By applying the present invention, processing of a thin film can be easily conducted without using a photoresist. In addition, a defect such as film peeling in the processed thin film after the thin film processing can be prevented. Therefore, a manufacturing process of a semiconductor device that is formed using a thin film and the like can be made easier by the present invention, and a semiconductor device with high reliability can be realized with high yield.

BRIEF DESCRIPTION OF THE DRAWINGS

In the accompanying drawings:

FIG. 9 shows a laser processing apparatus according to the present invention;

FIG. 10 shows a laser processing apparatus according to the present invention;

FIGS. 27A and 27B are a top view and a cross-sectional view showing an example of a display device according to the present invention;

FIG. 28 shows a structural example of a display module according to the present invention;

FIGS. 31A and 31B show examples of a display device according to the present invention;

DETAILED DESCRIPTION OF THE INVENTION

Figure 1A:
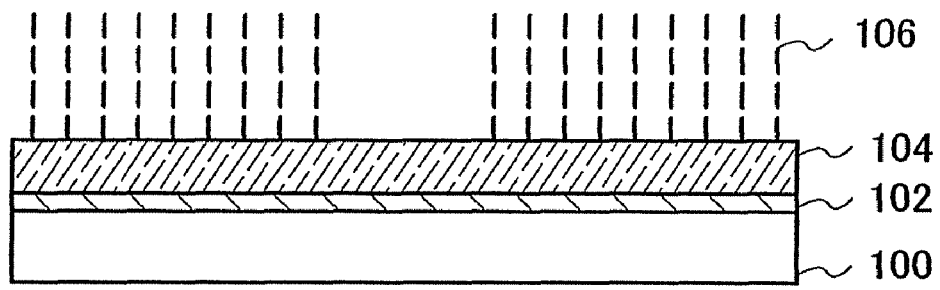
FIGS. 1A to 1C are conceptual diagrams explaining the present invention.

Embodiment modes of the present invention will be hereinafter described with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having a similar function throughout the drawings.

Embodiment Mode 1

Figure 1B:
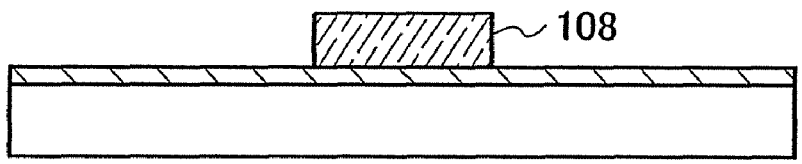

One feature of the present invention is to process a desired region without carrying out a lithography process that uses a photoresist. In Embodiment Mode 1, a thin film pattern with a desired shape is formed by irradiation with a laser beam. Hereinafter, an example of a method for forming a thin film pattern with a desired shape by processing a thin film will be specifically described with reference to FIGS. 1A to 1C. In addition, FIGS. 2A and 2B show examples of perspective views of FIGS. 1A to 1C.

Over a substrate 100, an insulating layer 102 and a light absorption layer 104 are sequentially stacked. The light absorption layer 104 is selectively irradiated with a laser beam 106 (FIG. 1A, FIG. 2A). In FIG. 2A, a region of the light absorption layer 104, which is irradiated with the laser beam 106, is referred to as an irradiated region 107, and a region of the light absorption layer 104, which is not irradiated with the laser beam 106, is referred to as a non-irradiated region 105. FIG. 2A shows only an example, and the shape or the like of the non-irradiated region 105 may be appropriately selected.

As the substrate 100, a glass substrate, a quartz substrate, a sapphire substrate, a ceramic substrate, a semiconductor substrate, or the like is used. The insulating layer 102 is formed using a single-layer structure or a stacked structure including an insulating material such as silicon oxide ($SiO_x$), silicon nitride ($SiN_x$), silicon oxynitride ($SiO_xN_y$) (x>y), or silicon nitride oxide ($SiN_xO_y$) (x>y). The insulating layer 102 functions as a base insulating layer. By providing the insulating layer 102 over the substrate 100, damage to the substrate 100 can be prevented in irradiation with the laser beam 106. Note that the insulating layer 102 need not necessarily be provided. Here, a glass substrate is used as the substrate 100, and a stacked structure of silicon nitride oxide and silicon oxynitride is formed as the insulating layer 102, over the substrate 100.

A layer that absorbs the laser beam 106 is formed as the light absorption layer 104. For example, the light absorption layer 104 can be formed using a metal element such as chromium (Cr), molybdenum (Mo), nickel (Ni), titanium (Ti), cobalt (Co), copper (Cu), aluminum (Al), or tungsten (W); or an alloy material or a compound material containing the metal element. As the compound material, a nitrogen compound, an oxygen compound, a carbon compound, a halogen compound, or the like can be used. Alternatively, a semiconductor material such as silicon (Si), germanium (Ge), silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further, zinc sulfide, silicon nitride, mercury sulfide, aluminum chloride, or the like can be used.

The light absorption layer 104 is formed using one or more of the above-described materials with a single-layer structure or a stacked structure by a sputtering method, a CVD method, an evaporation method, or the like. Here, as the light absorption layer 104, a tungsten layer is formed by a sputtering method.

As the light absorption layer 104, a layer having a tensile stress is preferably formed. If the layer having a tensile stress is formed as the light absorption layer 104, generation of burrs or the like on a side end surface of a thin film pattern can be reduced at the time of ablating part of the light absorption layer 104 by irradiation with the laser beam 106 to form a pattern of the thin film (light absorption layer) with a desired shape. Further, by forming the layer having a tensile stress as the light absorption layer 104, ablation of the light absorption layer 104 can easily occur. Accordingly, a minute thin film pattern can be formed easily with accuracy. Depending on the selected material, there is a case in which the layer having a tensile stress cannot be formed as the light absorption layer 104. In such a case, the light absorption layer 104 is preferably formed so as to have a stress close to the tensile stress, or so as to have a low compressive stress.

In the case where the light absorption layer 104 is formed by a sputtering method, if the electric power is constant in forming a film, the stress of the light absorption layer 104 can be controlled by the pressure in forming the film. When a layer having a tensile stress is desired to be formed as the light absorption layer 104, the pressure in forming the film is preferably set high. For example, when a tungsten layer is formed as the light absorption layer 104, a tungsten target is used, the electric power in film formation is set at 4 kW, and the pressure in film formation is set at approximately 2.0 Pa, thereby forming the tungsten layer having a tensile stress with a thickness of 200 nm.

The other preferable conditions for forming the layer having a tensile stress as the light absorption layer 104 are, in the case of forming a film by a sputtering method, such that electric power in forming a film is set high, and the substrate temperature in forming a film is made high. Even after the film formation of the light absorption layer 104, it is possible to bring the stress of the light absorption layer 104 closer to the tensile stress by heating.

As the laser beam 106, a laser beam having an energy or a wavelength that can be absorbed by the light absorption layer 104 is appropriately selected. For example, a laser beam in an ultraviolet region, a visible light region, or an infrared region is appropriately selected to conduct irradiation. The laser beam 106 can be obtained by using any of the following lasers specifically: an excimer laser such as a KrF, ArF, XeCl, or XeF laser; a gas laser such as a He, He—Cd, Ar, or He—Ne laser; a solid-state laser using, as a medium, single crystalline YAQ YVO$_4$, YLF, forsterite (Mg$_2$SiO$_4$), YAlO$_3$, or GdVO$_4$, or polycrystalline (ceramic) YAQ Y$_2$O$_3$, YVO$_4$, YAlO$_3$, or GdVO$_4$, which is doped with one or more of Nd, Yb, Cr, Ti, Ho, Er, Tm, and Ta as a dopant; a semiconductor laser such as a GaN, GaAs, GaAlAs, or InGaAsP laser; and the like. In the case of using a solid-state laser, it is preferable to use a wave that is appropriately selected from the fundamental wave to the fifth harmonic. For the laser beam 106, any of a continuous wave (CW) laser beam and a pulsed laser beam can be used. In the case of using the pulsed laser beam 106, a pulsed laser, which can emit a laser beam with a pulse width in a range of picoseconds ($10^{-12}$ seconds to $10^{-10}$ seconds) or in a range of femtoseconds ($10^{-15}$ seconds to $10^{-13}$ seconds), may be used. Such a laser beam can be obtained with an ultrashort pulsed laser such as a picosecond laser or a femtosecond laser.

The energy of the laser beam 106 is preferably in such a level that release of a gas in the light absorption layer 104 or evaporation of the light absorption layer 104 is caused. It is known that ablation occurs when an energy that is equal to or more than a certain threshold is provided. In this specification, the threshold of the energy for generating ablation is also referred to as an ablation threshold. In this embodiment mode, the laser beam 106 preferably has an energy that is equal to or more than the ablation threshold. Note that ablation does not occur in every layer, and ablation occurs in a layer that can absorb a laser beam or a layer in contact with the layer that can absorb a laser beam.

Examples of a laser irradiation apparatus, which can be used in the present invention, are hereinafter described with reference to FIG. 9 and FIG. 10.

FIG. 9 schematically illustrates a laser irradiation apparatus by which an irradiation object is irradiated with a laser beam, using a photomask.

In FIG. 9, a laser irradiation apparatus 1720 includes a laser oscillator 1702, a first optical system 1704 which shapes a laser beam, a second optical system 1706 which homogenizes the laser beam, a mask holder 1709, a third optical system 1710, and a stage 1712. A photomask 1708 is provided for the mask holder 1709. An irradiation object 1700 is put on the stage 1712.

A laser beam 1705 oscillated from the laser oscillator 1702 passes through the first optical system 1704 to be shaped. The shaped laser beam 1705 passes through the second optical system 1706 to be homogenized. Then, the shaped and homogenized laser beam 1705 passes through the photomask 1708, is reduced to a desired magnification in the third optical system 1710, and forms a pattern image on the irradiation object 1700 held on the stage 1712.

The laser oscillator 1702 may include the following laser: an excimer laser such as a KrF, ArF, XeCl, or XeF laser; a gas laser such as a He, He—Cd, Ar, or He—Ne laser; a solid-state laser using, as a medium, single crystalline YAG, YVO$_4$, YLF, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, which is doped with one or more of Nd, Yb, Cr, Ti, Ho, Er, Tm, and Ta as a dopant; a semiconductor laser such as a GaN, GaAs, GaAlAs, or InGaAsP laser; or the like. In the case of using a solid-state laser, a laser beam with the fundamental wave to the fifth harmonic can be emitted. When a solid-state laser is used, there are advantages in that maintenance-free conditions can be maintained for a long time, and output is comparatively stable. The laser beam 1705 obtained from the laser oscillator 1702 corresponds to the laser beam 106 shown in FIG. 1A.

The laser oscillator 1702 may include any of a continuous wave laser and a pulsed laser. As the pulsed laser, an ultrashort pulsed laser such as a picosecond laser or a femtosecond laser, which can emit a laser beam with a pulse width in a range of picoseconds ($10^{-12}$ seconds to $10^{-10}$ seconds) or in a range of femtoseconds ($10^{-15}$ seconds to $10^{-13}$ seconds) respectively, can be provided.

The first optical system 1704 is an optical system for shaping a laser beam emitted from the laser oscillator 1702 into a desired shape. Specifically, a cross-sectional shape of the laser beam is formed into a planar shape such as a circular shape, an elliptic shape, or a rectangular shape; a linear shape (in a strict sense, a narrow rectangular shape); or the like. For example, the beam diameter of the laser beam may be adjusted by using an expander or the like for the first optical system 1704. Further, a polarizer, which aligns a polarization direction of a laser beam; an attenuator, which adjusts energy of a laser beam; a spectrometer; or the like may be used.

The second optical system 1706 is an optical system for homogenizing the energy distribution of the laser beam shaped by the first optical system 1704. Specifically, the second optical system 1706 homogenizes the energy distribution of the laser beam, which passes through the photomask 1708. For example, using a homogenizer or the like, the energy distribution of the laser beam may be homogenized. Further, in order that the laser beam is efficiently introduced to the photomask 1708, a field lens or the like may be provided between a homogenizer and the photomask 1708 so that the laser beam may be condensed.

A mirror 1707 is provided to control the optical path of the laser beam whose energy distribution is homogenized by the second optical system 1706. Here, the laser beam emitted toward the mirror 1707 is bent in a vertical direction by the mirror 1707.

A binary mask can be used for the photomask 1708. The binary mask is formed in such a manner that a light-shielding layer of chromium or chromium oxide, which absorbs light, is selectively formed over a light-transmitting substrate of quartz or the like. Light can pass through a region where the light-shielding layer is not formed.

When the energy of the laser beam, with which the irradiation object 1700 is irradiated, is high, a reflection layer is preferably formed between the light-transmitting substrate and the light-shielding layer. By provision of the reflection layer, the absorption amount of the laser beam by the light-shielding layer can be reduced. Thus, heat conversion of energy by light absorption of a laser beam and deformation of the pattern of the light-shielding layer due to the heat can be prevented.

As the reflection layer, a dielectric mirror or a reflective layer can be used. The dielectric mirror is a mirror in which two transparent layers having different refractive indexes are stacked alternately. In this case, as the refractive indexes of the two transparent layers are higher or as the number of stacked layers is larger, the reflection efficiency becomes higher. Note that, for the dielectric mirror, a material to be stacked is appropriately selected in accordance with a wavelength of a laser beam to be emitted. For example, as a stacked structure of a dielectric mirror which reflects visible light, a stacked structure of titanium dioxide and silicon dioxide, a stacked structure of zinc sulfide and magnesium fluoride, a stacked structure of amorphous silicon and silicon nitride, or the like can be employed.

As the reflective layer, a layer formed of aluminum, gold, silver, nickel, or the like may be used. Further, the dielectric mirror and the reflective layer may be stacked.

As the photomask 1708, a phase shift mask may be used. By the phase shift mask, a minute shape, specifically, a layer with a narrow width or a layer with a narrow width and a short length can be formed.

The third optical system 1710 is an optical system for reducing the laser beam in size, which is patterned by passing through the photomask 1708. Since the laser beam passes through only the light-transmitting region of the photomask 1708, the laser beam, which has passed through the photomask 1708, corresponds to a pattern formed by the light-transmitting region. The third optical system 1710 is an optical system which reduces the laser beam in size while maintaining the pattern shape of the laser beam formed by the photomask 1708 and forms an image on the irradiation object 1700. For example, a reducing glass, which reduces a laser beam to ⅕, ⅒, etc., typically, a projection lens, may be used.

The irradiation object 1700 is a stack in which a desired thin film is formed over a substrate. The irradiation object 1700 is formed in such a way that at least a layer that absorbs a laser beam is formed over the substrate. In addition, a thin film of a conductive layer, a semiconductor layer, an insulating layer, or the like may be formed. Here, the structure in which the insulating layer 102 and the light absorption layer 104 are sequentially formed over the substrate 100 as shown in FIG. 1A corresponds to the irradiation object 1700.

The irradiation object 1700 is held by the stage 1712 and can move in XYZθ directions. Here, the irradiation object 1700 is held by the stage 1712 so that the light absorption layer 104 faces upward.

Instead of using the stage 1712 holding the irradiation object 1700, the irradiation object 1700 may be moved by a method in which a gas is blown to the irradiation object 1700 so as to float the irradiation object 1700. As the size of a large-area substrate, sizes of 590 mm×670 mm, 600 mm×720 mm, 650 mm×830 mm are adopted in production lines, and further 680 mm×880 mm, 730 mm×920 mm, and a larger size substrate will be adopted in production lines. When a glass substrate with a side exceeding one meter is used, a conveying method which can relieve a warp caused by the substrate's own weight, for example, a method in which a gas is blown so that the substrate is floated, is preferably used to move the substrate.

Further, instead of the stage which holds a substrate lying on its side, a holder which holds a substrate which is standing upright may be used. When irradiation with a laser beam is performed on a substrate that is standing upright, scattered matters can be removed from the substrate.

The laser irradiation apparatus 1720 may be provided with a light receiving element for monitoring and controlling whether the photomask 1708 is uniformly irradiated with a laser beam. Further, a light receiving element may be provided as an auto focus mechanism for focusing the laser beam on the substrate. As a typical example of the light receiving element, a CCD camera can be given.

Further, when a laser beam is processed into a linear laser beam or a planar laser beam having a large area such as a rectangular laser beam or a circular laser beam using an optical system, a plurality of regions can be irradiated with a laser beam in a short time. Accordingly, many patterns can be formed over a large substrate in a short time, and thereby mass productivity can be improved.

A laser irradiation apparatus illustrated in FIG. 10 can control the area which is irradiated with a laser beam and the position which is irradiated with the laser beam, using data designed by a CAD device. When such a laser irradiation apparatus is used, irradiation with a laser beam can be selectively performed without using a photomask.

FIG. 10 is a perspective view illustrating an example of a laser irradiation apparatus. A laser beam 1015 is output from a laser oscillator 1003 (a YAG laser device, an excimer laser device, or the like), and passes through a first optical system 1004 for making a cross-sectional shape of the laser beam 1015 rectangular, a second optical system 1005 for shaping the cross-sectional shape of the laser beam 1015, and a third optical system 1006 for homogenizing the energy distribution of the laser beam 1015. Then, the optical path of the laser beam is bent in a vertical direction by a reflecting mirror 1007. Then, the laser beam 1015 passes through an electro-optic element 1008 which selectively adjusts the area and position of the laser beam 1015, with which an irradiation object 1010 is irradiated, so that the irradiation object 1010 is irradiated with the laser beam 1015. Here, the laser beam 1015 corresponds to the laser beam 106 shown in FIG. 1A. The irradiation object 1010 is a stack in which a desired thin film is formed over a substrate, and has a structure in which at least a layer that absorbs a laser beam is formed over the substrate. Here, the irradiation object 1010 corresponds to the structure in which the insulating layer 102 and the light absorption layer 104 are sequentially stacked over the substrate 100 as shown in FIG. 1A.

As the laser oscillator 1003, the laser oscillator 1702 shown in FIG. 9 can be used as appropriate. As a first optical system 1004, a slit or the like can be used. The first optical system 1704, the second optical system 1706, and the stage 1712 shown in FIG. 9 can be used for the second optical system 1005, the third optical system 1006 and the stage 1009, respectively as appropriate.

A representative example of a control device 1016 is a computer, which includes a memory portion (a RAM, a ROM, or the like) which stores design data of a semiconductor device, and a microprocessor which includes a CPU and the like. When an electric signal based on CAD data for designing the semiconductor device is input from the control device 1016 to the electro-optic element 1008, the position and area of a laser beam with which the substrate is irradiated is controlled. Further, in the case where the stage 1009 on which the irradiation object 1010 is fixed, is moved, by synchronizing the emission timing of the laser oscillator 1003, the electric signal that is input to the electro-optic element 1008, and the speed of movement of the stage 1009, the irradiation position and the area of the laser beam 1015 can be controlled.

When the electric signal based on CAD data for designing the semiconductor device is input to the electro-optic element 1008, the electro-optic element 1008 functions as an optical shutter or an optical reflector and as a variable mask. By using the control device 1016 to change the electric signal that is input to the electro-optic element 1008 which functions as an optical shutter, the area and position of the laser beam 1015 can be changed. That is, the area and position for processing the thin film can be selectively changed. Therefore, the cross-sectional shape of the laser beam 1015 can be linear, rectangular, or another desired shape, and irradiation with a laser beam with a complex shape can also be performed.

As the electro-optic element 1008, an element that can selectively adjust an area through which light can pass may be used. For example, an element including a liquid crystal material or an electrochromic material may be used. Further, an element that can selectively adjust optical reflection, for example, a digital micromirror device (also referred to as a DMD), may be used. A DMD is a kind of spatial light modulator. It is a device in which a plurality of small mirrors, referred to as micromirrors, which rotate about a fixed axis in accordance with an electrostatic field effect, are disposed in matrix form over a semiconductor substrate formed of Si or the like. Alternatively, a PLZT element, which is an optical element that modulates transmission light by using an electro-optic effect, can be used as another electro-optic element. Note that the PLZT element is a device that is an oxide ceramic containing lead, lanthanum, zirconium, and titanium, and the name PLZT is an acronym consisting of the initial letters of the chemical symbols of those elements. The PLZT element is a transparent ceramic which can transmit light. When a voltage is applied to the PLZT element, the polarization direction of the light can be changed, and by combining a PLZT element with a light polarizer, an optical shutter is formed. Note that the electro-optic element 1008 is a device that can withstand having a laser beam being passed through it.

Regarding the electro-optic element 1008, the region through which a laser beam can pass can have the same size as the irradiation object 1010. In the case where a region of the electro-optic element 1008, through which a laser beam 1015 can pass, can have the same size as the irradiation object 1010, the irradiation object 1010 and the electro-optic element 1008 are aligned with each other, and scanning with the laser beam 1015 is conducted with both of their positions fixed. Note that in such a case, in one-time processing of a thin film, an electric signal is input to the electro-optic element 1008 once.

In order to achieve a reduction in size of the laser irradiation apparatus 1000, the electro-optic element 1008 may have a long and narrow rectangular shape such that at least a rectangular beam can pass through the electro-optic element 1008 or be reflected by it. For example, in a case where a long and narrow DMD is used, the number of micromirrors which control an angle of reflection can be reduced. Therefore, modulating speed can be increased. Further, in the case where the long and narrow electro-optic element 1008 which employs liquid crystals is used, the number of scanning lines and signal lines is reduced and driving speed can be increased. Therefore, a similar effect can be obtained. Further, when the electro-optic element 1008 with a long and narrow rectangular shape is used, in one-time processing of a thin film, an electric signal which is input to the electro-optic element 1008 is changed a plurality of times. When the electric signal which is input to the electro-optic element 1008 is sequentially changed so that it is synchronized with scanning of the rectangular beam, a thin film is processed in succession.

Further, the shape of a spot of the laser beam 1015, with which the irradiation object 1010 is irradiated, is preferably rectangular or linear. Specifically, a rectangular shape with a short side of 1 to 5 mm and a long side of 10 to 50 mm is preferable. In the case where a laser beam spot which has little aberration is desired, the shape of the spot may be a square which is 5 mm×5 mm to 50 mm×50 mm. Further, in the case where a substrate with a large area is used for the irradiation object 1010, in order to reduce processing time, a long side of the laser beam spot is preferably 20 to 100 cm. Furthermore, the electro-optic element 1008 may be controlled such that the area per shot is the aforementioned size, and inside that area, irradiation is performed with a laser beam having a spot with a complex shape. For example, irradiation can be performed with a laser beam having a spot which has a shape similar to that of a wiring.

Further, laser beams with rectangular shapes and linear shapes may be overlapped and a laser beam with a complex spot shape may be used.

Further, a plurality of laser oscillators and optical systems may be provided in the laser irradiation apparatus 1000 shown in FIG. 10 so that a substrate with a large area is processed in a short time. Specifically, a plurality of electro-optic elements may be provided over the stage, and laser beams may be emitted from laser oscillators which correspond to each of the electro-optic elements, and the processing area of a single substrate may be divided among the laser beams. Similarly, in the laser irradiation apparatus 1720 shown in FIG. 9, a plurality of laser oscillators and optical systems may be provided to process a substrate with a laser area in a short time.

Further, in the laser irradiation apparatus 1000 shown in FIG. 10, a plurality of optical systems may be provided in the optical path between the laser oscillator and the irradiation object, and more minute processing may be performed. Specifically, when a projection is reduced using a stepper system which includes an electro-optic element which is larger than the irradiation object and an optical system for reduction, the area and position of the laser beam can be processed minutely. Further, same-size projection using a mirror projection system may also be performed.

Further, it is preferable to provide position alignment means which is electrically connected to the control device 1016. Irradiation position alignment can be performed with high precision by providing an imaging device such as a CCD camera and conducting laser irradiation based on data obtained from the imaging device. In the laser irradiation apparatus 1000 shown in FIG. 10, a desired position can be irradiated with a laser beam to form a position marker.

Further, in the case where dust is caused by the laser beam irradiation, the laser irradiation apparatus 1720 shown in FIG. 9 and the laser irradiation apparatus 1000 shown in FIG. 10 are each preferably provided with blowing means for ensuring that dust does not adhere to an irradiation object, or dust vacuuming means. Dust can be prevented from adhering to the surface of a processing object, by blowing or vacuuming dust while performing laser beam irradiation.

Note that the laser irradiation apparatuses shown in FIG. 10 and FIG. 9 are examples of a laser irradiation apparatus, and there is no particular limitation on the positional relationship of the optical systems and the electro-optic element disposed in the optical path of the laser beam. For example, when the laser oscillator is disposed over the irradiation object so that the laser beam emitted from the laser oscillator is emitted in a direction perpendicular to the substrate surface, it is not necessary to use a reflecting mirror. Further, each optical system may employ a condenser lens, a beam expander, a homogenizer, a polarizer, or the like, and these may be combined as well. Further, as each optical system, a slit may be used in combination.

In the laser irradiation apparatus shown in FIG. 10, by appropriately scanning the irradiation object with the laser beam or moving the irradiation object, the irradiation region of the laser beam on the irradiation object can be moved two-dimensionally, and thereby a wide area of the irradiation object can be irradiated. Here, scanning is performed by moving means (not illustrated) which moves the stage 1009, which holds the irradiation object 1010, in XY directions.

The control device 1016 is preferably interlocked such that it can also control the moving means which moves the substrate stage 1009 in the XY directions. Further, the control device 1016 is preferably interlocked such that it can also control the laser oscillator 1003. Furthermore, the control device 1016 is preferably interlocked with a position alignment system for recognizing the position marker.

The laser beam 1705 shown in FIG. 9 and the laser beam 1015 shown in FIG. 10 each have an energy in such a level that the light absorption layer or the thin film in contact with the light absorption layer, which is formed in the irradiation object 1700 and the irradiation object 1010 respectively, is ablated. Specifically, in the case where a light absorption layer is formed in the irradiation object 1700 or the irradiation object 1010, the laser beam 1705 or the laser beam 1015 preferably has an energy that is equal to or more than an ablation threshold of the light absorption layer.

The irradiation of the laser beam 1705 and the laser beam 1015 can be conducted at atmospheric pressure or reduced pressure. If the irradiation is conducted at reduced pressure, dusts or the like, which are generated by irradiation of the irradiation object with a laser beam, can be collected easily.

Irradiation with the laser beam 1705 may be conducted while heating the irradiation object 1700. Similarly, irradiation with the laser beam 1015 may be conducted while heating the irradiation object 1010.

The laser beam 106 with which irradiation is conducted by the laser irradiation apparatus as shown in FIG. 9 or FIG. 10 is absorbed by the light absorption layer 104. The light absorption layer 104 is ablated by the laser beam 106. Irradiation with the laser beam 106 is selectively conducted, and a region of the light absorption layer 104, which is irradiated with the laser beam 106, is ablated. Accordingly, a light absorption layer 108 having a desired pattern shape remains (FIG. 1B, FIG. 2B).

Figure 1C:
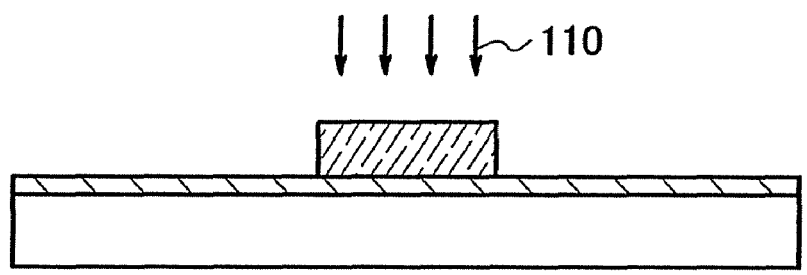
Figure 2A:
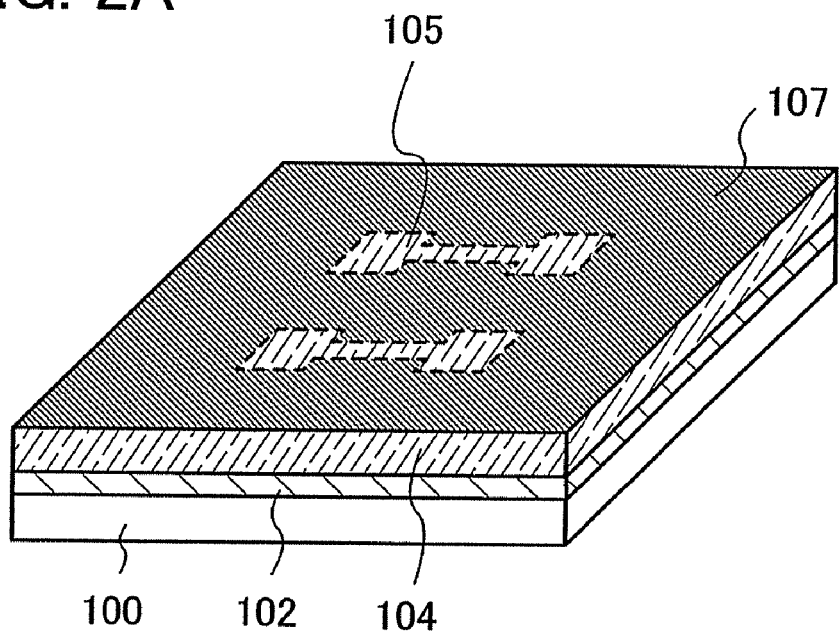
FIGS. 2A and 2B are conceptual diagrams explaining the present invention.
Figure 2B:
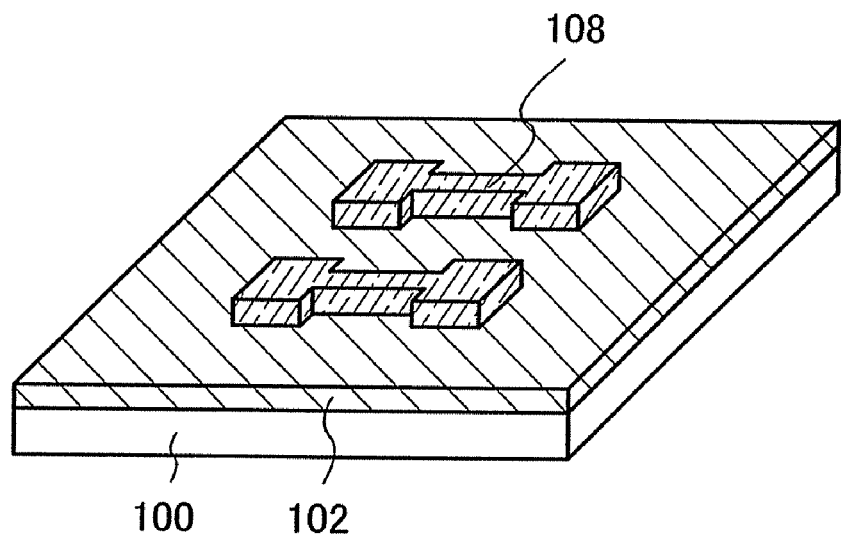

Next, an impurity element imparting one conductivity type or an inert element 110 is added to the light absorption layer 108 (FIG. 1C). As the impurity element imparting one conductivity type, an element imparting n-type conductivity such as phosphorus (P) or arsenic (As), an element imparting p-type conductivity such as boron (B), aluminum (Al), or gallium (Ga), or the like can be used. As the inert element, nitrogen (N) or a rare gas element such as helium (He), neon (Ne), argon (Ar), krypton (Kr), or xenon (Xe) can be used. One or more of these elements is/are added to the light absorption layer 108. The impurity element or the inert element 110 may be added by a doping method such as an ion implantation method or a thermal diffusion method. The concentration of the impurity element or the inert element 110 is not particularly limited; however, the impurity element or the inert element 110 is preferably added at a concentration in a range from $1 \times 10^{15}$ atoms/cm$^3$ to $1 \times 10^{21}$ atoms/cm$^3$. Here, boron (B) is used as the impurity element imparting one conductivity type or the inert element 110, and added by an ion implantation method to the light absorption layer 108 that is formed using tungsten, at a dose amount of about $1.5 \times 10^{15}$ atoms/cm$^2$.

By adding the impurity element or the inert element 110 to the light absorption layer 108, the tensile stress of the light absorption layer 108 can be reduced. In more detail, the tensile stress of the light absorption layer 108 after ablation by irradiation with the laser beam 106 can be lower than that of the light absorption layer 104 in the irradiation with the laser beam 106. Preferably, the light absorption layer 108 is made to have a compressive stress. By making the light absorption layer 108 have a lower tensile stress or have a compressive stress, generation of a defect such as film peeling of the light absorption layer 108 in a later process can be prevented. When the light absorption layer 108 is subjected to heat treatment in a later process, generation of film peeling or the like of the light absorption layer 108 owing to the tensile stress can be prevented.

In the above-described manner, the light absorption layer 108 having a desired pattern shape and having a lower tensile stress than that before ablation can be formed. The light absorption layer 108 obtained can be used as a conductive layer or a semiconductor layer for forming a semiconductor device, or an antenna or the like used for an RF tag or the like. Since a defect such as film peeling is unlikely to occur in the light absorption layer 108 with a low tensile stress, by applying the present invention, a semiconductor device can be manufactured with high yield. In addition, a semiconductor device with high reliability can be manufactured.

The above description is made of an example in which only the light absorption layer, which is a layer that can absorb a laser beam, is processed by laser beam irradiation; however, the present invention is not particularly limited thereto.

Figure 11A:
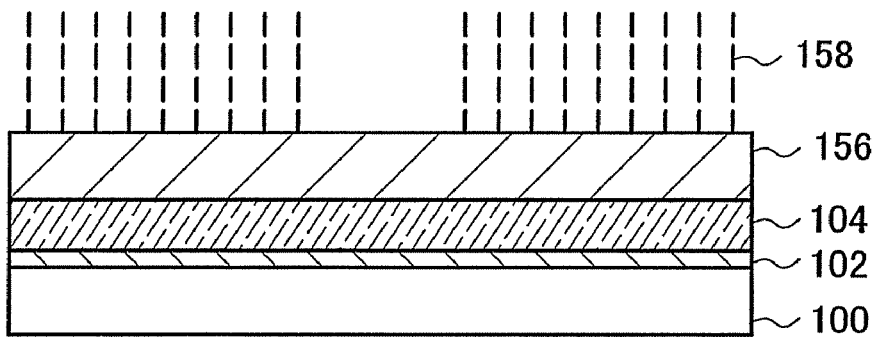
FIGS. 11A to 11C are conceptual diagrams explaining the present invention.

For example, in the case where a light-transmitting layer is formed in contact with the light absorption layer, the present invention can be applied. As shown in FIG. 11A, the light absorption layer 104 and a light-transmitting layer 156 are sequentially stacked over the substrate 100 with the insulating layer 102 interposed therebetween. Then, the light absorption layer 104 is selectively irradiated with a laser beam 158 from the light-transmitting layer 156 side.

Note that the structure in which the light absorption layer 104 is provided over the substrate 100 with the insulating layer 102 interposed therebetween is similar to that of FIGS. 1A to 1C. A laser beam similar to the above-described laser beam 106 can be applied to the laser beam 158. Irradiation with the laser beam 158 can be selectively conducted by the laser irradiation apparatus as shown in FIG. 9 or FIG. 10.

The light-transmitting layer 156 is formed using a material that can transmit the laser beam 158. For example, an inorganic insulating material such as silicon oxide, silicon nitride, silicon oxynitride, or silicon nitride oxide; or an organic insulating material such as polyimide, acrylic, polyamide, polyimide amide, benzocyclobutene, or an epoxy resin can be used. The light-transmitting layer 156 is formed with a single-layer structure or a stacked structure using one or more of these materials by a sputtering method, a CVD method, a coating method, or the like. The light-transmitting layer 156 may absorb part of the laser beam 158. Here, a silicon oxynitride layer is formed as the light-transmitting layer 156.

Further, a layer having a tensile stress is preferably formed as the light-transmitting layer 156. When the light-transmitting layer 156 has a tensile stress, generation of burrs or the like at an end portion of a pattern of the thin film (light-transmitting layer) can be reduced at the time of ablating part of the light-transmitting layer by irradiation with the laser beam 158 to form the pattern of the thin film with a desired shape, and processing can be conducted easily with accuracy. Depending on the selected material, there is a case in which the light-transmitting layer 156 having a tensile stress is hard to be formed. In such a case, the light-transmitting layer 156 is preferably formed so as to have a stress close to the tensile stress, or so as to have a low compressive stress.

Figure 11B:
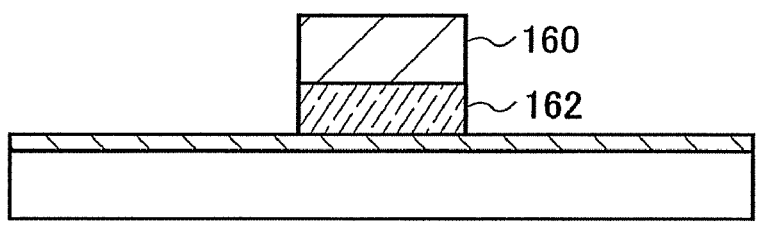

The laser beam 158 passes through the light-transmitting layer 156 and is absorbed by the light absorption layer 104. In a region, which is irradiated with the laser beam 158, the light absorption layer 104 is heated by irradiation with the laser beam 158. Accordingly, only the light-transmitting layer 156, or both the light-transmitting layer 156 and the light absorption layer 104 is/are ablated. Here, by ablation of the light-transmitting layer 156 and the light absorption layer 104, a light-transmitting layer 160 and a light absorption layer 162 each having a desired pattern shape remain (FIG. 11B).

In the present invention, a layer that absorbs a laser beam (in this embodiment mode, light absorption layer 104) is formed in contact with a layer that does not absorb (or easily absorb) a laser beam and is not ablated when it is by itself (in this embodiment mode, light-transmitting layer 156), which makes it possible to laser-process the layer that is not ablated when it is by itself. At this time, the layer that absorbs a laser beam (light absorption layer) functions as an assisting layer for processing the layer that does not absorb a laser beam (light-transmitting layer). Of course, the layer that absorbs a laser beam (light absorption layer 104) may be ablated together with the layer that does not absorb a laser beam (light-transmitting layer 156). FIG. 11B shows an example in which the light-transmitting layer 156 and the light absorption layer 104 are ablated. By forming the stacked structure of the layer that absorbs a laser beam, and the layer that does not absorb a laser beam or the layer that does not easily absorb a laser beam, the layer that is not laser-ablated when it is by itself can be processed by utilizing laser ablation.

Figure 11C:
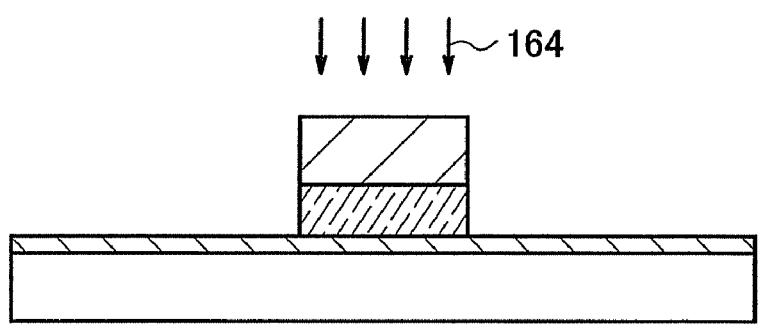

Next, an impurity element imparting one conductivity type or an inert element 164 is added to the light-transmitting layer 160 and the light absorption layer 162 (FIG. 11C). As the impurity element or the inert element 164, an element similar to the above-described impurity element or the inert element 110 may be used to be added. Further, the concentration thereof is not particularly limited; however, the impurity element or the inert element 164 can be added at a concentration, for example, in a range from $1\times10^{15}$ atoms/cm$^3$ to $1\times10^{21}$ atoms/cm$^3$. The depth of ion implantation and the depth of diffusion of the impurity element or the inert element 164 are appropriately controlled by a doping method used for addition, so that the impurity element or the inert element 164 can be added to the light absorption layer 162.

By adding the impurity element or the inert element 164 to the light-transmitting layer 160 and the light absorption layer 162, the tensile stresses of the light-transmitting layer 160 and the light absorption layer 162 can be reduced. In more detail, the tensile stresses of the light-transmitting layer 160 and the light absorption layer 162 after ablation by irradiation with the laser beam 158 can be lower than those of the light-transmitting layer 156 and the light absorption layer 104 in the irradiation with the laser beam 158. Preferably, the light-transmitting layer 160 and the light absorption layer 162 are each made to have a compressive stress. By making each of the light-transmitting layer 160 and the light absorption layer 162 have a lower tensile stress or have a compressive stress, generation of a defect such as film peeling of the light-transmitting layer 160 and the light absorption layer 162 can be prevented. When the light-transmitting layer 160 and the light absorption layer 162 are subjected to heat treatment in a later process, generation of film peeling or the like of the light-transmitting layer 160 and the light absorption layer 162 owing to the tensile stress can be prevented.

In this embodiment mode, the structure in which the light absorption layer is provided over the substrate with the base insulating layer interposed therebetween is described; however, the present invention is not particularly limited thereto. For example, the base insulating layer need not necessarily be provided, and a single layer of an insulating layer, a conductive layer, a semiconductor layer, or the like or plural layers with a combination of the layers may be provided between the substrate and the light absorption layer.

In the case where the insulating layer 102 and the substrate 100 below the light absorption layer 104 each have a light-transmitting property, the light absorption layer 104 can be irradiated with a laser beam from the substrate 100 side so as to be ablated.

By applying the present invention, a layer having a desired pattern shape can be formed without using a lithography process that uses a photoresist. By controlling the stress of a process layer before and after ablation by laser beam irradiation, thin film processing can be conducted with accuracy and generation of a defect in a thin film pattern after processing can be prevented. Therefore, a semiconductor device with high reliability can be realized with high yield.

Embodiment Mode 2

Embodiment Mode 2 will describe examples of a method for processing a thin film, which are different from those of the above embodiment mode, with reference to FIGS. 5A to 6D. Here, an example of processing a conductive layer functioning as an electrode or a wiring will be described.

Figure 5A:
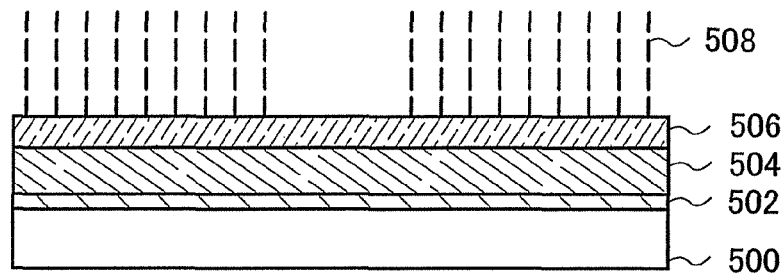
FIGS. 5A to 5D are conceptual diagrams explaining the present invention.

An insulating layer 502, a first material layer 504, and a light absorption layer 506 are sequentially stacked over a substrate 500. The light absorption layer 506 is selectively irradiated with a laser beam 508 (FIG. 5A). Since a substrate and an insulating layer similar to the substrate 100 and the insulating layer 102 described in Embodiment Mode 1 can be used for the substrate 500 and the insulating layer 502, the explanations thereof are omitted.

The first material layer 504 is formed using a material in accordance with the purpose. For example, when a conductive layer is desired to be formed as the first material layer 504, a conductive material such as a metal element of tantalum (Ta), tungsten (W), titanium (Ti), molybdenum (Mo), aluminum (Al), copper (Cu), silver (Ag), gold (Au), nickel (Ni), platinum (Pt), palladium (Pd), iridium (Ir), rhodium (Rh), or the like; an alloy material or a compound material containing the metal element; or the like is used. As the compound material, a nitrogen compound, an oxygen compound, a carbon compound, a halogen compound, or the like can be given. Alternatively, polycrystalline silicon added with an impurity element imparting one conductivity type such as phosphorus (P) may be formed. When a semiconductor layer for forming a channel or the like is desired to be formed as the first material layer 504, a semiconductor material is used. For example, a semiconductor material such as silicon, germanium, silicon germanium, or zinc oxide can be used. The first material layer 404 can be formed with a single-layer structure or a stacked structure using one or more of the conductive materials and the semiconductor materials by a sputtering method, a CVD method, an evaporation method, or the like.

A layer that absorbs the laser beam 508 is formed as the light absorption layer 506. For example, the light absorption layer 506 can be formed using a metal element such as chromium (Cr), molybdenum (Mo), nickel (Ni), titanium (Ti), cobalt (Co), copper (Cu), aluminum (Al), or tungsten; or an alloy material or a compound material containing the element. The light absorption layer 506 is formed using one or more of the above-described materials with a single-layer structure or a stacked structure by a sputtering method, a CVD method, an evaporation method, or the like.

As the light absorption layer 506, a layer having a tensile stress is preferably formed. If the layer having a tensile stress is formed as the light absorption layer 506, generation of burrs or the like at an end portion of a pattern of the thin film (light absorption layer) can be reduced in forming the pattern of the thin film with a desired shape. Further, ablation of the light absorption layer 506 can easily occur. Accordingly, a minute thin film pattern can be formed easily with accuracy. Depending on the material, there is a case in which the light absorption layer 506 does not have a tensile stress. In such a case, the light absorption layer 506 is preferably formed so as to have a stress close to the tensile stress, or so as to have a low compressive stress.

As the laser beam 508, a laser beam having an energy or a wavelength that can be absorbed by the light absorption layer 506 is appropriately selected. Note that a laser beam similar to the laser beam 106 described in Embodiment Mode 1 can be used as the laser beam 508. In addition, selective irradiation with the laser beam 508 can be conducted by using the laser irradiation apparatus as shown in FIG. 9 or FIG. 10, which is described in Embodiment Mode 1.

Figure 5B:
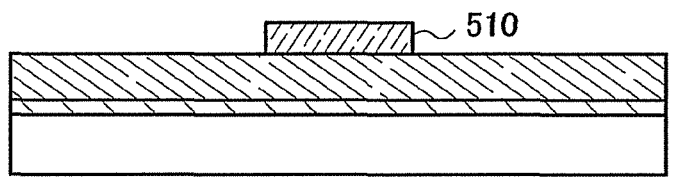

The laser beam 508 is absorbed by the light absorption layer 506. The light absorption layer 506 is ablated by the laser beam 508. A region of the light absorption layer 506, which is irradiated with the laser beam 508, is ablated, and a light absorption layer 510 having a desired pattern shape remains (FIG. 5B).

Figure 5C:
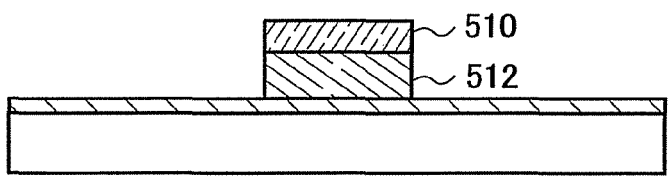

Next, the first material layer 504 is selectively etched using the light absorption layer 510 as a mask, to form a second material layer 512 (FIG. 5C). A dry etching method or a wet etching method may be appropriately selected for the etching. The pattern formed of the second material layer 512 corresponds to the region which is not irradiated with the laser beam 508.

Figure 5D:
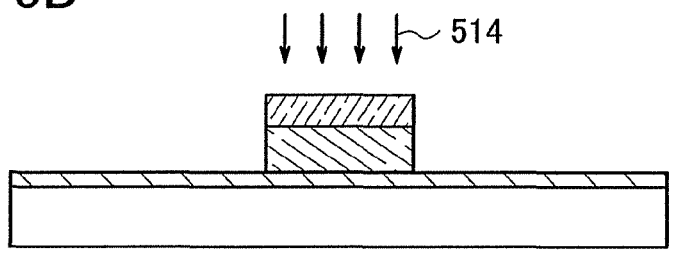

Next, an impurity element imparting one conductivity type or an inert element 514 is added to the light absorption layer 510 (FIG. 5D). As the impurity element or the inert element 514, an element similar to the impurity element or the inert element 110 described in Embodiment Mode 1 may be used to be added. Further, the concentration thereof is not particularly limited; however, the impurity element or the inert element 514 can be added at a concentration, for example, in a range from $1 \times 10^{15}$ atoms/cm$^3$ to $1 \times 10^{21}$ atoms/cm$^3$. The impurity element or the inert element 514 may be added to the second material layer 512 that is below the light absorption layer 510. The depth of ion implantation and the depth of diffusion of the impurity element or the inert element 514 are appropriately controlled by a doping method used for addition, so that the impurity element or the inert element 514 can be added to the second material layer 512.

By adding the impurity element or the inert element 514 to the light absorption layer 510, the tensile stress of the light absorption layer 510 can be reduced. In more detail, the tensile stress of the light absorption layer 510 after ablation by irradiation with the laser beam 508 can be lower than that of the light absorption layer 506 in the irradiation with the laser beam 508. Preferably, the light absorption layer 510 is made to have a compressive stress. By making the light absorption layer 510 have a lower tensile stress or have a compressive stress, generation of a defect such as film peeling of the light absorption layer 510 can be prevented. When the light absorption layer 510 is subjected to heat treatment in a later process, generation of film peeling or the like of the light absorption layer 510 owing to the tensile stress can be prevented. At this time, by adding the impurity element or the inert element 514 to the second material layer 512 that is below the light absorption layer 510, a defect such as film peeling of the second material layer 512 can be prevented, which is preferable.

The stacked structure of the light absorption layer 510 and the second material layer 512 formed in the above-described manner can be used for a conductive layer for forming a gate electrode, a wiring, or the like of a semiconductor device, and a conductive layer functioning as an antenna used for an RF tag or the like. By applying the present invention, a semiconductor device in which generation of burrs or the like at an end portion of a thin film pattern is prevented so that processing can be conducted easily with accuracy, and generation of a defect such as film peeling is unlikely to occur, can be manufactured; accordingly, a semiconductor device with high reliability can be manufactured with high yield.

Figure 6A:
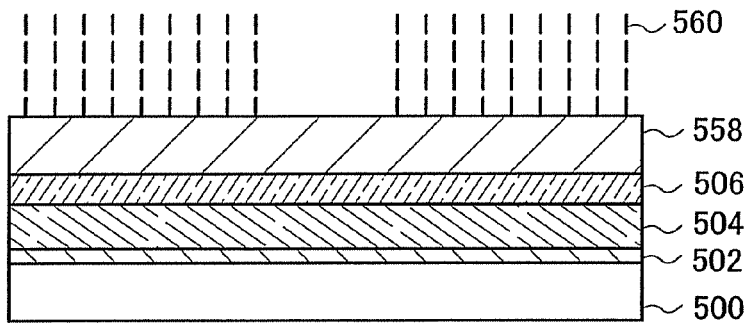
FIGS. 6A to 6D are conceptual diagrams explaining the present invention.

Further, in the case where a light-transmitting layer 558 is formed over the light absorption layer 506, the present invention can be applied. As shown in FIG. 6A, the first material layer 504, the light absorption layer 506, and the light-transmitting layer 558 are sequentially stacked over the substrate 500 with the insulating layer 502 interposed therebetween. Then, the light absorption layer 506 is selectively irradiated with a laser beam 560 from the light-transmitting layer 558 side.

Note that the structure in which the first material layer 504 and the light absorption layer 506 are provided over the substrate 500 with the insulating layer 502 interposed therebetween is similar to that of FIG. 5A. A laser beam similar to the above-described laser beam 508 can be applied to the laser beam 560. Irradiation with the laser beam 560 can be selectively conducted by the laser irradiation apparatus as shown in FIG. 9 or FIG. 10.

The light-transmitting layer 558 is formed using a material that can transmit the laser beam 560. For example, an inorganic insulating material such as silicon oxide, silicon nitride, silicon oxynitride, or silicon nitride oxide; or an organic insulating material such as polyimide, acrylic, polyamide, polyimide amide, benzocyclobutene, or an epoxy resin can be used. The light-transmitting layer 558 is formed with a single-layer structure or a stacked structure using one or more of these materials by a sputtering method, a CVD method, a coating method, or the like. The light-transmitting layer 558 may absorb part of the laser beam 560.

Further, a layer having a tensile stress is preferably formed as the light-transmitting layer 558. When the light-transmitting layer 558 has a tensile stress, generation of burrs or the like at an end portion of a pattern of the thin film (light-transmitting layer) can be reduced at the time of ablating part of the light-transmitting layer 558 by irradiation with the laser beam 560 to form the pattern of the thin film with a desired shape, and processing can be conducted easily with accuracy. Depending on the selected material, there is a case in which the light-transmitting layer 558 having a tensile stress is hard to be formed. In such a case, the light-transmitting layer 558 is preferably formed so as to have a stress close to the tensile stress, or so as to have a low compressive stress.

Figure 6B:
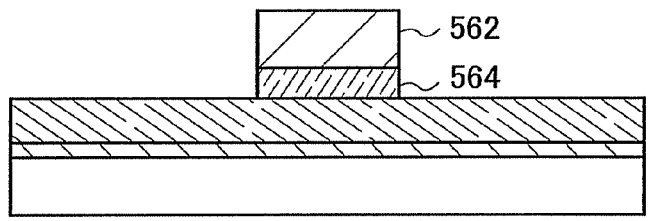

The laser beam 560 passes through the light-transmitting layer 558 and is absorbed by the light absorption layer 506. In a region, which is irradiated with the laser beam 560, the light absorption layer 506 is heated by irradiation with the laser beam 560. Accordingly, only the light-transmitting layer 558, or both the light-transmitting layer 558 and the light absorption layer 506 is/are ablated. Here, by ablation of the light-transmitting layer 558 and the light absorption layer 506, a light-transmitting layer 562 and a light absorption layer 564 each having a desired pattern shape remain (FIG. 6B).

Here, the stacked structure where the light absorption layer 506 that absorbs a laser beam and the light-transmitting layer 558 that does not absorb (or easily absorb) a laser beam are stacked is formed, so that the layer that is not laser-ablated when it is by itself can be processed by utilizing laser ablation.

Figure 6C:
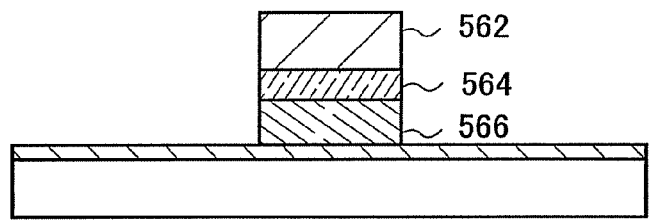

Next, the first material layer 504 is selectively etched using the light-transmitting layer 562 and the light absorption layer 564 as a mask, to form a second material layer 566 (FIG. 6C). A dry etching method or a wet etching method may be appropriately selected for the etching. The pattern formed of the second material layer 566 corresponds to the region which is not irradiated with the laser beam 560.

Figure 6D:
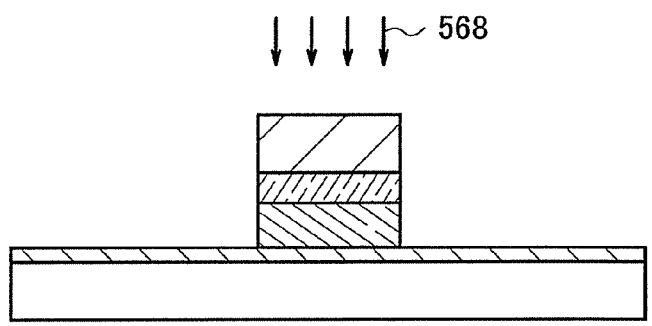

Next, an impurity element imparting one conductivity type or an inert element 568 is added to the light-transmitting layer 562 and the light absorption layer 564 (FIG. 6D). As the impurity element or the inert element 568, an element similar to the above-described impurity element or the inert element 514 may be used to be added. Further, the concentration thereof is not particularly limited; however, the impurity element or the inert element 568 can be added at a concentration, for example, in a range from $1\times10^{15}$ atoms/cm$^3$ to $1\times10^{21}$ atoms/cm$^3$. The impurity element or the inert element 568 may be added to the second material layer 566 that is below the light absorption layer 564. The depth of ion implantation and the depth of diffusion of the impurity element or the inert element 568 are appropriately controlled by a doping method employed, so that the impurity element or the inert element 568 can be added to the light absorption layer 564 or the second material layer 566.

By adding the impurity element or the inert element 568 to the light-transmitting layer 562 and the light absorption layer 564, the tensile stresses of the light-transmitting layer 562 and the light absorption layer 564 can be reduced. In more detail, the tensile stresses of the light-transmitting layer 562 and the light absorption layer 564 after ablation by irradiation with the laser beam 560 can be lower than those of the light-transmitting layer 558 and the light absorption layer 506 in the irradiation with the laser beam 560. Preferably, the light-transmitting layer 562 and the light absorption layer 564 are each made to have a compressive stress. By making each of the light-transmitting layer 562 and the light absorption layer 564 have a lower tensile stress or have a compressive stress, generation of a defect such as film peeling of the light-transmitting layer 562 and the light absorption layer 564 can be prevented. When the light-transmitting layer 562 and the light absorption layer 564 are subjected to heat treatment in a later process, generation of film peeling or the like of the light-transmitting layer 562 and the light absorption layer 564 owing to the tensile stress can be prevented.

In this embodiment mode, the structure in which the conductive layer is provided over the substrate with the base insulating layer interposed therebetween is described; however, the present invention is not particularly limited. For example, the base insulating layer need not necessarily be provided, and a single layer of an insulating layer, a conductive layer, a semiconductor layer, or the like or plural layers with a combination of the layers may be provided between the substrate and the conductive layer.

By applying the present invention, a layer having a desired pattern shape can be formed without using a lithography process that uses a photoresist. By controlling the stress of a process layer before and after ablation by laser beam irradiation, thin film processing can be conducted with accuracy and generation of a defect in a thin film pattern after processing can be prevented. Therefore, a semiconductor device with high reliability can be realized with high yield.

This embodiment mode can be appropriately combined with any of other embodiment modes described in this specification.

Embodiment Mode 3

Embodiment Mode 3 will describe examples of a method for processing a thin film, which are different from those of the above embodiment modes, with reference to FIGS. 3A to 4D. Here, an example in which a thin film is processed to form an opening for electrically connecting a conductive layer with another conductive layer, or for electrically connecting a conductive layer with a semiconductor layer, will be described.

Figure 3A:
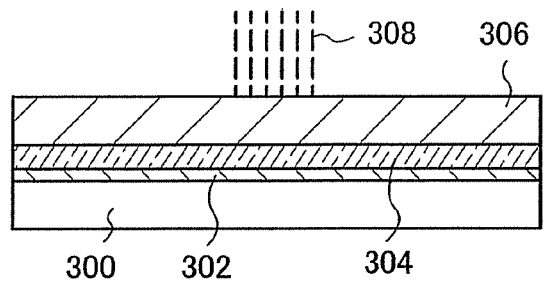
FIGS. 3A to 3E are conceptual diagrams explaining the present invention.

An insulating layer 302, a light absorption layer 304, and a light-transmitting layer 306 are sequentially stacked over a substrate 300. The light absorption layer 304 is selectively irradiated with a laser beam 308 from the light-transmitting layer 306 side (FIG. 3A). Since a substrate and an insulating layer similar to the substrate 100 and the insulating layer 102 described in Embodiment Mode 1 can be used for the substrate 300 and the insulating layer 302, the explanations thereof are omitted.

A layer that absorbs the laser beam 308 is formed as the light absorption layer 304. For example, the light absorption layer 304 can be formed using a metal element such as chromium (Cr), molybdenum (Mo), nickel (Ni), titanium (Ti), cobalt (Co), copper (Cu), aluminum (Al), or tungsten (W); or an alloy material containing the metal element. The light absorption layer 304 may have a stacked structure using a compound material containing the metal element, and the above-described metal element or the alloy material containing the metal element. Alternatively, a semiconductor material such as silicon (Si), germanium (Ge), silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. The light absorption layer 304 is formed using one or more of the above-described materials with a single-layer structure or a stacked structure by a sputtering method, a CVD method, an evaporation method, or the like.

The light-transmitting layer 306 is formed using a material that can transmit the laser beam 308. For example, an inorganic insulating material such as silicon oxide, silicon nitride, silicon oxynitride, or silicon nitride oxide; or an organic insulating material such as polyimide, acrylic, polyamide, polyimide amide, benzocyclobutene, or an epoxy resin can be used. The light-transmitting layer 306 is formed with a single-layer structure or a stacked structure using one or more of these materials by a sputtering method, a CVD method, a coating method, or the like. The light-transmitting layer 306 may absorb part of the laser beam 308.

Further, a layer having a tensile stress is preferably formed as the light-transmitting layer 306. When the light-transmitting layer 306 has a tensile stress, generation of burrs or the like on an opening side surface can be reduced at the time of ablating part of the light-transmitting layer 306 by irradiation with the laser beam 308 to form an opening, and processing can be conducted easily with accuracy. Depending on the selected material, there is a case in which the light-transmitting layer 306 having a tensile stress is hard to be formed. In such a case, the light-transmitting layer 306 is preferably formed so as to have a stress close to the tensile stress, or so as to have a low compressive stress.

As the laser beam 308, a laser beam having an energy or a wavelength that can be absorbed by the light absorption layer 304 is appropriately selected. Note that a laser beam similar to the laser beam 106 described in Embodiment Mode 1 can be used as the laser beam 308. Preferably, a laser beam with a pulse width in a range of picoseconds ($10^{-12}$ seconds to $10^{-10}$ seconds) or in a range of femtoseconds ($10^{-15}$ seconds to $10^{-13}$ seconds) may be used. When such an ultrashort pulsed laser beam is used, the laser beam can be easily condensed in a minute region; accordingly, the ultrashort pulsed laser beam is advantageous to minute processing. Thus, a minute opening can be formed with accuracy, which is preferable.

Figure 3B:
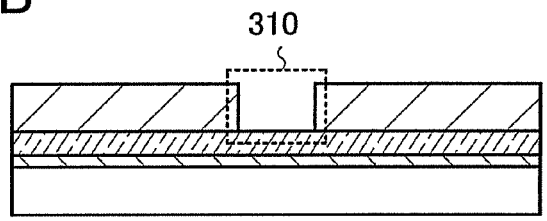

The laser beam 308 passes through the light-transmitting layer 306 and is absorbed by the light absorption layer 304. In a region, which is irradiated with the laser beam 308, the light absorption layer 304 is heated by irradiation with the laser beam 308. Accordingly, only the light-transmitting layer 306, or both the light-transmitting layer 306 and the light absorption layer 304 is/are ablated to form an opening. Here, by ablation of the light-transmitting layer 306, an opening 310 reaching the light absorption layer 304 is formed (FIG. 3B).

In the present invention, the light absorption layer 304 that absorbs a laser beam is formed in contact with the light-transmitting layer 306 that does not absorb (or easily absorb) a laser beam and is not ablated when it is by itself, which makes it possible to laser-process the light-transmitting layer 306. By forming the stacked structure where the layer that absorbs a laser beam, and the layer that does not absorb a laser beam or the layer that does not easily absorb a laser beam are stacked in this way, a minute opening can be easily formed.

Figure 3C:
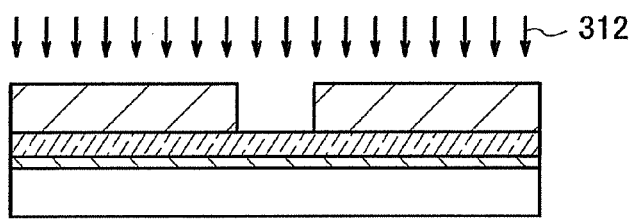

Next, an impurity element imparting one conductivity type or an inert element 312 is added to the light-transmitting layer 306 (FIG. 3C). As the impurity element or the inert element 312, an element similar to the above-described impurity element or the inert element 110 of Embodiment Mode 1 may be used to be added. Further, the concentration thereof is not particularly limited; however, the impurity element or the inert element 312 can be added at a concentration, for example, in a range from $1\times10^{15}$ atoms/cm$^3$ to $1\times10^{21}$ atoms/cm$^3$. The depth of ion implantation and the depth of diffusion of the impurity element or the inert element 312 are appropriately controlled by a doping method used for addition, so that the impurity element or the inert element 312 can be added to the light absorption layer 304.

By adding the impurity element or the inert element 312 to the light-transmitting layer 306, the tensile stress of the light-transmitting layer 306 can be reduced. In more detail, the tensile stress of the light-transmitting layer 306 after formation of the opening 310 can be lower than that of the light-transmitting layer 306 in the irradiation with the laser beam 308. Preferably, the light-transmitting layer 306 after formation of the opening 310 is made to have a compressive stress. By making the light-transmitting layer 306 have a lower tensile stress or have a compressive stress, generation of a defect such as film peeling of the light-transmitting layer 306 can be prevented. When the light-transmitting layer 306 is subjected to heat treatment in a later process, generation of film peeling or the like of the light-transmitting layer 306 owing to the tensile stress can be prevented.

Figure 3D:
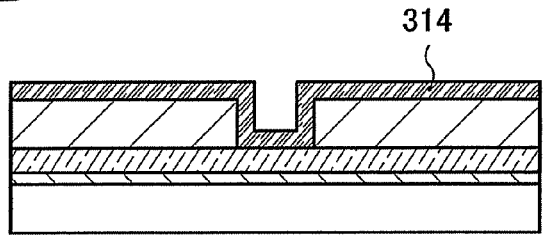

Next, a conductive layer 314 is formed in the opening 310 so as to be electrically connected to the light absorption layer 304 (FIG. 3D). Note that in the case of forming the light absorption layer 304 using a conductive material, electric connection between the conductive layer 314 and the light absorption layer 304 can be applied as electric connection between conductive layers, for example, connection of a source electrode or a drain electrode to a pixel electrode, or the like. In the case of forming the light absorption layer 304 using a semiconductor material such as silicon, electric connection between the conductive layer 314 and the light absorption layer 304 can be applied as electric connection between a semiconductor layer and a conductive layer, for example, connection of a source region or a drain region to a source electrode or a drain electrode, or the like.

Figure 3E:
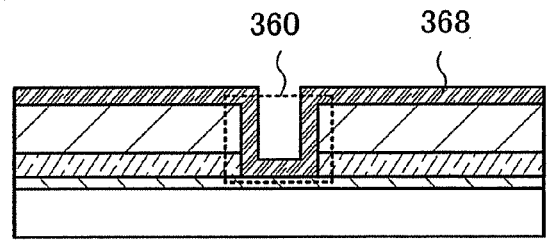

In FIG. 3B, the example of forming the opening 310 in such a manner that the light-transmitting layer 306 is irradiated with the laser beam 308 and ablated is shown; however, the present invention is not particularly limited thereto. For example, as shown in FIG. 3E, an opening 360 that penetrates through the light absorption layer 304 can be formed in such a way that the light-transmitting layer 306 and the light absorption layer 304 are ablated by laser beam irradiation. A conductive layer 368 can be formed in the opening 360, so that the conductive layer 368 can be electrically connected to side surfaces of the light absorption layer 304. Alternatively, the light-transmitting layer and an upper portion of the light absorption layer can be ablated by laser beam irradiation to form an opening.

In the case where the insulating layer 302 and the substrate 300 below the light absorption layer 304 each have a light-transmitting property, an opening can be formed in such a way that the light absorption layer 304 is irradiated with a laser beam from the substrate 300 side so as to be ablated.

A light absorption layer and a light-transmitting layer may be stacked over a first material layer, an opening may be formed in the light absorption layer and the light-transmitting layer, and a conductive layer may be formed in the opening to electrically connect the first material layer to the conductive layer. Such a case will be specifically described below.

Figure 4A:
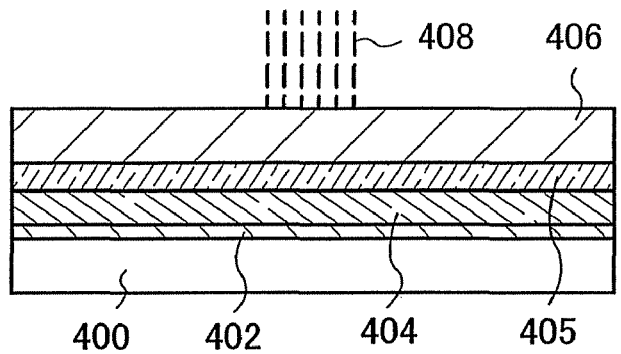
FIGS. 4A to 4D are conceptual diagrams explaining the present invention.

As shown in FIG. 4A, a first material layer 404, a light absorption layer 405, and a light-transmitting layer 406 are sequentially stacked over a substrate 400 with an insulating layer 402 interposed therebetween. The light absorption layer 405 is selectively irradiated with a laser beam 408 from the light-transmitting layer 406 side (FIG. 4A). Since a substrate and an insulating layer similar to the substrate 100 and the insulating layer 102 described in Embodiment Mode 1 can be used for the substrate 400 and the insulating layer 402, the explanations thereof are omitted.

The first material layer 404 is formed using a material in accordance with the purpose. For example, when a conductive layer is desired to be formed as the first material layer 404, the first material layer 404 is formed using a conductive material such as, for example, a metal element of tantalum (Ta), tungsten (W), titanium (Ti), molybdenum (Mo), aluminum (Al), copper (Cu), silver (Ag), gold (Au), nickel (Ni), platinum (Pt), palladium (Pd), iridium (Ir), rhodium (Rh), or the like; or an alloy material or a compound material containing the metal element. As the compound material, a nitrogen compound, an oxygen compound, a carbon compound, a halogen compound, or the like can be given. Alternatively, polycrystalline silicon added with an impurity element imparting one conductivity type such as phosphorus (P) may be formed. When a semiconductor layer for forming a channel or the like is desired to be formed as the first material layer 404, the first material layer 404 is formed using a semiconductor material such as, for example, silicon, germanium, silicon germanium, or zinc oxide. The first material layer 404 can be formed with a single-layer structure or a stacked structure using one or more of the conductive materials and the semiconductor materials by a sputtering method, a CVD method, an evaporation method, or the like.

A layer that absorbs a laser beam 408 is formed as the light absorption layer 405. For example, a material including a metal element such as chromium (Cr), molybdenum (Mo), or tungsten (W); or a semiconductor material such as silicon (Si) or zinc oxide can be used. Specifically, a material similar to that of the light absorption layer 104 described in Embodiment Mode 1 can be used.

The light-transmitting layer 406 is formed using a material that can transmit the laser beam 408. For example, an inorganic insulating material such as silicon oxide or silicon nitride, or an organic insulating material such as polyimide or acrylic can be used. Specifically, a material similar to that of the above-described light-transmitting layer 306 can be used.

Further, a layer having a tensile stress is preferably formed as the light-transmitting layer 406, similarly to the above-described light-transmitting layer 306. When the light-transmitting layer 406 has a tensile stress, generation of burrs or the like on an opening side surface can be reduced at the time of ablating part of the light-transmitting layer 406 by irradiation with the laser beam 408 to form an opening, and processing can be conducted easily with accuracy. Depending on the selected material, there is a case in which the light-transmitting layer 406 having a tensile stress is hard to be formed. In such a case, the light-transmitting layer 406 is preferably formed so as to have a stress close to the tensile stress, or so as to have a low compressive stress.

As the laser beam 408, a laser beam having an energy or a wavelength that can be absorbed by the light absorption layer 405 is appropriately selected. Note that a laser beam similar to the laser beam 106 described in Embodiment Mode 1 can be used as the laser beam 408. Preferably, a laser beam with a pulse width in a range of picoseconds ($10^{-12}$ seconds to $10^{-10}$ seconds) or in a range of femtoseconds ($10^{-15}$ seconds to $10^{-13}$ seconds) may be used. When such an ultrashort pulsed laser beam is used, the laser beam can be easily condensed in a minute region; accordingly, the ultrashort pulsed laser beam is advantageous to minute processing. Thus, a minute opening can be formed with accuracy, which is preferable.

Figure 4B:
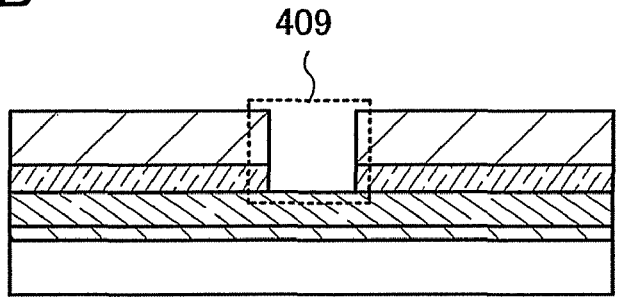

The laser beam 408 passes through the light-transmitting layer 406 and is absorbed by the light absorption layer 405. In a region irradiated with the laser beam 408, the light absorption layer 405 is heated by irradiation with the laser beam 408. Accordingly, only the light-transmitting layer 406, or both the light-transmitting layer 406 and the light absorption layer 405 is/are ablated to form an opening. Here, by ablation of the light-transmitting layer 406 and the light absorption layer 405, an opening 409 reaching the first material layer 404 is formed (FIG. 4B).

In the present invention, the light absorption layer 405 that absorbs a laser beam is formed in contact with the light-transmitting layer 406 that does not absorb (or easily absorb) a laser beam and is not ablated when it is by itself, which makes it possible to laser-process the light-transmitting layer 406. By forming the stacked structure where the layer that absorbs a laser beam, and the layer that does not absorb a laser beam or the layer that does not easily absorb a laser beam are stacked in this way, a minute opening can be easily formed.

Figure 4C:
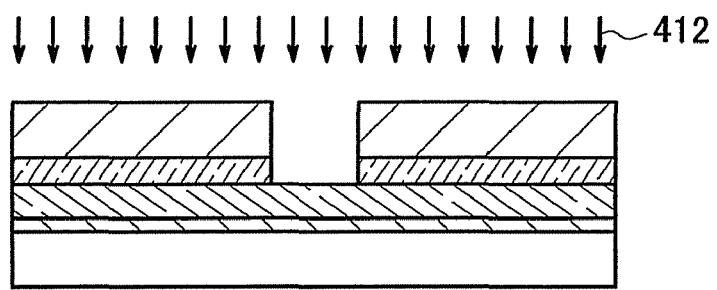

Next, an impurity element imparting one conductivity type or an inert element 412 is added to the light-transmitting layer 406 (FIG. 4C). As the impurity element or the inert element 412, an element similar to the impurity element or the inert element 110 of Embodiment Mode 1 may be used to be added. Further, the concentration thereof is not particularly limited; however, the impurity element or the inert element 412 can be added at a concentration, for example, in a range from $1\times10^{15}$ atoms/cm$^3$ to $1\times10^{21}$ atoms/cm$^3$. The depth of ion implantation and the depth of diffusion of the impurity element or the inert element 412 are appropriately controlled by a doping method used for addition, so that the impurity element or the inert element 412 can be added to the light absorption layer 405 and the first material layer 404.

By adding the impurity element or the inert element 412 to the light-transmitting layer 406, the tensile stress of the light-transmitting layer 406 can be reduced. In more detail, the tensile stress of the light-transmitting layer 406 after formation of the opening 409 can be lower than that of the light-transmitting layer 406 in the irradiation with the laser beam 408. Preferably, the light-transmitting layer 406 after formation of the opening 409 is made to have a compressive stress. By making the light-transmitting layer 406 have a lower tensile stress or have a compressive stress, generation of a defect such as film peeling of the light-transmitting layer 406 can be prevented. When the light-transmitting layer 406 is subjected to heat treatment in a later process, generation of film peeling or the like of the light-transmitting layer 406 owing to the tensile stress can be prevented.

Figure 4D:
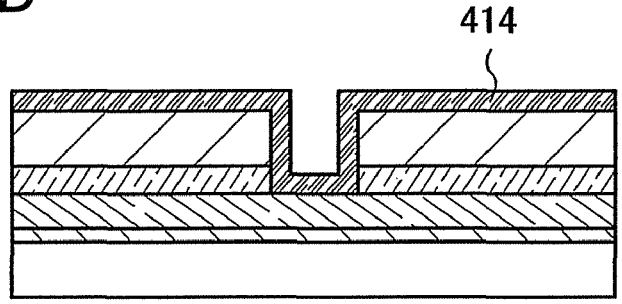

Next, a conductive layer 414 is formed in the opening 409 so as to be electrically connected to the first material layer 404 (FIG. 4D). Note that in the case of forming the light absorption layer 405 and the first material layer 404 using a conductive material, a stacked structure of conductive layers is formed by the first material layer 404 and the light absorption layer 405, and the conductive layer 414 can be electrically connected to the light absorption layer 405. Such electric connection between conductive layers or between a conductive layer and a semiconductor layer through the opening 409 can be applied to, for example, connection of a source electrode or a drain electrode to a pixel electrode, connection of a semiconductor layer to a source electrode or a drain electrode, and the like.

In this embodiment mode, the structure in which the light absorption layer is provided over the substrate with the base insulating layer interposed therebetween and the structure in which the first material layer is provided over the substrate with the base insulating layer interposed therebetween are described; however, the present invention is not particularly limited. For example, the base insulating layer need not necessarily be provided, and a single layer of an insulating layer, a conductive layer, a semiconductor layer, or the like or plural layers with a combination of the layers may be provided between the substrate and the light absorption layer or between the substrate and the first material layer.

By applying the present invention, a minute opening can be easily formed without using a lithography process that uses a photoresist. By controlling the stress of a process layer before and after ablation by laser beam irradiation, thin film processing can be conducted with accuracy and generation of a defect in the thin film after formation of the opening can be prevented. Therefore, a semiconductor device with high reliability can be realized with high yield.

This embodiment mode can be appropriately combined with any of other embodiment modes described in this specification.

Embodiment Mode 4

Embodiment Mode 4 will describe examples of thin film processing, which are different from those of the above-described embodiment modes, with reference to FIGS. 7A to 8D.

Figure 7A:
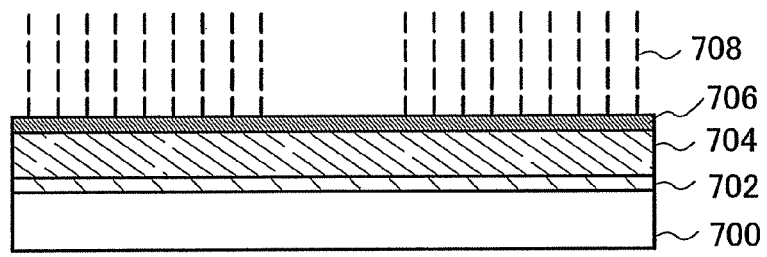
FIGS. 7A to 7D are conceptual diagrams explaining the present invention.

An insulating layer 702, a first material layer 704, and a separation layer 706 are sequentially stacked over a substrate 700. The separation layer 706 is selectively irradiated with a laser beam 708 (FIG. 7A).

As the substrate 700, a glass substrate, a quartz substrate, a sapphire substrate, a ceramic substrate, a semiconductor substrate, or the like is used. The insulating layer 702 is formed using an insulating material such as silicon oxide, silicon nitride, silicon oxynitride, or silicon nitride oxide. The insulating layer 702 functions as a base insulating layer. By providing the insulating layer 702 over the substrate 700, damage to the substrate 700 can be prevented in irradiation with the laser beam 708. Note that the insulating layer 702 need not necessarily be provided. Here, a glass substrate is used as the substrate 700, and a silicon nitride oxide layer is formed as the insulating layer 702, over the substrate 700.

The first material layer 704 is formed using a material in accordance with the purpose. For example, when a conductive layer functioning as an electrode or a wiring is desired to be formed as the first material layer 704, a conductive material such as, for example, a metal element of silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), copper (Cu), or the like; an alloy material or a compound material containing the metal element is used. When a semiconductor layer for forming a channel or the like is desired to be formed as the first material layer 704, a semiconductor material, such as, for example, silicon, germanium, silicon germanium, or zinc oxide can be used. The first material layer 704 can be formed with a single-layer structure or a stacked structure using one or more of the conductive materials and the semiconductor materials by a sputtering method, a CVD method, or the like. Here, a tungsten layer is formed as the first material layer 704.

A layer whose adhesiveness is decreased by absorption of a laser beam is formed as the separation layer 706. For example, the separation layer 706 can be formed using a metal oxide such as, for example, titanium oxide, zirconium oxide, hafnium oxide, vanadium oxide, tantalum oxide, niobium oxide, tungsten oxide, molybdenum oxide, chromium oxide, technetium oxide, rhenium oxide, iron oxide, ruthenium oxide, osmium oxide, cobalt oxide, rhodium oxide, iridium oxide, nickel oxide, or palladium oxide. Metal oxides have different bond numbers of oxygen depending on the valence of the metal element, and also have different wavelengths of light to be absorbed depending on the valence of the metal element. Thus, the wavelength of a laser beam with which the separation layer 706 is irradiated is selected appropriately in accordance with the material for forming the separation layer.

The separation layer 706 can be formed by a coating method, an evaporation method, a vacuum evaporation method, a sputtering method, a CVD method, or the like. A thin conductive layer (conductive layer including a metal element) can be formed, and then heated to form a metal oxide layer. In addition, when the first material layer 704 is formed using a conductive material including a metal element, the surface of the first material layer 704 can be oxidized to form the separation layer 706. As the oxidation method of the surface of the first material layer 704, there are such treatments as heating in an oxygen atmosphere (heating by using an electric furnace or a lamp); a plasma treatment using oxygen plasma, nitrous oxide plasma, ozone plasma, or the like; ashing using oxygen; an oxidation treatment by a liquid having oxidizability such as ozone water or water; and the like. Here, the surface of the tungsten layer that is formed as the first material layer 704 is subjected to nitrous oxide plasma treatment, so that a tungsten oxide layer is formed. At this time, the tungsten oxide layer corresponds to the separation layer 706.

Further, a layer having a tensile stress is preferably formed as the separation layer 706. When a layer having a tensile stress is formed as the separation layer 706, generation of burrs or the like at an end portion of a pattern of the thin film (separation layer) can be suppressed at the time of forming the pattern of the thin film with a desired shape. By making the process layer have a tensile stress, processing can be conducted easily. As one reason of this, the following mechanism can be considered. For example, the stress concentration increases at the interface between an irradiated region and a non-irradiated region with the laser beam 708 in the separation layer 706, and cracks easily occur at the interface. That is, a crack generates in the film thickness direction of the separation layer 706. Thus, the adhesiveness of the separation layer 706 is decreased, and part of the separation layer 706, in which the crack is generated, becomes weak. Accordingly, the region of the separation layer 706, which have been irradiated with the laser beam 708, can be easily removed.

As the laser beam 708, a laser beam having an energy or a wavelength that can be absorbed by only the separation layer 706, or both the separation layer 706 and the first material layer 704 is appropriately selected. Specifically, the laser beam 708 for irradiation may be all absorbed by the separation layer 706, or part of the laser beam 708 may pass the separation layer 706 and then be absorbed by the first material layer 704. Note that a laser beam similar to the laser beam 106 described in Embodiment Mode 1 can be used as the laser beam 708. For example, a laser beam in an ultraviolet region, a visible light region, or an infrared region may be appropriately selected to conduct irradiation. In addition, selective irradiation can be conducted by using the laser irradiation apparatus as shown in FIG. 9 or FIG. 10, which is described in Embodiment Mode 1.

In the case where the laser irradiation apparatus 1720 shown in FIG. 9 is applied to this embodiment mode, the structure shown in FIG. 7A, in which the insulating layer 702, the first material layer 704, and the separation layer 706 are sequentially stacked over the substrate 700, corresponds to the irradiation object 1700 shown in FIG. 9. Similarly, in the case where the laser irradiation apparatus 1000 shown in FIG. 10 is applied, the structure shown in FIG. 7A, in which the insulating layer 702, the first material layer 704, and the separation layer 706 are sequentially stacked over the substrate 700, corresponds to the irradiation object 1010 shown in FIG. 10.

The energy of the laser beam 708 preferably has a level by which the adhesiveness of the separation layer 706 can be sufficiently decreased. For example, the energy density of the laser beam 708, by which the adhesiveness of the separation layer 706 is sufficiently decreased, is specifically in a range of 50 mJ/cm$^2$ to 500 mJ/cm$^2$. In the case of using an excimer laser beam (wavelength: 308 nm) as the laser beam 708, the energy density by which the adhesiveness of the separation layer 706 is sufficiently decreased is preferably 200 mJ/cm$^2$ to 300 mJ/cm$^2$. In the case where the laser irradiation apparatus 1720 shown in FIG. 9 is applied to this embodiment mode, the laser beam 708 shown in FIG. 7A corresponds to the laser beam 1705 shown in FIG. 9. Similarly, in the case where the laser irradiation apparatus 1000 shown in FIG. 10 is applied, the laser beam 708 shown in FIG. 7A corresponds to the laser beam 1015 shown in FIG. 10.

Figure 7B:
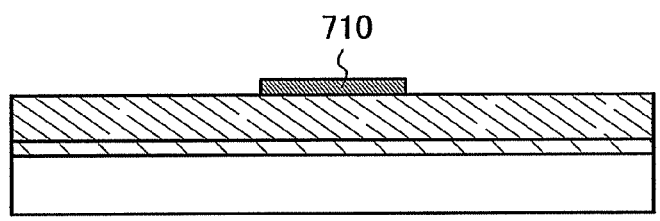

When the separation layer 706 is irradiated with the laser beam 708, the adhesiveness of the separation layer 706 in the region irradiated with the laser beam 708 is decreased. Specifically, the adhesiveness of the region of the separation layer 706, which is irradiated with the laser beam 708, is decreased. By removing the region, in which the adhesiveness is decreased, of the separation layer 706, a separation layer 710 having a desired pattern shape remains (FIG. 7B).

The removal method of the separation layer 706 in the region irradiated with the laser beam 708 (the region in which the adhesiveness is decreased) is not particularly limited; however, a chemical removing method using a solution; or a physical removing method such as removing by water washing, attachment of the separation layer with decreased adhesiveness to an adhesive material, or suction by reduced pressure can be employed. Further, a chemical removing method and a physical removing method may be combined. Here, the substrate 700, over which various kinds of thin films are formed to be stacked, is washed with water and the separation layer with decreased adhesiveness is removed.

Figure 7C:
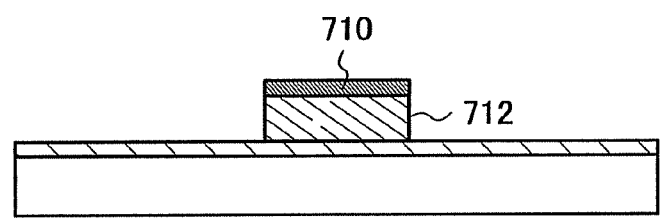

Next, the first material layer 704 is selectively etched using the separation layer 710 as a mask, to form a second material layer 712 (FIG. 7C). A dry etching method or a wet etching method may be appropriately selected for the etching. For example, in the case of forming a tungsten layer as the first material layer 704, dry etching can be conducted using a fluorine-based gas such as $CF_4$ or $CHF_3$. Further, a mixed gas of $CF_4$ and $Cl_2$, or a mixed gas of $CHF_3$ and He can be used. The pattern formed of the second material layer 712 corresponds to the region which is not irradiated with the laser beam 708.

Figure 7D:
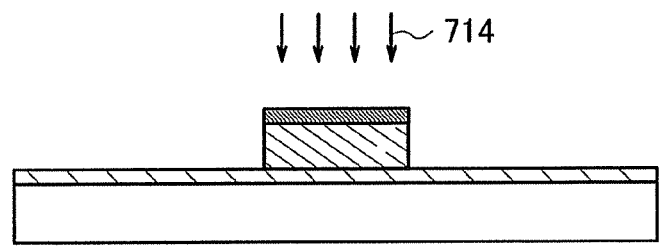

Next, an impurity element imparting one conductivity type or an inert element 714 is added to the separation layer 710 (FIG. 7D). As the impurity element or the inert element 714, an element similar to that of the impurity element or the inert element 110 described in Embodiment Mode 1 may be added. For example, an impurity element imparting n-type conductivity such as phosphorus (P) or arsenic (As), an impurity element imparting p-type conductivity such as boron (B), aluminum (Al), or gallium (Ga), or an inert element such as nitrogen or a rare gas can be added by a doping method such as an ion implantation method or a thermal diffusion method. The concentration of the impurity element or the inert element 714 is not particularly limited; however, the impurity element or the inert element 714 can be added at a concentration, for example, in a range from $1\times10^{15}$ atoms/cm$^3$ to $1\times10^{21}$ atoms/cm$^3$. By appropriately controlling the depth of ion implantation and the depth of diffusion of the impurity element or the inert element 714, the impurity element or the inert element 714 can be added to the second material layer 712 that is below the separation layer 710. Here, phosphorus (P) is used as the impurity element or the inert element imparting one conductivity type.

By adding the impurity element or the inert element 714 to the light absorption layer 710, the tensile stress of the separation layer 710 can be reduced. In more detail, the tensile stress of the separation layer 710 after removing part of the separation layer 706 by irradiation with the laser beam 708 can be lower than that of the separation layer 706 in the irradiation with the laser beam 708. Preferably, the separation layer 710 is made to have a compressive stress. By making the separation layer 710 have a lower tensile stress or have a compressive stress, generation of a defect such as film peeling of the separation layer 710 can be prevented. When the separation layer 710 is subjected to heat treatment in a later process, generation of film peeling or the like of the separation layer 710 owing to the tensile stress can be prevented. At this time, by adding the impurity element or the inert element 714 to the second material layer 712 that is below the separation layer 710, a defect such as film peeling of the second material layer 712 can be prevented, which is preferable.

The second material layer 712 formed in the above-described manner can be used as a semiconductor layer for forming a channel of a semiconductor device, or a conductive layer for forming a gate electrode, a wiring, or the like of a semiconductor device. The separation layer 710 can function as part of a gate insulating layer or an interlayer insulating layer. By applying the present invention, a semiconductor device in which generation of burrs or the like at an end portion of a thin film pattern is prevented so that processing can be conducted with accuracy, and generation of a defect such as film peeling is unlikely to occur, can be manufactured; accordingly, a semiconductor device with high reliability can be manufactured with high yield.

Figure 8A:
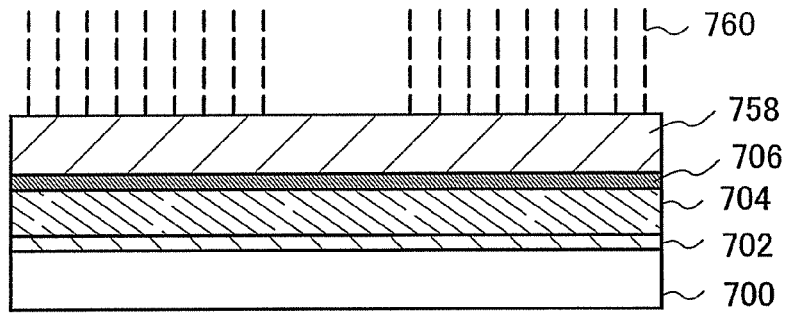
FIGS. 8A to 8D are conceptual diagrams explaining the present invention.

Further, in the case where a light-transmitting layer 758 is formed over the separation layer 706, the present invention can also be applied. As shown in FIG. 8A, the first material layer 704, the separation layer 706, and the light-transmitting layer 758 are sequentially stacked over the substrate 700 with the insulating layer 702 interposed therebetween. Then, the separation layer 706 is selectively irradiated with a laser beam 760 from the light-transmitting layer 758 side.

Note that the structure, in which the first material layer 704 and the separation layer 706 are provided over the substrate 700 with the insulating layer 702 interposed therebetween, is similar to that of FIG. 7A. A laser beam similar to the above-described laser beam 708 can be applied to the laser beam 760. Irradiation with the laser beam 760 can be selectively conducted by the laser irradiation apparatus as shown in FIG. 9 or FIG. 10.

The light-transmitting layer 758 is formed using a material that can transmit the laser beam 760. For example, an inorganic insulating material such as silicon oxide, silicon nitride, silicon oxynitride, or silicon nitride oxide; or an organic insulating material such as polyimide, acrylic, polyamide, polyimide amide, benzocyclobutene, or an epoxy resin can be used. The light-transmitting layer 758 is formed with a single-layer structure or a stacked structure using one or more of these materials by a sputtering method, a CVD method, a coating method, or the like. The light-transmitting layer 758 may absorb part of the laser beam 760. Here, a silicon nitride oxide layer is formed as the light-transmitting layer 758.

Further, a layer having a tensile stress is preferably formed as the light-transmitting layer 758. When the light-transmitting layer 758 has a tensile stress, generation of burrs or the like at an end portion of a pattern of the thin films (the light-transmitting layer and the separation layer) can be reduced at the time of removing part of the light-transmitting layer and the separation layer 706 by irradiation with the laser beam 760 to form the pattern of the thin films with a desired shape, and processing can be conducted easily with accuracy. By making the process layer have a tensile stress, processing can be conducted easily. As one reason of this, the following mechanism can be considered. For example, the stress concentration increases at the interface between an irradiated region and a non-irradiated region with the laser beam 760 in the separation layer 706, and cracks easily generate in a portion of the light-transmitting layer 758, which is over the interface. Then, a crack generates in the film thickness direction of the light-transmitting layer 758. Thus, the adhesiveness of the separation layer 706 is decreased, and part of the light-transmitting layer 758, which is over the interface between the irradiated region and the non-irradiated region with the laser beam 760 in the separation layer 706, becomes weak. Accordingly, the region of the light-transmitting layer 758 and the separation layer 706, which have been irradiated with the laser beam 760, can be easily removed. Depending on the selected material, there is a case in which the light-transmitting layer 758 having a tensile stress is hard to be formed. In such a case, the light-transmitting layer 758 is preferably formed so as to have a stress close to the tensile stress, or so as to have a low compressive stress.

Figure 8B:
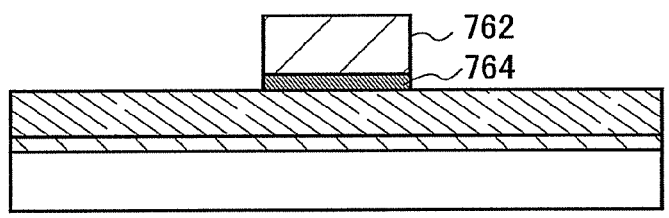

When the separation layer 706 is irradiated with the laser beam 760, which has passed through the light-transmitting layer 758, the adhesiveness of the separation layer 706 in a region irradiated with the laser beam 760 is decreased. Specifically, the adhesiveness of the region of the separation layer 706, which is irradiated with the laser beam 760, is decreased. The stress concentration increased at the interface between the irradiated region and the non-irradiated region with the laser beam 760 in the separation layer 706, and thus the light-transmitting layer 758 positioned over the separation layer 706 becomes weak. By removing the region, in which the adhesiveness is decreased, of the separation layer 706 and the light-transmitting layer 758 positioned thereover, a light-transmitting layer 762 and a separation layer 764 having a desired pattern shape remain (FIG. 8B).

The removal method of the separation layer 706 and the light-transmitting layer 758 positioned thereover in the region irradiated with the laser beam 760 (the region in which the adhesiveness is decreased) is not particularly limited; however, a chemical removing method using a solution; or a physical removing method such as removing by water washing, attachment of the separation layer with decreased adhesiveness to an adhesive material, or suction by reduced pressure can be employed. Further, a chemical removing method and a physical removing method may be combined. Here, the separation layer with decreased adhesiveness and the light-transmitting layer positioned thereover are removed by using an aqueous solution containing hydrofluoric acid.

Figure 8C:
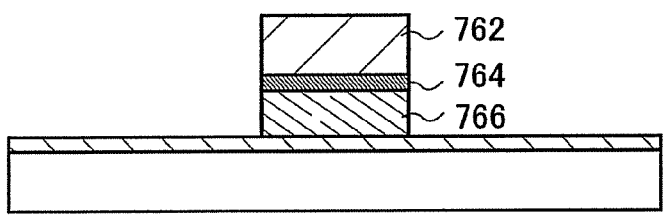

Next, the first material layer 704 is selectively etched using the light-transmitting layer 762 and the separation layer 764 as a mask, to form a second material layer 766 (FIG. 8C). A dry etching method or a wet etching method may be appropriately selected for the etching. The pattern formed of the second material layer 766 corresponds to the region which is not irradiated with the laser beam 760.

Figure 8D:
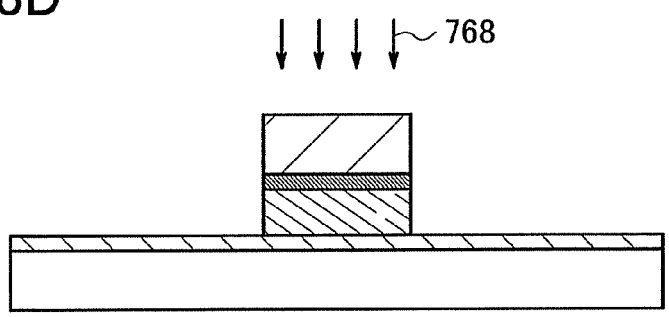

Next, an impurity element imparting one conductivity type or an inert element 768 is added to the light-transmitting layer 762 and the separation layer 764 (FIG. 8D). As the impurity element or the inert element 768, an element similar to the above-described impurity element or the inert element 714 may be used to be added. By appropriately controlling the depth of ion implantation and the depth of diffusion of the impurity element or the inert element 768, the impurity element or the inert element 768 can be added to the separation layer 764 that is below the light-transmitting layer 762, or to the second material layer 766 that is below the separation layer 764.

By adding the impurity element or the inert element 768 to the light-transmitting layer 762, the tensile stress of the light-transmitting layer 762 can be reduced. In more detail, the tensile stress of the light-transmitting layer 762 after removing part of the light-transmitting layer 758 can be lower than that of the light-transmitting layer 758 in the irradiation with the laser beam 760. Preferably, the light-transmitting layer 762 is made to have a compressive stress. By making the light-transmitting layer 762 have a lower tensile stress or have a compressive stress, generation of a defect such as film peeling of the light-transmitting layer 762 can be prevented. When the light-transmitting layer 762 is subjected to heat treatment in a later process, generation of film peeling or the like of the light-transmitting layer 762 owing to the tensile stress can be prevented. At this time, by adding the impurity element or the inert element 768 to the separation layer 764 that is below the light-transmitting layer 762 or to the separation layer 764 and the second material layer 766, a defect such as film peeling of each thin film can be prevented, which is preferable.

The second material layer 712 and the second material layer 766 formed in the above-described manner can be used as a semiconductor layer for forming a channel of a semiconductor device, or a conductive layer for forming a gate electrode, a wiring, or the like of a semiconductor device. In addition, the separation layer 710 and the separation layer 764 can function as part of a gate insulating layer or an interlayer insulating layer. By applying the present invention, a semiconductor device in which generation of burrs or the like at an end portion of a thin film pattern is prevented so that processing can be conducted with accuracy, and generation of a defect such as film peeling is unlikely to occur, can be manufactured; accordingly, a semiconductor device with high reliability can be manufactured with high yield.

In this embodiment mode, the structure in which the first material layer is provided over the substrate with the base insulating layer interposed therebetween is described; however, the present invention is not particularly limited. For example, the base insulating layer need not necessarily be provided, and a single layer of an insulating layer, a conductive layer, a semiconductor layer, or the like or plural layers with a combination of the layers may be provided between the substrate and the first material layer.

By applying the present invention, a layer having a desired pattern shape can be formed without using a lithography process that uses a photoresist. In addition, since thin film processing is conducted using a change in adhesiveness of the separation layer by laser beam irradiation, the energy of the laser beam to be applied can be reduced. By controlling the stress of a process layer before and after separating part of the separation layer, thin film processing can be conducted with accuracy and generation of a defect in the thin film pattern after processing can be prevented. Therefore, a semiconductor device with high reliability can be realized with high yield.

This embodiment mode can be appropriately combined with any of other embodiment modes described in this specification.

Embodiment Mode 5

Embodiment Mode 5 will describe an example of manufacturing a transistor by applying the present invention. Further, an example of manufacturing a display device including a display element will be described. In this embodiment mode, an example in which an inversely staggered transistor is manufactured as a transistor is shown. In addition, an example in which a light emitting element is manufactured as a display element is shown. Hereinafter, a specific manufacturing method will be described with reference to FIG. 12A to FIG. 15B.

Figure 12A:
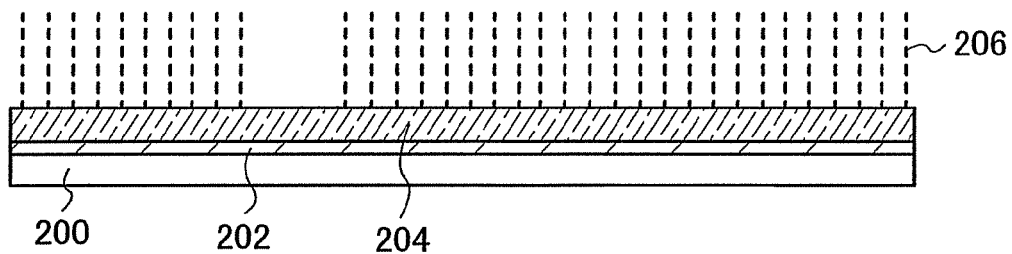
FIGS. 12A to 12D show an example of a manufacturing method of a semiconductor device according to the present invention.

A base insulating layer 202 is formed over a substrate 200, and a conductive layer 204 is formed over the base insulating layer 202 (FIG. 12A). As the substrate 200, a glass substrate of barium borosilicate glass, alumino borosilicate glass, or the like; a quartz substrate; a sapphire substrate; a ceramic substrate; or a plastic substrate having heat resistance which can withstand processing temperature in the present manufacturing process is used. Further, in order to planarize a surface of the substrate 200, the substrate may be polished by a CMP method or the like.

The base insulating layer 202 is formed with a single-layer structure or a stacked structure using an insulating material such as silicon oxide, silicon nitride, silicon oxynitride, or silicon nitride oxide by various methods such as a CVD method, a sputtering method, and a spin coating method. It is not always necessary to form the base insulating layer 202, but it has an effect of blocking a contamination substance or the like from the substrate 200. In addition, the base insulating layer 202 has an effect of preventing damage to the substrate in subsequent laser beam irradiation. In this embodiment mode, a silicon nitride film with a thickness of 100 nm is formed as the base insulating layer 202.

The conductive layer 204 may be formed using a conductive material that absorbs a laser beam 206. For example, the conductive layer 204 may be formed using a metal element such as chromium (Cr), molybdenum (Mo), nickel (Ni), titanium (Ti), cobalt (Co), copper (Cu), aluminum (Al), or tungsten (W); an alloy material or a compound material containing the above metal element as its main component; or the like. Alternatively, a semiconductor material typified by polycrystalline silicon doped with an impurity element such as phosphorus (P), or an AgPdCu alloy may be used. Either a single-layer structure or a stacked structure may be used, and for example, a two-layer structure of a tungsten nitride film and a molybdenum film or a three-layer structure in which a tungsten film having a thickness of 50 nm, an alloy film of aluminum and silicon (Al—Si) having a thickness of 500 nm, and a titanium nitride film having a thickness of 30 nm are sequentially stacked may be used. Further, in the case of the three-layer structure, a tungsten nitride film may be used instead of the tungsten film, an alloy film of aluminum and titanium (Al—Ti) may be used instead of the alloy film of aluminum and silicon (Al—Si), and a titanium film may be used instead of the titanium nitride film. The conductive layer 204 is preferably a layer having a tensile stress.

The conductive layer 204 is formed by a sputtering method, a physical vapor deposition (PVD) method, a chemical vapor deposition (CVD) method such as a low pressure CVD (LPCVD) method or a plasma CVD method, or the like.

In this embodiment mode, as the conductive layer 204, a tungsten film is formed with a thickness of 200 nm by a sputtering method. As an example of specific film formation conditions, an example of using a tungsten target (diameter: 305 nm) is described. For example, the conditions can be such that: the distance between a substrate (in this embodiment mode, corresponding to the substrate 200 with the insulating layer 202 formed thereover) and the target is 60 mm, the Ar gas flow rate is 100 sccm, and a heated Ar gas is flowed at a flow rate of 10 sccm from the back side of the substrate, the film formation pressure is 2.0 Pa, and the film formation power is 4 kW.

The conductive layer 204 is selectively irradiated with the laser beam 206 (FIG. 12A).

As the laser beam 206, a laser beam having an energy or a wavelength that can be absorbed by the conductive layer 204 is appropriately selected. Note that a laser beam similar to the laser beam 106 described in Embodiment Mode 1 can be used. In addition, selective irradiation with the laser beam 206 can be conducted by using a laser irradiation apparatus as shown in FIG. 9 or FIG. 10 described in Embodiment Mode 1.

Figure 12B:
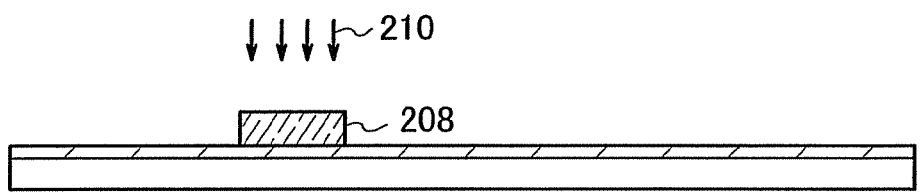

The laser beam 206 is absorbed by the conductive layer 204. The conductive layer 204 is ablated by irradiation with the laser beam 206. A region of the conductive layer 204, which is irradiated with the laser beam 206, is ablated to form a gate electrode layer 208 having a desired pattern shape (FIG. 12B). At this time, by forming the layer having a tensile stress as the conductive layer 204, generation of burrs or the like at a pattern end portion of the gate electrode layer 208 that is obtained by ablation can be suppressed; accordingly, a minute thin film pattern can be formed easily with accuracy.

An end portion of the gate electrode layer 208 may have a shape close to a perpendicular shape, or a tapered shape with a taper angle of 90° or less. Here, the gate electrode layer 208 is formed so as to have an end portion with a shape close to a perpendicular shape, by utilizing laser ablation.

An impurity element imparting one conductivity type or an inert element 210 is added to the gate electrode layer 208 (FIG. 12B). As the impurity element or the inert element 210, an element similar to the impurity element or the inert element 110 described in Embodiment Mode 1 may be used to be added. Further, the concentration thereof is not particularly limited; however, the impurity element or the inert element 210 can be added at a concentration, for example, in a range from $1\times10^{15}$ atoms/cm$^3$ to $1\times10^{21}$ atoms/cm$^3$. By adding the impurity element or the inert element 210 to the gate electrode layer 208, the tensile stress of the gate electrode layer 208 can be reduced. In more detail, the tensile stress of the gate electrode layer 208 after ablation by irradiation with the laser beam 206 can be lower than that of the conductive layer 204 in the irradiation with the laser beam 206. Preferably, the gate electrode layer 208 is made to have a compressive stress. By making the gate electrode layer 208 have a lower tensile stress or have a compressive stress, generation of a defect such as film peeling of the gate electrode layer 208 can be prevented. When the gate electrode layer 208 is subjected to heat treatment in a later process, generation of film peeling or the like of the gate electrode layer 208 owing to the tensile stress can be prevented.

In this embodiment mode, a tungsten layer with a thickness of 200 nm is formed as the gate electrode layer 208, and boron (B) is added to the tungsten layer by an ion implantation method at a dose amount of about $1.5\times10^{15}$ atoms/cm$^2$.

The gate electrode layer 208 can also be formed by utilizing the separation layer described in Embodiment Mode 4. Specifically, a separation layer whose adhesiveness is decreased by absorption of a laser beam is formed on the conductive layer 204. The separation layer is selectively irradiated with a laser beam, so that the adhesiveness of a region of the separation layer, which is irradiated with the laser beam, is decreased. After removing the region with decreased adhesiveness of the separation layer, the conductive layer 204 is selectively etched using the separation layer as a mask, so that a gate electrode layer can be formed. Note that after formation of the gate electrode layer, the separation layer that has served as the etching mask may be removed or may be left as part of a gate insulating layer. In addition, after formation of the gate electrode layer, an impurity element imparting one conductivity type or an inert element may be added. The material, formation method, laser beam, and the like for the separation layer of Embodiment Mode 4 can be applied to those of the separation layer of this embodiment mode.

Note that the formation method of the gate electrode layer 208 is not particularly limited in the present invention, and the gate electrode layer 208 may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. Using these methods, a conductive layer can be selectively formed in a desired place. The gate electrode layer 208 may also be formed by forming a mask with the use of a photoresist over the conductive layer 204 and selectively etching the conductive layer 204 using the mask. In this case, it is not particularly necessary to add an impurity element or an inert element to the formed gate electrode layer.

Figure 12C:
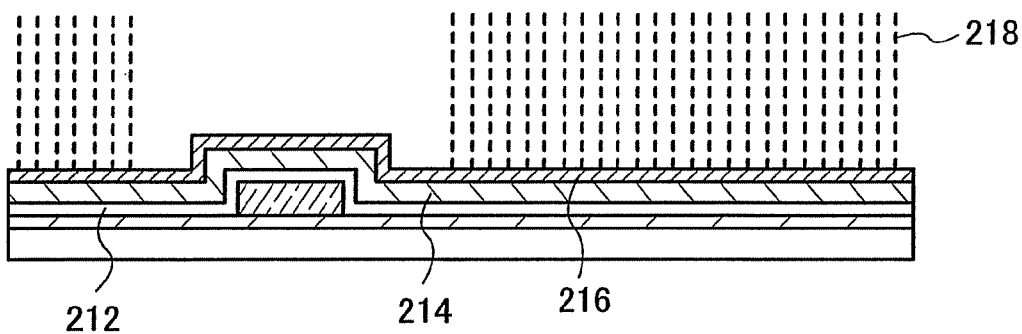

A gate insulating layer 212 is formed over the gate electrode layer 208, and a semiconductor layer is formed over the gate insulating layer 212 (FIG. 12C).

The gate insulating layer 212 is formed using an insulating material such as silicon oxide, silicon nitride, silicon oxynitride, silicon nitride oxide, or aluminum nitride by a CVD method, a sputtering method, or the like. The gate insulating layer 212 may have either a single-layer structure or a stacked structure. For example, the gate insulating layer 212 may have a single-layer structure of a silicon oxynitride layer or a two-layer structure of a silicon nitride layer and a silicon oxide layer. Alternatively, a stack structure of three or more layers including the materials may be used. Preferably, a silicon nitride layer, which is dense, may be used. In the case where the underlayer gate electrode layer 208 is formed using silver or copper by a droplet discharge method, the gate insulating layer 212 is preferably formed using silicon nitride or NiB. A film including silicon nitride or NiB has effects of preventing impurity diffusion and planarizing a surface. Note that a rare gas element such as argon may be included in a reaction gas when forming the gate insulating layer 212. When a rare gas element is included in a reaction gas, a dense insulating layer with low leakage current can be obtained at a low film formation temperature.

For the semiconductor layer, a stacked structure of a semiconductor layer 214 and a semiconductor layer 216 is formed. The semiconductor layer can be formed by using a crystalline semiconductor such as an amorphous semiconductor (hereinafter also referred to as "AS") formed by a vapor deposition method using a semiconductor source gas typified by silane or germane or a sputtering method, a polycrystalline semiconductor formed by crystallizing the amorphous semiconductor using light energy or thermal energy, or a semi-amorphous semiconductor (also referred to as microcrystal and hereinafter also referred to as "SAS"). The semiconductor layer can be formed by various methods (a sputtering method, an LPCVD method, a plasma CVD method, and the like).

An SAS is a semiconductor having an intermediate structure between amorphous and crystalline (including single crystalline and polycrystalline) structures and a third state which is stable in terms of free energy. Moreover, an SAS includes a crystalline region with a short-distance order and lattice distortion. A crystal region having a diameter of 0.5 to 20 nm can be observed at least in a portion of the film. In a case where silicon is contained as a main component, Raman spectrum is shifted to the low wave number side that is lower than 520 cm$^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and alternatively, $Si_2H_6$, $SiH_2Cl_2$, $SiHCl_3$, $SiCl_4$, $SiF_4$, or the like can also be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, the pressure is approximately 0.1 to 133 Pa, and the power source frequency is 1 to 120 MHz, and preferably 13 to 60 MHz. The temperature for heating the substrate is preferably less than or equal to 300° C., and an SAS can also be formed at 100 to 200° C. It is preferable that the concentration of impurities of atmospheric components such as oxygen, nitrogen, and carbon as impurity elements entering the film in forming the film be less than or equal to $1 \times 10^{20}$ cm$^{-3}$. In particular, the oxygen concentration is preferably less than or equal to $5 \times 10^{19}$ cm$^{-3}$, and more preferably less than or equal to $1 \times 10^{19}$ cm$^{-3}$. Further, when a rare gas element such as helium, argon, krypton, or neon is contained to further promote the lattice distortion, stability can be enhanced, and a favorable SAS can be obtained. Further, as the semiconductor layer, an SAS layer formed by using a hydrogen-based gas may be stacked over an SAS layer formed by using a fluorine-based gas.

As an example of a typical amorphous semiconductor, hydrogenated amorphous silicon can be given while polysilicon (polycrystalline silicon) or the like can be given as an example of a typical crystalline semiconductor. Polysilicon includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon formed by crystallization of amorphous silicon by using an element that promotes crystallization or the like, and the like. Of course, as described above, a semi-amorphous semiconductor or a semiconductor which includes a crystalline phase in a portion of the semiconductor layer can also be used.

When a crystalline semiconductor such as a polycrystalline semiconductor or a semi-amorphous semiconductor is used for the semiconductor layer, the semiconductor layer may be formed by various methods (a laser crystallization method, a thermal crystallization method, a thermal crystallization method using an element such as nickel, which promotes crystallization, and a method combining these methods). Further, a microcrystalline semiconductor that is an SAS may be crystallized by laser irradiation to enhance crystallinity. For example, in a case where silicon is used and an element which promotes crystallization is not added for forming a semiconductor layer, before the amorphous silicon layer is irradiated with a laser beam, the amorphous silicon layer is preferably heated at 700° C. for one hour in a nitrogen atmosphere to discharge hydrogen so that the hydrogen concentration in the amorphous silicon layer becomes less than or equal to $1 \times 10^{20}$ atoms/cm$^3$. This is because, if the amorphous silicon layer contains much hydrogen, the amorphous silicon layer may be broken by laser beam irradiation.

A method for introducing a metal element into the amorphous semiconductor layer is not particularly limited as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film on the surface of the amorphous semiconductor layer by UV light irradiation in an oxygen atmosphere, a thermal oxidation method, treatment with ozone water containing hydroxyl radical or a hydrogen peroxide solution, or the like, to improve wettability of the surface of the amorphous semiconductor layer and spread an aqueous solution over the entire surface of the amorphous semiconductor layer.

In order to crystallize the amorphous semiconductor layer, heat treatment may be combined with crystallization by laser beam irradiation, or one of heat treatment and laser beam irradiation may be carried out multiple times.

Alternatively, the crystalline semiconductor layer may be directly formed over the substrate by a plasma method. Furthermore, the crystalline semiconductor layer may be selectively formed over the substrate by a linear plasma method.

The semiconductor layer can be formed of an organic semiconductor material. As the organic semiconductor material, a low-molecular material, a high-molecular material, or the like can be used. In addition, a material such as a conductive high-molecular material can also be used. For example, a n-electron conjugated high-molecular material of which skeletal structure includes a conjugated double bond can be used and specifically, a soluble material such as polythiophene, polyfluorene, poly(3-alkylthiophene), a polythiophene derivative, or pentacene can be used. In addition, there is a material which can be used as the organic semiconductor material. In this case, the semiconductor layer can be formed by depositing a soluble precursor of the material and then performing treatment thereon. As the organic semiconductor material, polythienylenevinylene, poly(2,5-thienylenevinylene), polyacetylene, a polyacetylene derivative, polyallylenevinylene, or the like can be used.

The precursor is changed into the organic semiconductor not only by heat treatment but also by addition of a reaction catalyst such as a hydrogen chloride gas. Moreover, as a solvent for dissolving the soluble organic semiconductor material, for example, toluene, xylene, chlorobenzene, dichlorobenzene, anisole, chloroform, dichloromethane, γ-butyllactone, butylcellosolve, cyclohexane, N-methyl-2-pyrrolidone (NMP), cyclohexanone, 2-butanon, dioxane, dimethylformamide (DMF), tetrahydrofuran (THF), or the like can be used.

In this embodiment mode, amorphous semiconductor layers are formed for the semiconductor layer 214 and the semiconductor layer 216. As the semiconductor layer 216, an n-type semiconductor layer, which contains phosphorus (P) that is an impurity element imparting n-type conductivity, is formed. The semiconductor layer 216 functions as a source region and a drain region, and favorable ohmic contact between the semiconductor layer 214 and the conductive layer functioning as a source electrode or a drain electrode can be obtained. The semiconductor layer 216 may be formed according to need, and an n-type semiconductor layer containing an impurity element imparting n-type conductivity (P, As) or a p-type semiconductor layer containing an impurity element imparting p-type conductivity (B) can be formed.

The semiconductor layer 216 and the semiconductor layer 214 are selectively irradiated with a laser beam 218 (FIG. 12C).

As the laser beam 218, a laser beam having an energy or a wavelength that can be absorbed by the semiconductor layer 216 and the semiconductor layer 214 is appropriately selected. Note that a laser beam similar to the laser beam 106 described in Embodiment Mode 1 can be used as the laser beam 106. In addition, selective irradiation with the laser beam 218 can be conducted by using the laser irradiation apparatus as shown in FIG. 9 or FIG. 10, which is described in Embodiment Mode 1.

The laser beam 218 is absorbed by the semiconductor layer 216 and the semiconductor layer 214. The semiconductor layer 216 and the semiconductor layer 214 are removed by ablation due to irradiation with the laser beam 218. A region of the semiconductor layer 216 and the semiconductor layer 214, which is irradiated with the laser beam 218, is ablated to form a semiconductor layer 222 and a semiconductor layer 220 with a desired pattern (FIG. 12D).

An end portion of the semiconductor layer 222 and the semiconductor layer 220 may have a shape close to a perpendicular shape, or a tapered shape with a taper angle of 90° or less. Here, the semiconductor layer 222 and the semiconductor layer 220 are formed so as to have an end portion with a shape close to a perpendicular shape, by utilizing laser ablation.

Figure 12D:
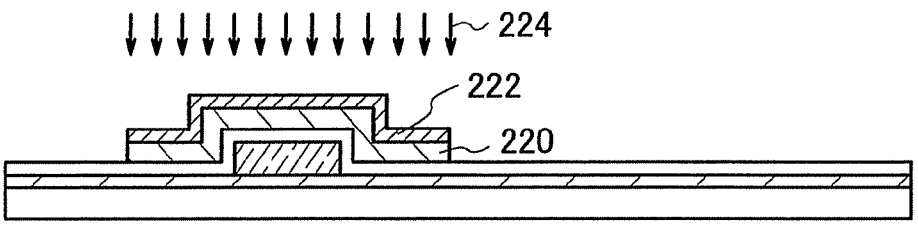

An impurity element imparting one conductivity type or an inert element 224 is added to the semiconductor layer 222 (FIG. 12D). As the impurity element or the inert element 224, an element similar to the impurity element or the inert element 110 described in Embodiment Mode 1 may be used to be added. Further, the concentration thereof is not particularly limited; however, the impurity element or the inert element 224 can be added at a concentration, for example, in a range from $1 \times 10^{15}$ atoms/cm$^3$ to $1 \times 10^{21}$ atoms/cm$^3$. By adding the impurity element or the inert element 224 to the semiconductor layer 222, the tensile stress of the semiconductor layer 222 can be reduced. In more detail, the tensile stress of the semiconductor layer 222 after ablation by irradiation with the laser beam 218 can be lower than that of the semiconductor 216 in the irradiation with the laser beam 218. Preferably, the semiconductor layer 222 is made to have a compressive stress. By making the semiconductor layer 222 have a lower tensile stress or have a compressive stress, generation of a defect such as film peeling of the semiconductor layer 222 can be prevented. When the semiconductor layer 222 is subjected to heat treatment in a later process, generation of film peeling or the like of the semiconductor layer 222 owing to the tensile stress can be prevented.

The semiconductor layer 222 may be formed in such a way that the semiconductor layer 216 having one conductivity type (n-type or p-type) in advance is formed and ablated with a laser beam. Alternatively, the semiconductor layer 216 to which an impurity element is not particularly added is laser-ablated to form the semiconductor layer 222, and an impurity element imparting one conductivity type (n-type or p-type) may be added to the semiconductor layer 222. At this time, in addition to the impurity element, an inert element may be added. Owing to the semiconductor layer 222 having one conductivity type, favorable ohmic contact between the semiconductor layer 220 for forming a channel and a conductive layer functioning as a source electrode or a drain electrode can be obtained.

The semiconductor layer 222 and the semiconductor layer 220 can also be formed by utilizing the separation layer described in Embodiment Mode 4. Specifically, a separation layer whose adhesiveness is decreased by absorption of a laser beam is formed on the semiconductor layer 216. The separation layer is selectively irradiated with a laser beam, so that the adhesiveness of a region of the separation layer, which is irradiated with the laser beam, is decreased. After removing the region with decreased adhesiveness of the separation layer, the semiconductor layer 216 and the semiconductor layer 214 are selectively etched using the separation layer as a mask, so that the semiconductor layer 222 and the semiconductor layer 220 can be formed. Note that after formation of the semiconductor layer 222 and the semiconductor layer 220, an impurity element imparting one conductivity type or an inert element may be added. The material, formation method, laser beam, and the like for the separation layer of Embodiment Mode 4 can be applied to those of the separation layer of this embodiment mode.

The semiconductor layer 222 and the semiconductor layer 220 may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. Using these methods, a desired layer can be selectively formed in a desired place. The semiconductor layer 222 and the semiconductor layer 220 may also be formed by forming a mask with the use of a photoresist over the semiconductor layer 216 and selectively etching the semiconductor layer 216 and the semiconductor layer 214 using the mask. In this case, it is not particularly necessary to add an impurity element or an inert element to the formed semiconductor layer.

Figure 13A:
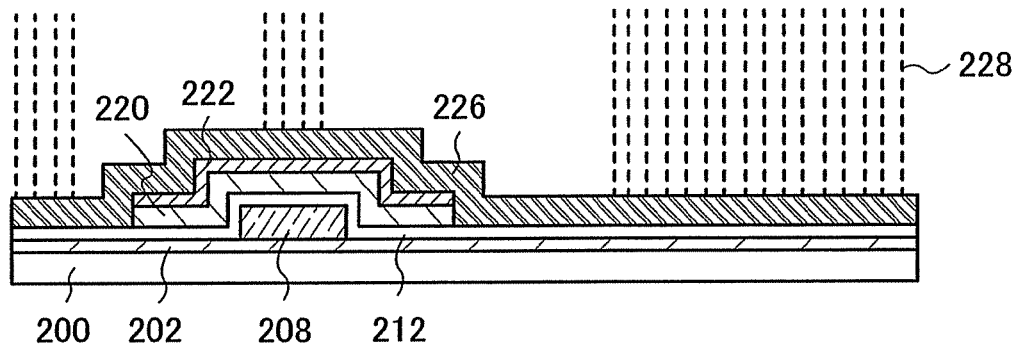
FIGS. 13A to 13C show an example of a manufacturing method of a semiconductor device according to the present invention.

A conductive layer 226 is formed over the semiconductor layer 222 (FIG. 13A).

The conductive layer 226 may be formed using a conductive material that absorbs a laser beam 228, and for example, a conductive material of a metal element such as tungsten (W), chromium (Cr), molybdenum (Mo), titanium (Ti), cobalt (Co), copper (Cu), aluminum (Al), silver (Ag), gold (Au), nickel (Ni), platinum (Pt), palladium (Pd), iridium (Ir), rhodium (Rh), or tantalum (Ta); an alloy material or a compound containing the element as its main component; or the like can be used. As the conductive layer 226, a layer having a tensile stress is preferably formed. In addition, the conductive layer 226 may have either a single-layer structure or a stacked structure.

The conductive layer 226 may be formed by a sputtering method, a physical vapor deposition (PVD) method, a chemical vapor deposition (CVD) method such as a low pressure CVD (LPCVD) method or a plasma CVD method, or the like.

The conductive layer 226 is selectively irradiated with the laser beam 228 (FIG. 13A).

As the laser beam 228, a laser beam having an energy or a wavelength that can be absorbed by the conductive layer 226 is appropriately selected. In more detail, a laser beam similar to the laser beam 106 described in Embodiment Mode 1 can be used. In addition, selective irradiation with the laser beam 228 can be conducted by using the laser irradiation apparatus as shown in FIG. 9 or FIG. 10, which is described in Embodiment Mode 1.

Figure 13B:
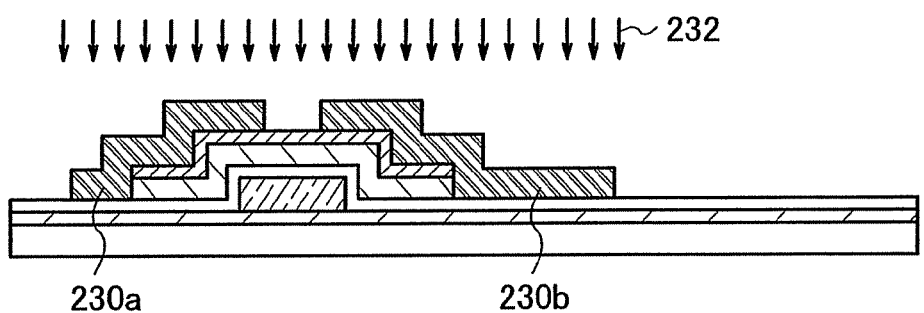

The laser beam 228 is absorbed by the conductive layer 226. The conductive layer 226 is ablated by irradiation with the laser beam 228. A region of the conductive layer 226, which is irradiated with the laser beam 228, is ablated to form a conductive layer 230a and a conductive layer 230b having a desired pattern shape, which serve as a source electrode layer and a drain electrode layer (FIG. 13B). At this time, by forming the layer having a tensile stress as the conductive layer 226, generation of burrs or the like at pattern end portions of the conductive layer 230a and the conductive layer 230b that are obtained by ablation can be suppressed; accordingly, a minute thin film pattern can be formed easily with accuracy.

Each end portion of the conductive layer 230a and the conductive layer 230b may have a shape close to a perpendicular shape, or a tapered shape with a taper angle of 90° or less. Here, the conductive layer 230a and the conductive layer 230b are formed so as to each have an end portion with a shape close to a perpendicular shape, by utilizing laser ablation.

An impurity element imparting one conductivity type or an inert element 232 is added to the conductive layer 230a and the conductive layer 230b (FIG. 13B). As the impurity element or the inert element 232, an element similar to the impurity element or the inert element 110 described in Embodiment Mode 1 may be used to be added. Further, the concentration thereof is not particularly limited; however, the impurity element or the inert element 232 can be added at a concentration, for example, in a range from $1\times10^{15}$ atoms/cm$^3$ to $1\times10^{21}$ atoms/cm$^3$. By adding the impurity element or the inert element 232 to the conductive layer 230a and the conductive layer 230b, the tensile stresses of the conductive layer 230a and the conductive layer 230b can be reduced. In more detail, the tensile stresses of the conductive layer 230a and the conductive layer 230b after ablation by irradiation with the laser beam 228 can be lower than that of the conductive layer 226 in the irradiation with the laser beam 228. Preferably, the conductive layer 230a and the conductive layer 230b are each made to have a compressive stress. By making each of the conductive layer 230a and the conductive layer 230b have a lower tensile stress or have a compressive stress, generation of a defect such as film peeling of the conductive layer 230a and the conductive layer 230b can be prevented. When the conductive layer 230a and the conductive layer 230b are subjected to heat treatment in a later process, generation of film peeling or the like of the conductive layer 230a and the conductive layer 230b owing to the tensile stress can be prevented.

The conductive layer 230a and the conductive layer 230b can also be formed by utilizing the separation layer described in Embodiment Mode 4. Specifically, a separation layer whose adhesiveness is decreased by absorption of a laser beam is formed on the conductive layer 226. The separation layer is selectively irradiated with a laser beam, so that the adhesiveness of a region of the separation layer, which is irradiated with the laser beam, is decreased. After removing the region with decreased adhesiveness of the separation layer, the conductive layer 226 is selectively etched using the separation layer as a mask, so that conductive layers serving as a source electrode and a drain electrode can be formed. Note that after formation of the conductive layers serving as a source electrode and a drain electrode, the separation layer that has served as the etching mask may be removed or may be left as part of an interlayer insulating layer. In addition, after formation of the conductive layers serving as a source electrode and a drain electrode, an impurity element imparting one conductivity type or an inert element may be added. The material, formation method, laser beam, and the like for the separation layer of Embodiment Mode 4 can be applied to those of the separation layer of this embodiment mode.

The conductive layer 230a and the conductive layer 230b serving as a source electrode and a drain electrode may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. By these methods, a conductive layer can be formed selectively in a desired place. The conductive layer 230a and the conductive layer 230b may be formed by forming a mask with the use of a photoresist over the conductive layer 226 and selectively etching the conductive layer 226 using the mask.

Figure 13C:
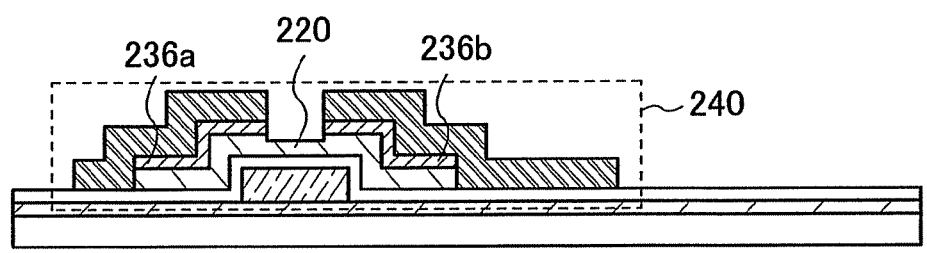

The semiconductor layer 222 having one conductivity type is selectively etched using the conductive layer 230a and the conductive layer 230b as masks, to expose the semiconductor layer 220 for forming a channel. The semiconductor layer 222 is separated into a semiconductor layer 236a having one conductivity type and a semiconductor layer 236b having one conductivity type (FIG. 13C). By selectively etching the semiconductor layer 222 having one conductivity type, the exposed part of the semiconductor layer 220, which is positioned below, is depressed than other portions of the semiconductor layer 220 in some cases.

The semiconductor layers 236a and 236b may be formed before forming the conductive layers 230a and 230b serving as a source electrode and a drain electrode, by forming a mask over the semiconductor layer using a photoresist and selectively etching the semiconductor layer using the mask.

Further, before forming the conductive layers 230a and 230b serving as a source electrode and a drain electrode, the semiconductor layers 236a and 236b may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. By these methods, a semiconductor layer can be formed selectively in a desired place.

Through the above-described process, a transistor 240, which is an inversely staggered transistor (also called a bottom-gate type transistor), can be manufactured.

Figure 14A:
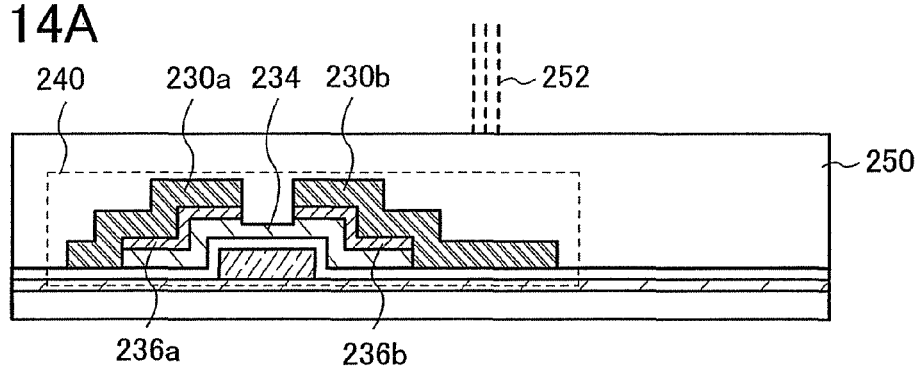
FIGS. 14A to 14D show an example of a manufacturing method of a semiconductor device according to the present invention.

Next, an insulating layer 250 is formed to cover the transistor 240 (FIG. 14A).

The insulating layer 250 is formed using an insulating material that can transmit a laser beam 252. As the insulating layer 250, a light-transmitting layer is preferably formed. For example, the insulating layer 250 is formed with a single-layer structure or a stacked structure including silicon oxide, silicon nitride, silicon oxynitride, aluminum oxide, aluminum nitride, aluminum oxynitride, diamond-like carbon (DLC), nitrogen-containing carbon (CN), polysilazane, or other inorganic insulating materials. A material containing siloxane may also be used. Further, an organic insulating material such as polyimide, an acrylic resin, polyamide, polyimide amide, resist, or benzocyclobutene can also be used. In addition, an oxazole resin can be used, and for example, photo-curable type polybenzoxazole or the like can be used. The insulating layer 250 may absorb part of the laser beam 252. The insulating layer 250 is preferably a layer having a tensile stress.

The insulating layer 250 can be formed by a sputtering method, a physical vapor deposition (PVD) method, a chemical vapor deposition (CVD) method such as a low pressure CVD (LPCVD) method or a plasma CVD method, a spin coating method, or the like.

Figure 14B:
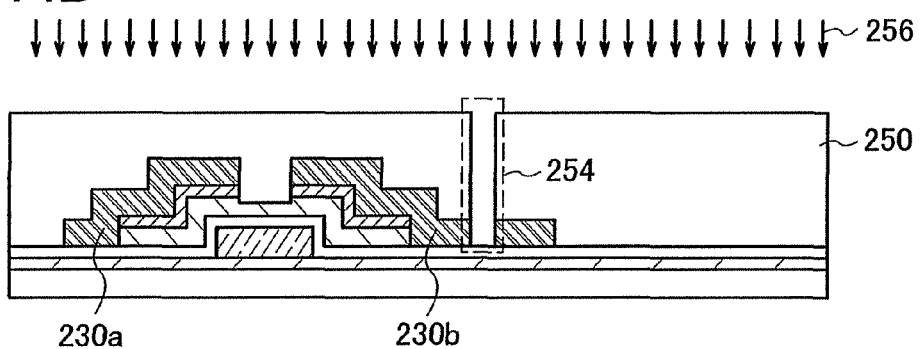

Then, selective irradiation with the laser beam 252 is conducted (FIG. 14A), and an opening 254 reaching the conductive layer 230b is formed in the insulating layer 250 (FIG. 14B).

In FIG. 14B, the opening 254 formed in the insulating layer 250 is formed by ablation using laser beam irradiation as described in Embodiment Mode 3. In more detail, selective irradiation with the laser beam 252 is conducted from the insulating layer 250 side, and part of the insulating layer 250 and the conductive layer 230b, which is a region irradiated with the laser beam 252, is ablated to form the opening 254. At this time, by forming a layer having a tensile stress as the insulating layer 250, generation of burrs or the like on a side surface of the opening 254 can be suppressed; accordingly, a minute opening pattern can be formed easily with accuracy.

As the laser beam 252, a laser beam having an energy or a wavelength that can be absorbed by the conductive layer 230b is appropriately selected. Note that a laser beam similar to the laser beam 106 described in Embodiment Mode 1 can be used as the laser beam 252. Preferably, a laser beam with a pulse width in a range of picoseconds ($10^{-12}$ seconds to $10^{-10}$ seconds) or in a range of femtoseconds ($10^{-15}$ seconds to $10^{-13}$ seconds) may be used. When such an ultrashort pulsed laser beam is used, the laser beam can be easily condensed in a minute region; accordingly, the ultrashort pulsed laser beam is advantageous to minute processing. Thus, a minute opening can be formed with accuracy, which is preferable.

The opening 254 may be formed so as to penetrate only the insulating layer 250 or so as to penetrate the insulating layer 250 and the conductive layer 230b. Further, an opening may be formed so as to penetrate the insulating layer 250 and reach an upper portion of the conductive layer 230b. The shape or the like of the opening 254 can be controlled by appropriately adjusting the energy or the like of the laser beam 252.

In the case where a light-transmitting substrate is used as the substrate 200 and the base insulating layer 202 and the gate insulating layer 212 are formed using light-transmitting materials, selective irradiation with the laser beam 252 from the substrate 200 side can be conducted for ablation, to form the opening 254. In this case, since the insulating layer 250 need not transmit the laser beam, the range of options for the material of the insulating layer 250 can be widened.

An impurity element imparting one conductivity type or an inert element 256 is added to the insulating layer 250 (FIG. 14B). As the impurity element or the inert element 256, an element similar to the impurity element or the inert element 110 described in Embodiment Mode 1 may be used to be added. Further, the concentration thereof is not particularly limited; however, the impurity element or the inert element 256 can be added at a concentration, for example, in a range from $1\times10^{15}$ atoms/cm$^3$ to $1\times10^{21}$ atoms/cm$^3$. By adding the impurity element or the inert element 256 to the insulating layer 250, the tensile stress of the insulating layer 250 can be reduced. In more detail, the tensile stress of the insulating layer 250 after formation of the opening 254 can be lower than that before the irradiation with the laser beam 252. After formation of the opening 254, the insulating layer 250 is preferably made to have a compressive stress. By making the insulating layer 250 after formation of the opening 254 have a lower tensile stress or have a compressive stress, generation of a defect such as film peeling of the insulating layer 250 can be prevented. When the insulating layer 250 is subjected to heat treatment in a later process, generation of film peeling or the like of the insulating layer 250 owing to the tensile stress can be prevented.

Further, the opening 254 may be formed by forming a mask over the insulating layer 250 using a photoresist and conducting selective etching with the use of the mask. Alternatively, the opening 254 may be formed by formation of a mask by a droplet discharge method and selective etching with the use of the mask.

Figure 15A:
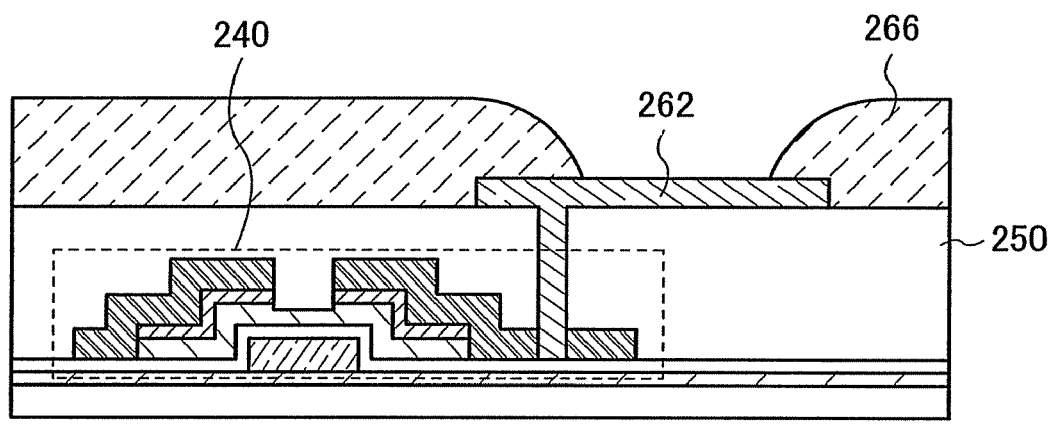
FIGS. 15A and 15B show an example of a manufacturing method of a semiconductor device according to the present invention.
Figure 15B:
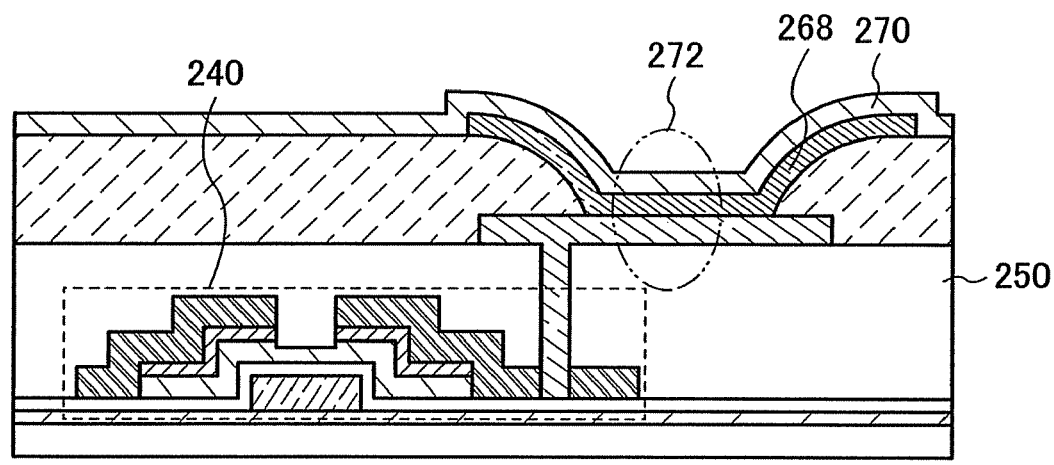

Next, a light emitting element 272 electrically connected to the transistor 240 is formed (FIG. 15B). As the light emitting element 272, an element which emits light of red (R), green (G), or blue (B) may be formed. Alternatively, an element which emits light of white (W) may be formed as the light emitting element 272 and combined with a color filter to obtain light of R, G or B. Hereinafter, a method for forming the light emitting element 272 will be described.

Figure 14C:
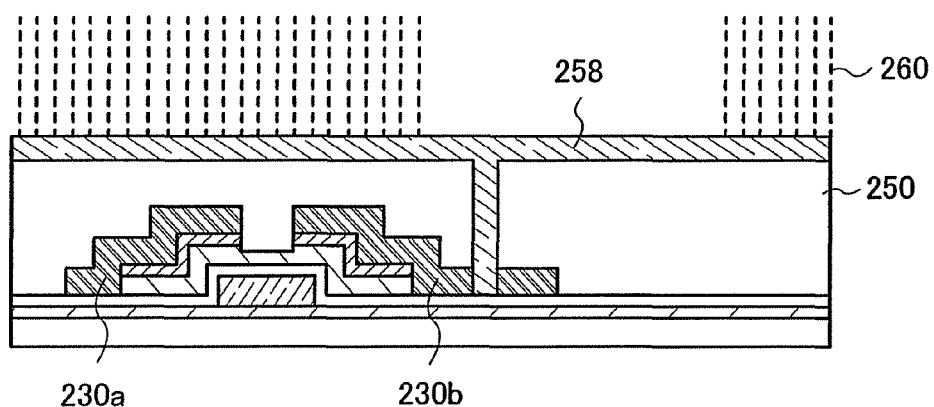

First, a conductive layer 258 is formed in the opening 254 and over the insulating layer 250 (FIG. 14C).

The conductive layer 258 may be formed using a conductive material that absorbs a laser beam 260, and a conductive material such as indium tin oxide (ITO), indium tin oxide containing silicon oxide (ITSO), or zinc oxide can be used. For example, a film of indium tin oxide containing silicon oxide (ITSO) can be formed by a sputtering method using a target of ITO containing silicon oxide at 2 wt % to 10 wt %. Alternatively, a conductive material obtained by doping zinc oxide with gallium (Ga), or indium zinc oxide (IZO) that is an oxide conductive material formed by using a target in which indium oxide containing silicon oxide is mixed with zinc oxide at 2 wt % to 20 wt % may also be used. Further, a layer having a tensile stress is preferably formed as the conductive layer 258.

The conductive layer 258 may be formed by a sputtering method, a physical vapor deposition (PVD) method, a chemical vapor deposition (CVD) method such as a low pressure CVD (LPCVD) method or a plasma CVD method, or the like.

The conductive layer 258 is selectively irradiated with the laser beam 260 (FIG. 14C).

As the laser beam 260, a laser beam having an energy or a wavelength that can be absorbed by the conductive layer 258 is appropriately selected. In more detail, a laser beam similar to the laser beam 106 described in Embodiment Mode 1 can be used. In addition, selective irradiation with the laser beam 260 can be conducted by using the laser irradiation apparatus as shown in FIG. 9 or FIG. 10, which is described in Embodiment Mode 1.

Figure 14D:
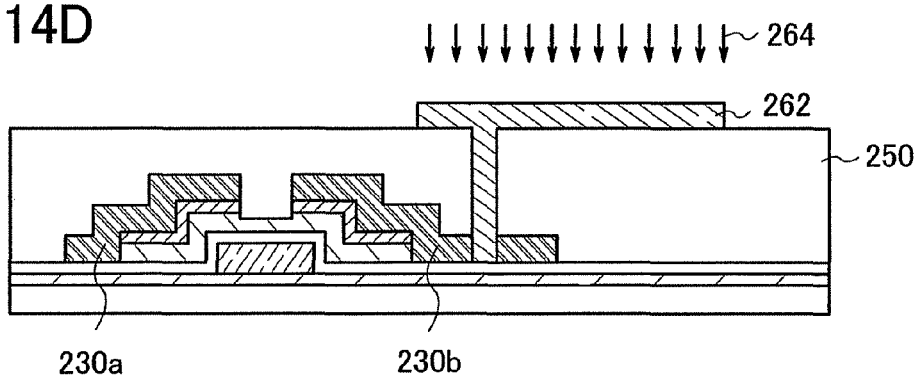

The laser beam 260 is absorbed by the conductive layer 258. The conductive layer 258 is ablated by irradiation with the laser beam 260. A region of the conductive layer 258, which is irradiated with the laser beam 260, is ablated to form a first electrode layer 262 having a desired pattern shape. The first electrode layer 262 is electrically connected to the conductive layer 230b serving as a source electrode or a drain electrode through the opening 254 formed in the insulating layer 250 (FIG. 14D). The first electrode layer 262 serves as a pixel electrode. By forming a layer having a tensile stress as the conductive layer 258, generation of burrs or the like at a pattern end portion of the first electrode layer 262 that is obtained by ablation can be suppressed; accordingly, a minute thin film pattern can be formed easily with accuracy.

An impurity element imparting one conductivity type or an inert element 264 is added to the first electrode layer 262 (FIG. 14D). As the impurity element or the inert element 264, an element similar to the impurity element or the inert element 110 described in Embodiment Mode 1 may be used to be added. By adding the impurity element or the inert element 264 to the first electrode layer 262 in this manner, the tensile stress of the first electrode layer 262 can be reduced. In more detail, the tensile stress of the first electrode layer 262 can be lower than that of the conductive layer 258 in the irradiation with the laser beam 260. Preferably, the first electrode layer 262 is made to have a compressive stress. By making the first electrode layer 262 have a lower tensile stress or have a compressive stress, generation of a defect such as film peeling of the first electrode layer 262 can be prevented. When the first electrode layer 262 is subjected to heat treatment in a later process, generation of film peeling or the like of the first electrode layer 262 owing to the tensile stress can be prevented.

The first electrode layer 262 can also be formed by utilizing the separation layer described in Embodiment Mode 4. Specifically, a separation layer whose adhesiveness is decreased by absorption of a laser beam is formed on the conductive layer 258. The separation layer is selectively irradiated with a laser beam, so that the adhesiveness of a region of the separation layer, which is irradiated with the laser beam, is decreased. After removing the region with decreased adhesiveness of the separation layer, the conductive layer 258 is selectively etched using the separation layer as a mask, so that the first electrode layer serving as a pixel electrode can be formed. Note that after formation of the first electrode layer, the separation layer that has served as the etching mask is removed. In addition, after formation of the first electrode layer, an impurity element imparting one conductivity type or an inert element may be added. The material, formation method, laser beam, and the like for the separation layer of Embodiment Mode 4 can be applied to those of the separation layer of this embodiment mode.

The first electrode layer 262 can be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. Using these methods, a conductive layer can be selectively formed in a desired place. The first electrode layer 262 may also be formed by forming a mask with the use of a photoresist over the conductive layer 258 and selectively etching the conductive layer 258 using the mask.

The first electrode layer 262 may be cleaned or polished by a CMP method or with the use of a polyvinyl alcohol based porous material so that the surface thereof is planarized. In addition, after polishing using a CMP method, ultraviolet ray irradiation, oxygen plasma treatment, or the like may be performed on the surface of the first electrode layer 262.

Next, a partition layer 266 is formed so as to have an opening over the first electrode layer 262 (FIG. 15A). The partition layer 266 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds which are formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used.

The partition layer 266 can be selectively formed using a droplet discharge method, a printing method, a disperser method, or the like. Alternatively, the partition layer may be formed over the entire surface using an insulating material, a resist mask or the like may be formed using a lithography process, and the partition layer may be etched to form the partition layer 266 having a desired shape. Further alternatively, the partition layer 266 having a desired shape can also be formed by the steps of forming the partition layer over the entire surface using a photosensitive material and exposing the partition layer formed of the photosensitive material to light to develop it. It is preferable that the partition layer 266 have a shape of which a radius of curvature continuously changes. By such a shape of the partition layer, coverage by a layer 268 and a second electrode layer 270 to be formed thereover is improved.

After the partition layer 266 is formed by a droplet discharge method, its surface may be planarized by being pressed with pressure to enhance a level of planarity. As a pressing method, unevenness of the surface may be reduced by scanning the surface by a roller-shaped object, or the surface may be pressed perpendicularly by a flat plate-shaped object. Alternatively, surface unevenness may be removed with an air knife after the surface is softened or melted with a solvent or the like. A CMP method may also be used for polishing the surface. This process can be employed for planarizing the surface when the surface becomes uneven by a droplet discharge method. When the level of planarity is enhanced by this process, display unevenness of the display device can be prevented, and thus, a high definition image can be displayed.

Next, the layer 268 and the second electrode layer 270 are stacked over the first electrode layer 262 and the partition layer 266. In the above-described manner, the light emitting element 272 having a structure in which the layer 268 is interposed between the first electrode layer 262 and the second electrode layer 270 is obtained (FIG. 15B). The layer 268 includes at least a layer containing a light emitting material by which a desired emission wavelength can be obtained (hereinafter also referred to as a light emitting layer). Specifically, the layer 268 includes a layer containing an organic compound, an inorganic compound, or both organic and inorganic compounds.

Through the above process, a display device including the light emitting element 272 can be obtained.

By the present invention, a layer having a desired pattern shape can be formed without using a lithography process that uses a photoresist. Therefore, the lithography process can be reduced or simplified; loss of a material such as a resist material or a developer can be prevented; and the number of photomasks that are necessary can be reduced. By controlling the stress of a process layer before and after ablation by laser beam irradiation, thin film processing can be conducted with accuracy and generation of a defect in a thin film pattern after processing can be prevented. Therefore, a display device with high reliability can be realized with high yield. In addition, throughput can be improved.

This embodiment mode can be freely combined with any of other embodiment modes described in this specification.

Embodiment Mode 6

A structure of a display panel according to the present invention will be described in this embodiment mode.

Figure 16A:
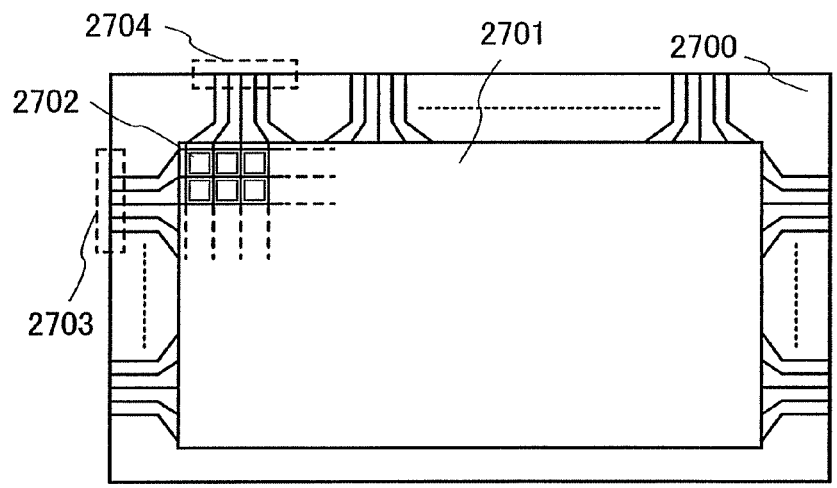
FIGS. 16A to 16C are top views of display devices according to the present invention.

FIG. 16A is a top view showing a structure of a display panel according to the present invention. A pixel portion 2701 in which pixels 2702 are arranged in a matrix, a scanning line input terminal 2703, and a signal line input terminal 2704 are formed over a substrate 2700 having an insulating surface. The number of pixels may be determined in accordance with various standards. In the case of XGA full-color display using RGB, the number of pixels may be 1024×768×3 (RGB). In the case of UXGA full-color display using RGB, the number of pixels may be 1600×1200×3 (RGB), and in the case of full-spec, high-definition, and full-color display using RGB, the number of pixels may be 1920×0.1080×3 (RGB).

The pixels 2702 are arranged in a matrix by intersections of scanning lines extended from the scanning line input terminal 2703 and signal lines extended from the signal line input terminal 2704. Each pixel 2702 is provided with a switching element and a pixel electrode connected to the switching element. A typical example of the switching element is a transistor. A gate electrode side of the transistor is connected to the scanning line, and a source or drain electrode side of the transistor is connected to the signal line, which enables each pixel to be independently controlled by a signal input from an external portion.

Figure 17A:
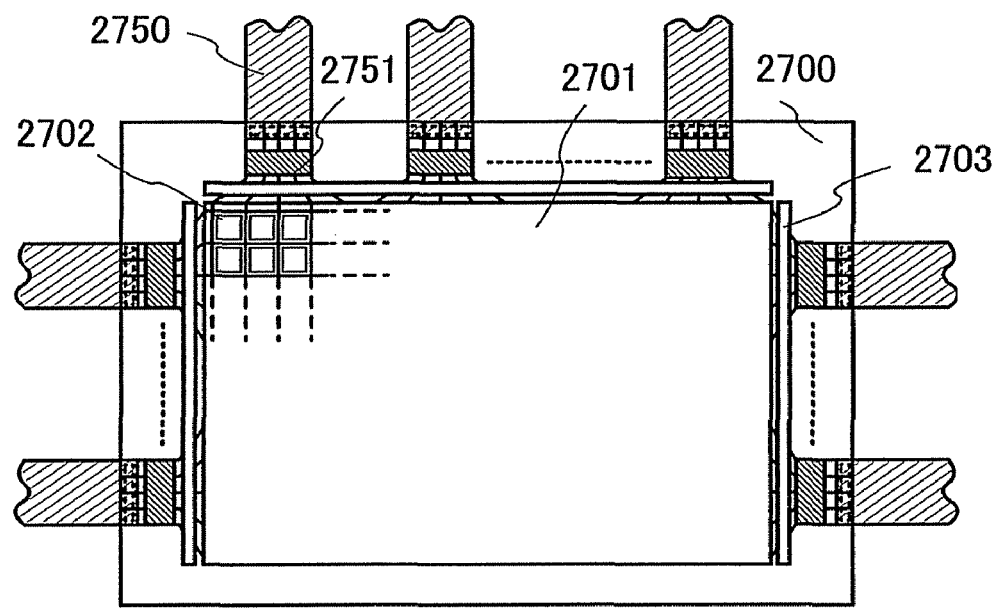
FIGS. 17A and 17B are top views of display devices according to the present invention.
Figure 17B:
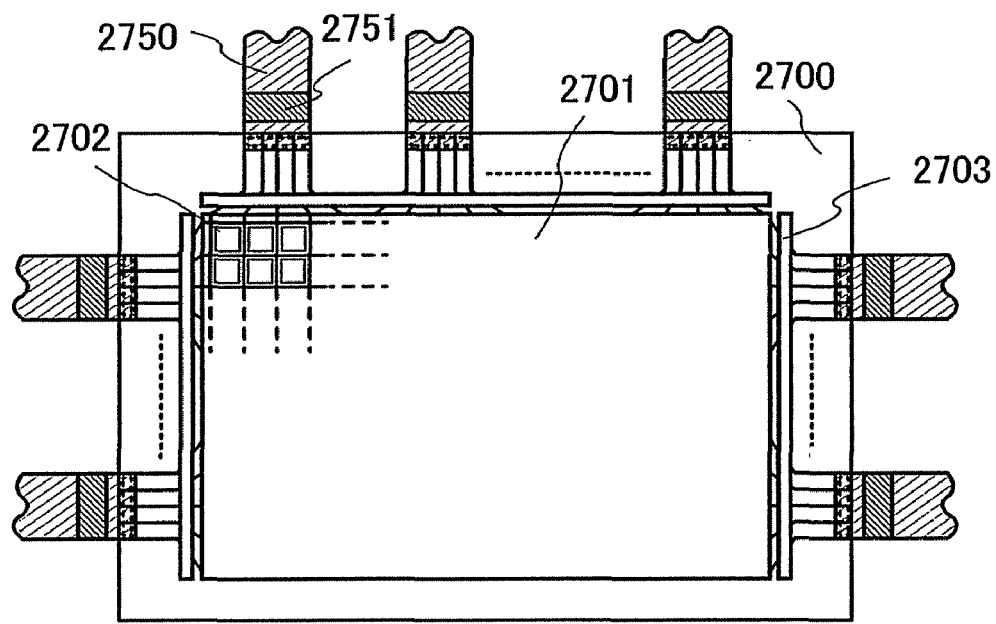

FIG. 16A shows a structure of a display device in which a signal to be input to the scanning line and the signal line is controlled by an external driver circuit. Alternatively, a driver IC 2751 may be mounted on the substrate 2700 by a COG (Chip on Glass) method as shown in FIG. 17A. As another mounting mode, a TAB (Tape Automated Bonding) method may be used as shown in FIG. 17B. The driver IC may be formed using a single crystalline semiconductor substrate or may be formed using a transistor over a glass substrate. In each of FIGS. 17A and 17B, the driver IC 2751 is connected to an FPC (Flexible Printed Circuit) 2750.

Figure 16B:
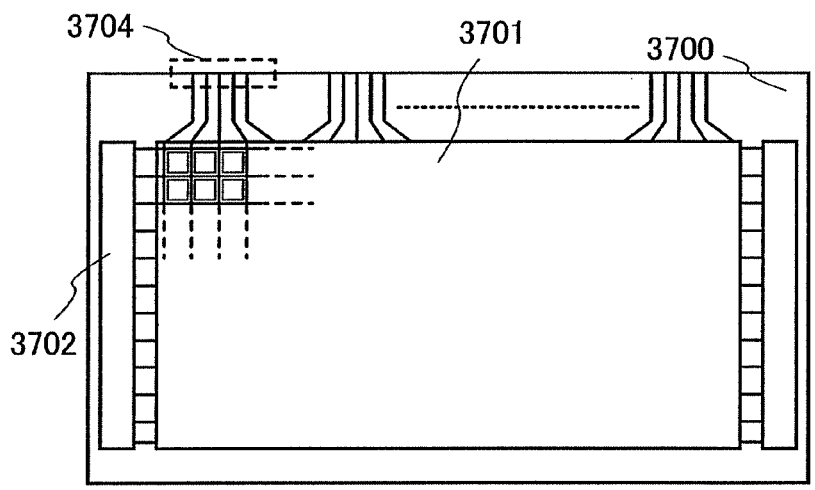
Figure 16C:
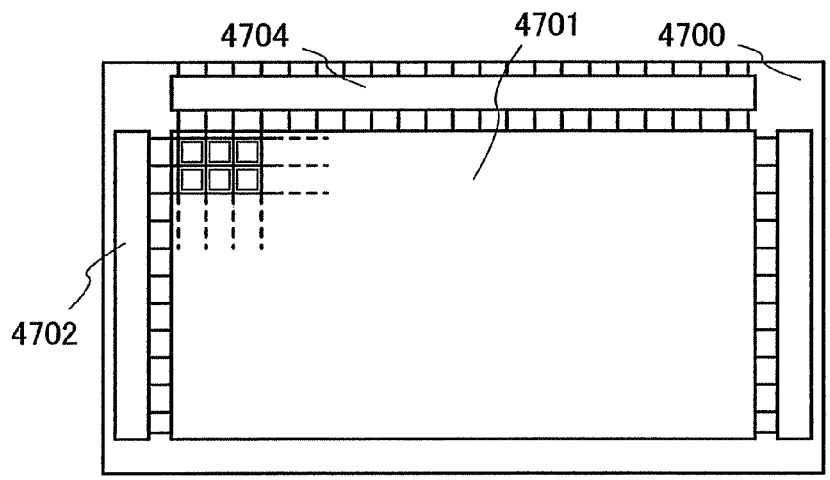

When a transistor provided in a pixel is formed of a polycrystalline (microcrystalline) semiconductor with high crystallinity, a scanning line driver circuit 3702 can be formed over a substrate 3700 as shown in FIG. 16B. In FIG. 16B, reference numeral 3701 denotes a pixel portion, and a signal line driver circuit is controlled by an external driver circuit, similarly to FIG. 16A. When the transistor provided in a pixel is formed of a polycrystalline (microcrystalline) semiconductor, a single crystalline semiconductor, or the like having high mobility, a scanning line driver circuit 4702 and a signal line driver circuit 4704 can all be formed over a substrate 4700 as shown in FIG. 16C.

In this embodiment mode, a thin film processing method of the present invention as described in Embodiment Modes 1 to 5, which utilizes laser beam irradiation and the stress of a processing thin film, can be applied to formation of a pattern of a conductive layer or a semiconductor layer for forming a switching element, formation of an opening for obtaining electric connection, and the like. By employing the present invention, the lithography process that uses a photoresist can be reduced and simplified, and thin film processing can be conducted with accuracy. Accordingly, manufacturing cost in manufacturing a display panel can be reduced and yield can be improved.

This embodiment mode can be appropriately combined with any of other embodiment modes described in this specification.

Embodiment Mode 7

In Embodiment Mode 7, an example of a display device according to the present invention will be described with reference to FIGS. 27A and 27B.

FIG. 27A shows a top schematic view of a display device shown in this embodiment mode. In addition, FIG. 27B shows a cross-sectional view of FIG. 27A along a line Q-R.

A display device 900 shown in FIGS. 27A and 27B includes, over a substrate 901, a pixel portion 902 and a driver circuit portion 904. A sealing substrate 908 is provided over the substrate 901 with a sealant 910 interposed therebetween. Moreover, a terminal portion 906 is provided over the substrate 901. Signals and power source potentials for controlling operations of plural elements included in the pixel portion 902 are inputted from an external portion through the terminal portion 906.

The pixel portion 902 is provided with a light emitting element 930, a driving transistor 924, a switching transistor 922, and a capacitor element 920. In the light emitting element 930, at least a layer including a light emitting layer is interposed between a pair of electrode layers. The light emitting element 930 is electrically connected to the driving transistor 924.

Edge portions of an electrode layer in a lower layer of the light emitting element 930 (the electrode layer electrically connected to the driving transistor 924) are covered with a partition layer 918. The partition layer 918 is formed of an inorganic insulating material such as silicon oxide or silicon nitride; an organic insulating material such as acrylic, polyimide, or resist; a siloxane material; or the like. The partition layer 918 can separate light emitting elements provided adjacent to each other. When the partition layer 918 has an edge portion with a rounded shape of which a radius of curvature continuously changes as shown in this embodiment mode, coverage by a film stacked thereover is improved, which is preferable.

The driver circuit portion 904 is provided with a plurality of transistors 926, which form a driver circuit for controlling operation of the pixel portion 902. The driver circuit portion 904 is provided with, for example, a shift register, a decoder, a buffer, a sampling circuit, a latch, and the like.

The substrate 901 and the sealing substrate 908 are attached to each other with the sealant 910 interposed therebetween so as to seal the pixel portion 902 and the driver circuit portion 904. The sealing substrate 908 is provided with a color filter 942 and a light-blocking layer 944. The present invention is not particularly limited thereto, and the color filter 942 or the light-blocking layer 944 may also be omitted.

This embodiment mode and Embodiment Mode 5 are greatly different in that a gate electrode layer of the transistor is provided below or over the semiconductor layer. Other structures of this embodiment mode are based on those in Embodiment Mode 5.

Next, an example of a specific manufacturing method will be described.

As a base insulating layer over a substrate 901, a base insulating layer 903a is formed using silicon nitride oxide with a thickness of 10 nm to 200 nm (preferably 50 nm to 150 nm), and a base insulating layer 903b is formed thereover using silicon oxynitride with a thickness of 50 nm to 200 nm (preferably 100 nm to 150 nm), by a sputtering method, a PVD (physical vapor deposition) method, a CVD (chemical vapor deposition) method such as a low-pressure CVD (LPCVD) method or a plasma CVD method, or the like. Alternatively, an acrylic acid, a methacrylic acid, or a derivative thereof; a heat-resistant high molecular material such as polyimide, aromatic polyamide, or polybenzimidazole; or a siloxane resin may be used. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, photo-curing polybenzoxazole or the like can be used.

A droplet discharge method, a printing method (a method for forming a pattern such as screen printing or offset printing), a coating method such as a spin coating method, a dipping method, a dispenser method, or the like can also be used. In this embodiment mode, the base insulating layers 903a and 903b are formed by a plasma CVD method. As the substrate 901, a glass substrate, a quartz substrate, a silicon substrate, a metal substrate, or a stainless steel substrate provided with an insulating layer on the surface may be used. In addition, a plastic substrate having heat resistance sufficient to withstand the process temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used.

The base insulating layer can be formed using silicon oxide, silicon nitride, silicon oxynitride, silicon nitride oxide, or the like and may have either a single-layer structure or a stacked structure such as a two-layer structure or a three-layer structure.

Next, a semiconductor layer is formed over the base insulating layer. The semiconductor layer may be formed with a thickness of 10 nm to 200 nm (preferably, 30 nm to 150 nm) by any of various methods (such as a sputtering method, an LPCVD method, or a plasma CVD method). In this embodiment mode, it is preferable to use a crystalline semiconductor layer which is obtained by crystallizing an amorphous semiconductor layer with a laser beam.

The semiconductor layer obtained in this manner may be doped with a slight amount of an impurity element (boron or phosphorus) to control a threshold voltage of a transistor. This doping with an impurity element may be performed to a semiconductor layer after crystallization or to the amorphous semiconductor layer before the crystallization step. When the doping with an impurity element is performed to the amorphous semiconductor layer, activation of the impurity element can be performed by heat treatment which will be performed later for crystallization. In addition, defects and the like caused by doping can be improved.

The semiconductor layer may be selectively etched to be processed into a desired shape. Alternatively, using various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like, the semiconductor layer may be selectively formed in a desired place.

In addition, the semiconductor layer can be processed into a desired pattern shape by utilizing laser ablation described in Embodiment Modes 1 and 2. Specifically, the semiconductor layer is selectively irradiated with a laser beam that is absorbed by the semiconductor layer. A region of the semiconductor layer, which is irradiated with the laser beam, is ablated, so that a semiconductor layer having a desired pattern shape is formed.

The semiconductor layer can be formed by utilizing the separation layer described in Embodiment Mode 4. Specifically, a separation layer whose adhesiveness is decreased by absorption of a laser beam is formed on the semiconductor layer. The separation layer is selectively irradiated with a laser beam, so that the adhesiveness of a region of the separation layer, which is irradiated with the laser beam, is decreased. After removing the region with decreased adhesiveness of the separation layer, the semiconductor layer is selectively etched using the separation layer as a mask, so that the semiconductor layer can be processed into a desired shape. After formation of the semiconductor layer with a desired shape, the separation layer may be removed or may be left as part of a gate insulating layer. In the case of using a separation layer, it is preferable that the separation layer having a tensile stress before laser beam irradiation is formed, and an impurity element imparting one conductivity type or an inert element is added after removing part of the separation layer, to make the separation layer have a compressive stress. By controlling the stress before and after laser beam irradiation, the region irradiated with the laser beam can be easily removed, and further, a defect such as film peeling of a remaining part of the separation layer in a later process can be prevented.

Note that a lower electrode layer forming a capacitor element is also formed in the same process as that of the semiconductor layer. The lower electrode layer is formed in the same layer as the semiconductor layer forming the transistor.

A gate insulating layer is formed to cover the semiconductor layer. The gate insulating layer is formed using an insulating layer containing silicon with a thickness of 10 nm to 150 nm by a plasma CVD method, a sputtering method, or the like. The gate insulating layer may be formed using an inorganic insulating material such as silicon nitride, silicon oxide, silicon oxynitride, or silicon nitride oxide with a single-layer structure or a stacked structure. The gate insulating layer may be formed to have a three-layer structure of a silicon nitride layer, a silicon oxide layer, and a silicon nitride layer Alternatively, a single layer or a two-layer structure of a silicon oxynitride layer may be used.

Next, a gate electrode layer is formed over the gate insulating layer. The gate electrode layer can be formed by the steps of forming a conductive layer by a sputtering method, an evaporation method, a CVD method, or the like and selectively etching the conductive layer Alternatively, using various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like, the gate electrode layer may be selectively formed in a desired place. The gate electrode layer may be formed using an element such as tantalum (Ta), tungsten (W), titanium (Ti), molybdenum (Mo), aluminum (Al), copper, (Cu), chromium (Cr), or neodymium (Nd), or an alloy material or a compound material containing the above element as its main component. Alternatively, the gate electrode layer may be formed using a semiconductor layer typified by a polycrystalline silicon layer doped with an impurity element such as phosphorus, or an AgPdCu alloy. The gate electrode layer may have a single-layer structure or a stacked layer structure. At this time, an upper electrode layer of a capacitor element completed later is also formed. The upper electrode layer is formed using the same material as that of the gate electrode layer.

In addition, the gate electrode layer can be processed into a desired pattern shape by utilizing laser ablation described in Embodiment Modes 1 and 2. Specifically, the conductive layer that forms the gate electrode layer is selectively irradiated with a laser beam that is absorbed by the conductive layer. A region of the conductive layer, which is irradiated with the laser beam, is ablated, so that a gate electrode layer having a desired pattern shape is formed.

The gate electrode layer can be formed by utilizing the separation layer described in Embodiment Mode 4. Specifically, a separation layer whose adhesiveness is decreased by absorption of a laser beam is formed on the conductive layer that forms the gate electrode layer. The separation layer is selectively irradiated with a laser beam, so that the adhesiveness of a region of the separation layer, which is irradiated with the laser beam, is decreased. After removing the region with decreased adhesiveness of the separation layer, the conductive layer is selectively etched using the separation layer as a mask, so that the gate electrode layer with a desired shape can be formed. After formation of the gate electrode layer, the separation layer may be removed or may be left as part of an interlayer insulating layer.

In the case of forming a gate electrode layer by utilizing laser beam ablation or decrease in adhesiveness of the separation layer, it is preferable that a conductive layer having a tensile stress before laser beam irradiation is formed, and an impurity element imparting one conductivity type or an inert element is added after formation of the gate electrode layer, to make the conductive layer have a compressive stress. By controlling the stress before and after laser beam irradiation, the region irradiated with the laser beam can be easily removed. Further, generation of burrs or the like at an end portion of a formed thin film pattern can be suppressed, and a minute thin film pattern can be easily formed with accuracy. Moreover, in a process after formation of the gate electrode layer, a defect such as film peeling of the gate electrode layer can be prevented. In the case where the separation layer is left, the stress of the separation layer is preferably controlled together with that of the conductive layer that forms the gate electrode layer.

The gate electrode layer is formed to have a tapered side surface in this embodiment mode. The gate electrode layer can be formed to have a tapered shape by using a wet etching method for an etching step. Alternatively, a wet etching method may be sequentially performed after a dry etching method. The gate electrode layer having a perpendicular side surface may be formed. Further, the gate electrode layer may have a two-layer structure in which the layers have different taper angles. When the gate electrode layer has a tapered side surface, the coverage thereof by a layer to be stacked thereover can be improved.

There is a case where the gate insulating layer is etched to some extent by etching in forming the gate electrode layer, and the thickness thereof is reduced (so-called film reduction).

An impurity element imparting one conductivity type is added to the semiconductor layer to form a pair of impurity regions. The impurity region formed in the semiconductor layer functions as a source region or a drain region. As the impurity element to be added, an impurity element which imparts n-type conductivity or an impurity element which imparts p-type conductivity may be appropriately selected. As the impurity element imparting n-type conductivity, phosphorus (P), arsenic (As), or the like can be used. As the impurity element imparting p-type conductivity, boron (B), aluminum (Al), gallium (Ga), or the like can be used. At this time, a channel formation region is formed between a pair of impurity regions.

It is to be noted that, in the semiconductor layer, an impurity region called an LDD (Light Doped Drain) region may be formed between the impurity region functioning as a source region or a drain region and the channel formation region. The LDD region is an impurity region with a lower concentration than that of a source region or a drain region. The LDD region may overlap with the gate electrode layer or may not overlap with the gate electrode layer.

In the case of forming a semiconductor layer or a gate electrode layer by utilizing ablation by laser beam irradiation or decrease in adhesiveness of a separation layer, the stress of the semiconductor layer or the gate electrode layer can be controlled by utilizing addition of an impurity element that is for forming an impurity region functioning as a source region or a drain region in the semiconductor layer. In more detail, after forming the semiconductor layer or the gate electrode layer using a layer having a tensile stress, an impurity element is added for forming an impurity region functioning as a source region or a drain region in the semiconductor layer, so that the semiconductor layer or the gate electrode layer can become a layer having a compressive stress.

Heat treatment, intense light irradiation, or laser beam irradiation may be performed to activate the impurity element, which is added to the semiconductor layer. At the same time as the activation, plasma damage to the gate insulating layer and the interface between the gate insulating layer and the semiconductor layer can be repaired.

Then, a first interlayer insulating layer is formed to cover the gate electrode layer and the gate insulating layer. In this embodiment mode, the first interlayer insulating layer has a stacked structure of insulating layers 913 and 914. The insulating layers 913 and 914 can be formed using a silicon nitride layer, a silicon nitride oxide layer, a silicon oxynitride layer, a silicon oxide layer, or the like by a sputtering method or a plasma CVD method, or another insulating layer containing silicon may be used as a single-layer structure or a stacked structure including three or more layers.

In addition, heat treatment is performed in a nitrogen atmosphere at equal to or more than 300° C. to equal to or less than 550° C. for 1 to 12 hours, to hydrogenate the semiconductor layer. Preferably, it is performed at equal to or more than 400° C. to equal to or less than 500° C. This step is a step of terminating dangling bonds of the semiconductor layer with hydrogen which is contained in the insulating layer 913 that is the interlayer insulating layer. In this embodiment mode, heat treatment is performed at 410° C.

The insulating layers 913 and 914 can be formed using a material such as aluminum nitride, aluminum oxynitride, aluminum nitride oxide having a higher content of nitrogen than that of oxygen, aluminum oxide, diamond-like carbon (DLC), nitrogen-containing carbon (CN), polysilazane, or other substances including an inorganic insulating material. Alternatively, a material containing siloxane may be used. An organic insulating material may also be used, and polyimide, acrylic, polyamide, polyimide amide, resist, or benzocyclobutene can be used. Moreover, an oxazole resin can be used, and for example, photo-curing polybenzoxazole or the like can be used.

Next, an opening is formed in the insulating layers 913 and 914 and the gate insulating layer so as to reach the source region or the drain region.

The opening can be formed by utilizing ablation by laser beam irradiation, as described in Embodiment Mode 3. Selective irradiation with a laser beam that is absorbed by the semiconductor layer is conducted to ablate part of the gate insulating layer, the insulating layer 913, and the insulating layer 914, so that an opening reaching the semiconductor layer is formed. The description of the laser beam in Embodiment Modes 1 to 5 can be applied to the detail of the types of applicable laser beams and the like. In the case of forming an opening by utilizing laser ablation, it is preferable that a layer having a tensile stress at the time of film formation (before laser beam irradiation) is formed as each of the insulating layers 913 and 914 and the layer is made to have a compressive stress after formation of the opening. By adding an impurity element imparting one conductivity type or an inert element to the insulating layers 913 and 914 after formation of the opening, the insulating layers 913 and 914 can each become a layer having a compressive stress.

Of course, the opening reaching the source region or the drain region of the semiconductor layer may also be formed by formation of a mask layer using a photoresist and etching using the mask layer.

A source electrode layer or a drain electrode layer is formed in the opening that reaches the source region or the drain region of the semiconductor layer. The source region or the drain region of the semiconductor layer can be electrically connected to the source electrode layer or the drain electrode layer.

The source electrode layer or the drain electrode layer can be formed by the steps of forming a conductive layer by a PVD method, a CVD method, an evaporation method, or the like and then selectively etching the conductive layer. The source electrode layer or the drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or an alloy material or a metal nitride containing the element as its main component. In addition, the source electrode layer or the drain electrode layer may have a single-layer structure or a stacked structure.

Alternatively, the source electrode layer or the drain electrode layer may also be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place. It is to be noted that a terminal electrode layer 950 of the terminal portion 906 is also formed in forming the source electrode layer or the drain electrode layer.

In addition, the source electrode layer or the drain electrode layer can be processed into a desired pattern shape by utilizing laser ablation described in Embodiment Modes 1 and 2. Specifically, the conductive layer that forms the source electrode layer or the drain electrode layer is selectively irradiated with a laser beam that is absorbed by the conductive layer. A region of the conductive layer, which is irradiated with the laser beam, is ablated, so that a source electrode layer or a drain electrode layer having a desired pattern shape is formed.

The source electrode layer or the drain electrode layer can be formed by utilizing the separation layer described in Embodiment Mode 4. Specifically, a separation layer whose adhesiveness is decreased by absorption of a laser beam is formed on the conductive layer that forms the source electrode layer or the drain electrode layer. The separation layer is selectively irradiated with a laser beam, so that the adhesiveness of a region of the separation layer, which is irradiated with the laser beam, is decreased. After removing the region with decreased adhesiveness of the separation layer, the conductive layer is selectively etched using the separation layer as a mask, so that the source electrode layer or the drain electrode layer with a desired shape can be formed. After formation of the source electrode layer or the drain electrode layer, the separation layer may be removed or may be left as part of an interlayer insulating layer.

In the case of forming a source electrode layer or a drain electrode layer by utilizing laser beam ablation or decrease in adhesiveness of the separation layer, it is preferable that a conductive layer having a tensile stress before laser beam irradiation is formed, and an impurity element imparting one conductivity type or an inert element is added after formation of the source electrode layer or the drain electrode layer, to make the conductive layer have a compressive stress. By controlling the stress before and after laser beam irradiation, the region irradiated with the laser beam can be easily removed. Further, generation of burrs or the like at an end portion of a formed thin film pattern can be suppressed, and a minute thin film pattern can be easily formed with accuracy. Moreover, in a process after formation of the source electrode layer or the drain electrode layer, a defect such as film peeling of the source electrode layer or the drain electrode layer can be prevented. In the case where the separation layer is left, the stress of the separation layer is preferably controlled together with that of the conductive layer that forms the source electrode layer or the drain electrode layer.

Through the above process, an active matrix substrate including the transistor 922 and the transistor 924 in the pixel portion 902 and plural transistors 926 in the driver circuit portion 904 can be manufactured.

The present invention is not particularly limited thereto, and a transistor may have a single-gate structure in which one channel formation region is formed, a double-gate structure in which two channel formation regions are formed, or a triple-gate structure in which three channel formation regions are formed.

Next, an insulating layer 916 is formed as a second interlayer insulating layer. The insulating layer 916 can be formed of a material such as silicon oxide, silicon nitride, silicon oxynitride, silicon nitride oxide, aluminum nitride, aluminum oxide containing nitrogen (also referred to as aluminum oxynitride), aluminum nitride containing oxygen (also referred to as aluminum nitride oxide), aluminum oxide, diamond-like carbon (DLC), nitrogen-containing carbon (CN), PSG (phosphosilicate glass), BPSG (borophosphosilicate glass), alumina, or other substances including an inorganic insulating material. Alternatively, a siloxane resin may be used. Furthermore, an organic insulating material may be used; an organic material may be either photosensitive or non-photosensitive; and polyimide, acrylic, polyamide, polyimide amide, resist, benzocyclobutene, polysilazane, or a low-dielectric constant (Low-k) material can be used. Moreover, an oxazole resin can be used, and for example, photocuring polybenzoxazole or the like can be used. Since an interlayer insulating layer provided for planarization needs to have high heat resistance, a high insulating property, and a high level of planarity, the insulating layer 916 is preferably formed by a coating method typified by a spin coating method.

The insulating layer 916 can also be formed by a dipping method, spray coating, a doctor knife, a roll coater, a curtain coater, a knife coater, a CVD method, an evaporation method, or the like. The insulating layer 916 may also be formed by a droplet discharge method. In the case of using a droplet discharge method, a material liquid can be saved. Alternatively, a method like a droplet discharge method by which a pattern can be transferred or drawn, such as a printing method (a method for forming a pattern such as screen printing or offset printing), a dispenser method, or the like can be used.

An opening which reaches the source electrode layer or the drain electrode layer of the transistor 924 is formed in the insulating layer 916 of the pixel portion 902. The opening may be formed similarly to the opening for electrically connecting the source electrode layer or the drain electrode layer to the source region or the drain region of the semiconductor layer.

For example, the opening can be formed by utilizing ablation by laser beam irradiation, as described in Embodiment Mode 3. Selective irradiation with a laser beam that is absorbed by the source electrode layer or the drain electrode layer of the transistor 924 is conducted to ablate part of the insulating layer 916, so that the opening is formed. The description of the laser beam in Embodiment Modes 1 to 5 can be applied to the detail of the types of applicable laser beams and the like. In the case of forming an opening by utilizing ablation by laser beam irradiation, a low-melting point metal which can be relatively easily evaporated (chromium in this embodiment mode) is preferably used for the source electrode layer or the drain electrode layer. In addition, when an opening is formed by utilizing laser ablation, it is preferable that a layer having a tensile stress at the time of film formation (before laser beam irradiation) is formed as the insulating layer 916 and the layer is made to have a compressive stress after formation of the opening. By adding an impurity element imparting one conductivity type or an inert element to the insulating layer 916 after formation of the opening, the insulating layer 916 can become a layer having a compressive stress. Of course, an opening may be formed by formation of a mask layer with the use of a photoresist without using laser ablation and etching using the mask layer.

A light emitting element 930 is formed over the insulating layer 916 in the pixel portion 902. The light emitting element 930 is electrically connected to the transistor 924.

First, a first electrode layer 932 is formed in the opening, which is provided in the insulating layer 916 and exposes the source electrode layer or the drain electrode layer of the transistor 924.

Next, a partition layer 918 is formed so as to have an opening over the first electrode layer 932 and cover the edge portions of the first electrode layer 932. The partition layer 918 can be formed using silicon oxide, silicon nitride, silicon oxynitride, silicon nitride oxide, or the like and may have a single-layer structure or a stacked structure of two or three layers. The partition layer 918 can alternatively be formed using a material such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon, polysilazane, or other substances including an inorganic insulating material. Alternatively, a material containing siloxane may be used. Furthermore, an organic insulating material may be used; an organic material may be either photosensitive or non-photosensitive; and polyimide, acrylic, polyamide, polyimide amide, resist, benzocyclobutene, or polysilazane can be used. Moreover, an oxazole resin can be used, and for example, photo-curing polybenzoxazole or the like can be used.

The partition layer 918 can be formed by a droplet discharge method by which a pattern can be selectively formed, a printing method by which a pattern can be transferred or drawn (a method for forming a pattern, such as screen printing or offset printing), a dispenser method, a coating method such as a spin coating method, a dipping method, or the like. Alternatively, the partition layer may be formed over the entire surface using a photosensitive material, and the partition layer formed of a photosensitive material may be exposed to light and developed, whereby the partition layer can be processed into a desired shape. Further, the partition layer may be formed over the entire surface by a sputtering method, a PVD (Physical Vapor Deposition) method, a CVD (Chemical Vapor Deposition) method such as a low-pressure CVD (LPCVD) method or a plasma CVD method, or the like; a mask of a resist or the like may be formed using a lithography technique; and the partition layer may be etched into a desired shape.

The etching into a desired shape may be performed by either a dry etching method or a wet etching method; however, plasma etching (one kind of a dry etching method) is suitable for treating a large-area substrate. As an etching gas, a fluorine-based gas such as $CF_4$, $CHF_3$, or $NF_3$ or a chlorine-based gas such as $Cl_2$ or $BCl_3$ is used, to which an inert gas such as He or Ar may be appropriately added. Alternatively, electric discharge machining can be performed locally when the etching process is performed using atmospheric pressure discharge, and in such a case, a mask does not need to be formed over the entire surface of the substrate.

The partition layer 918 preferably has a shape of which a radius of curvature continuously changes. By such a shape of the partition layer, coverage by a layer stacked thereover is improved.

Next, a layer 934 and a second electrode layer 936 are stacked over the first electrode layer 932 and the partition layer 918, and the light emitting element 930 having a structure in which the layer 934 is interposed between the first electrode layer 932 and the second electrode layer 936 is obtained. The layer 934 includes at least a layer containing a light emitting material by which a desired light-emission wavelength can be obtained.

One of the first electrode layer 932 and the second electrode layer 936 functions as an anode and the other functions as a cathode. The first electrode layer 932 and the second electrode layer 936 can be formed using indium tin oxide (ITO), indium tin oxide containing silicon oxide, indium oxide containing zinc oxide at 2 wt % to 20 wt %, gold (Au), platinum (Pt), nickel (Ni), tungsten (W), chromium (Cr), molybdenum (Mo), iron (Fe), cobalt (Co), copper (Cu), palladium (Pd), or the like. In addition, aluminum, an alloy of magnesium and silver, an alloy of aluminum and lithium, or the like can be used.

In order to take out light emitted from the layer 934 to an external portion, one or both of the first electrode layer 932 and the second electrode layer 936 is/are preferably formed using indium tin oxide, or alternatively, silver, aluminum, or the like that is formed to have a thickness of several nm to several tens of nm so as to transmit visible light.

The first electrode layer 932 can be obtained by the steps of forming the material over the entire surface and selectively etching the material. Further alternatively, the first electrode layer 932 may be selectively formed in a desired place by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place.

In addition, the first electrode layer 932 can be processed into a desired pattern shape by utilizing laser ablation described in Embodiment Modes 1 and 2. Specifically, the material layer that forms the first electrode layer 932 is selectively irradiated with a laser beam that is absorbed by the material layer. A region of the material layer, which is irradiated with the laser beam, is ablated, so that the first electrode layer 932 having a desired pattern shape is formed.

The first electrode layer 932 may be formed by utilizing the separation layer described in Embodiment Mode 4. Specifically, a separation layer whose adhesiveness is decreased by absorption of a laser beam is formed on the material layer that forms the first electrode layer 932. The separation layer is selectively irradiated with a laser beam, so that the adhesiveness of a region of the separation layer, which is irradiated with the laser beam, is decreased. After removing the region with decreased adhesiveness of the separation layer, the material layer is selectively etched using the separation layer as a mask, so that the first electrode layer 932 with a desired shape can be formed. After formation of the first electrode layer 932, the separation layer is removed.

In the case of forming the first electrode layer 932 by utilizing laser beam ablation or decrease in adhesiveness of the separation layer, it is preferable that a material layer having a tensile stress before laser beam irradiation is formed, and an impurity element imparting one conductivity type or an inert element is added after formation of the first electrode layer 932, to make the material layer have a compressive stress. By controlling the stress before and after laser beam irradiation, the region irradiated with the laser beam can be easily removed. Further, generation of burrs or the like at an end portion of a formed thin film pattern can be suppressed, and a minute thin film pattern can be easily formed with accuracy. Moreover, in a process after formation of the first electrode layer 932, a defect such as film peeling of the first electrode layer 932 can be prevented. In the case where the separation layer is left, the stress of the separation layer is preferably controlled together with that of the conductive layer that forms the first electrode layer 932.

The first electrode layer 932 may be cleaned or polished by a CMP method or with the use of a polyvinyl alcohol based porous material, so that the surface thereof is planarized. In addition, after polishing using a CMP method, ultraviolet ray irradiation, oxygen plasma treatment, or the like may be performed on the surface of the first electrode layer 932.

After the first electrode layer 932 is formed, heat treatment may be performed. Through this heat treatment, moisture included in the first electrode layer 932 is released. Therefore, degasification or the like is not caused in the first electrode layer 932. Even when a light emitting material which is easily deteriorated by moisture is formed over the first electrode layer 932, the light emitting material is not deteriorated. Accordingly, a highly reliable display device can be manufactured.

The second electrode layer 936 can be formed by an evaporation method, a sputtering method, or the like. In addition, an insulating layer may be provided as a passivation layer (protective layer) over the second electrode layer 936. It is effective to provide a passivation layer to cover the second electrode layer 936 in this manner. The passivation layer can be formed using a single-layer structure or a stacked structure of an insulating layer including silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or nitrogen-containing carbon. Alternatively, the passivation layer may be formed using a siloxane resin.

In this case, a film providing good coverage is preferably used as the passivation layer. A carbon film, especially, a DLC film is effective. The DLC film can be formed at a temperature in the range of room temperature to 100° C.; therefore, even when the layer 934 has low heat resistance, the DLC film can be easily formed over the layer 934. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas for film formation. The reaction gas is ionized by glow discharge, and the ions are accelerated to collide with a negatively self-biased cathode; accordingly, a DLC film is formed. A nitrogen-containing carbon film may be formed using a $C_2H_4$ gas and an $N_2$ gas as a reaction gas. The DLC film has a high blocking effect on oxygen and can suppress oxidation of the layer 934. Accordingly, the layer 934 can be prevented from being oxidized during a sealing step later.

The layer 934 formed over the first electrode layer 932 includes at least a light emitting layer containing a light emitting material. The light emitting layer includes a layer containing an organic compound, an inorganic compound, or both organic and inorganic compounds. The light emitting element 930 in which the layer 934 is provided between the first electrode layer 932 and the second electrode layer 936 can be obtained.

The substrate 901 provided with the light emitting element 930 and the sealing substrate 908 are fixed to each other with the sealant 910 to seal the light emitting element 930. As the sealant 910, it is typically preferable to use a visible light curable resin, an ultraviolet curable resin, or a thermosetting resin. For example, an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine resin, a heterocyclic epoxy resin, or a modified epoxy resin can be used. It is to be noted that a region 948 surrounded by the sealant may be filled with a filler, or nitrogen or the like may be enclosed by sealing the region in a nitrogen atmosphere. In a structure in which light is taken out through the filler, the filler needs to have a light-transmitting property. Typically, a visible light curable, ultraviolet curable, or thermosetting epoxy resin may be used. Through the above process, a display device having a display function with the use of a light emitting element is completed. Alternatively, the filler can be dripped in a liquid state to fill the inside of the display device. When a substance having a hygroscopic property such as a drying agent is used as the filler, a higher water-absorbing effect can be obtained, and deterioration of the light emitting element 930 can be prevented.

In order to prevent element deterioration due to moisture, a drying agent may be provided so as to surround the pixel portion 902. For example, the drying agent may be provided in a depressed portion formed in the sealing substrate, so that it does not interfere with reduction in thickness. Further, when the drying agent is formed in a region corresponding to a gate wiring layer so that a large water-absorbing area is provided, a high water-absorbing effect can be obtained. In addition, when the drying agent is formed over the gate wiring layer which does not contribute to light emission, reduction in light-extraction efficiency can be prevented.

This embodiment mode describes the case where the light emitting element is sealed with a glass substrate. Sealing treatment is treatment for protecting the light emitting element from moisture. Therefore, any of the following methods can be used: a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above-mentioned light emitting element is formed, with a sealant such as a thermosetting resin or an ultraviolet curable resin, and a sealed space is formed by curing the resin with heat treatment or ultraviolet ray irradiation treatment. It is also effective to provide a moisture-absorbing material typified by barium oxide in the sealed space. The moisture-absorbing material may be provided on the sealant or over the partition layer or a peripheral portion so as not to block light emitted from the light emitting element. Further, a space between the cover material and the substrate over which the light emitting element is formed can also be filled with a thermosetting resin or an ultraviolet curable resin. In this case, it is effective to add a moisture-absorbing material typified by barium oxide in the thermosetting resin or the ultraviolet curable resin.

Further, the source electrode layer or the drain electrode layer need not necessarily be in direct contact with the first electrode layer 932 so as to obtain electric connection, and the source electrode layer or the drain electrode layer may be connected to the first electrode layer 932 through a wiring layer (conductive layer).

In this embodiment mode, an FPC 954 is connected to the terminal electrode layer 950 through an anisotropic conductive layer 952 in the terminal portion 906 so as to have electrical connection to an external portion.

Moreover, as shown in FIG. 27A, the display device manufactured in this embodiment mode includes the driver circuit portion 904 over the same substrate as the pixel portion 902. It is to be noted that the present invention is not limited thereto and an IC chip may be mounted as a peripheral driver circuit by a COG method or a TAB method as described above.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal input to the source line of the display device may be either an analog signal or a digital signal. The driver circuit and the like may be appropriately designed in accordance with the video signal.

By the present invention, a layer having a desired pattern shape can be formed without using a lithography process that uses a photoresist. Therefore, the lithography process can be reduced or simplified; loss of a material such as a resist material or a developer can be prevented; and the number of photomasks that are necessary can be reduced. By controlling the stress of a process layer before and after ablation by laser beam irradiation, thin film processing can be conducted with accuracy and generation of a defect in a thin film pattern after processing can be prevented. Therefore, a display device with high reliability can be realized with high yield. In addition, throughput can be improved.

This embodiment mode can be appropriately combined with any of other embodiment modes described in this specification.

Embodiment Mode 8

Various element structures can be applied to a light emitting element that has a display function of a display device. The light emitting element is generally distinguished by whether a light emitting material is an organic compound or an inorganic compound. The former is referred to as an organic EL element, and the latter is referred to as an inorganic EL element. Here, examples of a light emitting element that can be applied to the present invention will be described with reference to FIGS. 33 to 35C.

Figure 33:
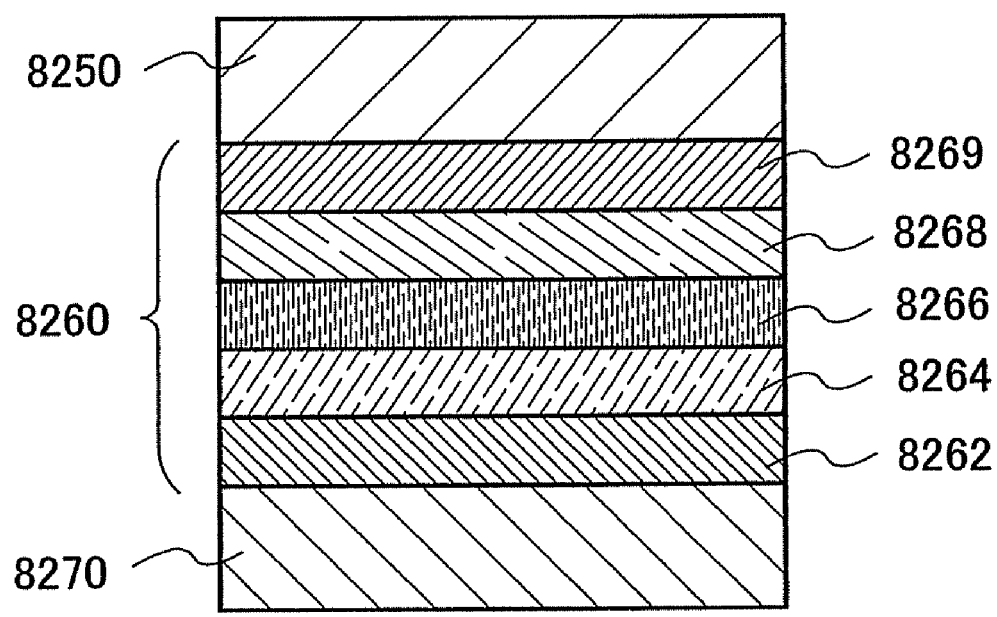
FIG. 33 shows a structural example of a light emitting element which can be applied to the present invention.

FIG. 33 shows an organic EL element. In the light emitting element shown in FIG. 33, a layer 8260 is interposed between a first electrode layer 8270 and a second electrode layer 8250. Either the first electrode layer 8270 or the second electrode layer 8250 is an anode, and the other is a cathode. Note that the anode indicates an electrode for injecting holes to a light emitting layer, and the cathode indicates an electrode for injecting electrons to the light emitting layer. In this embodiment mode, the first electrode layer 8270 is an anode and the second electrode layer 8250 is a cathode. Further, the layer 8260 has a structure in which a hole-injecting layer 8262, a hole-transporting layer 8264, a light emitting layer 8266, an electron-transporting layer 8268, and an electron-injecting layer 8269 are sequentially stacked.

The first electrode layer 8270 and the second electrode layer 8250 can be formed using gold (Au), platinum (Pt), nickel (Ni), tungsten (W), chromium (Cr), molybdenum (Mo), iron (Fe), cobalt (Co), copper (Cu), palladium (Pd), or the like as well as indium tin oxide (ITO), indium tin oxide containing silicon oxide, indium oxide containing zinc oxide of 2 wt % to 20 wt %. Moreover, in addition to aluminum, an alloy of magnesium and silver, an alloy of aluminum and lithium, or the like can also be used for forming the first electrode layer 8270. A method for forming the first electrode layer 8270 is the same as that of the first electrode layer 262 described in Embodiment Mode 5 or the first electrode layer 932 described in Embodiment Mode 7. A method for forming the second electrode layer 8250 is not particularly limited, and for example, a sputtering method, an evaporation method, or the like can be used for forming the second electrode layer 8250.

Note that, in order to extract emitted light to outside, it is preferable to form either the first electrode layer 8270 or the second electrode layer 8250, or both of them by using indium tin oxide or the like or by depositing silver, aluminum, or the like so as to have a thickness of several nm to several tens of nm so that visible light can be transmitted.

The hole-injecting layer 8262 is a layer having a function for supporting injection of holes from the first electrode layer 8270 to the hole-transporting layer 8264. When the hole-injecting layer 8262 is provided, an ionization potential difference between the first electrode layer 8270 and the hole-transporting layer 8264 is relieved; thus, holes are easily injected. The hole-injecting layer 8262 is preferably formed using a substance ionization potential of which is lower than that of a substance forming the hole-transporting layer 8264 and higher than that of a substance forming the first electrode layer 8270. The hole-injecting layer 8262 is also preferably formed using a substance energy band of which is bent by being provided as a thin film having a thickness of 1 nm to 2 nm between the hole-transporting layer 8264 and the first electrode layer 8270. As a specific example of a substance that can be used for forming the hole-injecting layer 8262, a phthalocyanine-based compound such as phthalocyanine (abbreviation: $H_2Pc$) or copper phthalocyanine (CuPc), a high molecular material such as poly(ethylenedioxythiophene)/poly(styrenesulfonic acid) solution (PEDOT/PSS), and the like can be given. Thus, a substance is selected from hole-transporting substances, so that ionization potential in the hole-injecting layer 8262 is relatively lower than that in the hole-transporting layer 8264, whereby the hole-injecting layer 8262 can be formed. In the case of providing the hole-injecting layer 8262, it is preferable to form the first electrode layer 8270 using a substance with a high work function such as indium tin oxide. Note that the present invention is not particularly limited, and the hole-injecting layer 8262 is not necessarily provided.

The hole-transporting layer 8264 is a layer having a function for transporting holes that are injected from the first electrode layer 8270 side to the light emitting layer 8266. The hole-transporting layer 8264 is provided as described above, whereby a distance between the first electrode layer 8270 and the light emitting layer 8266 can be created. As a result, quenching of light emission caused by metal included in the first electrode layer 8270 and the like can be prevented. The hole-transporting layer 8264 is preferably formed using a hole-transporting substance, particularly using a substance that has a hole mobility of $1\times10^{-6}$ cm$^2$/Vs or more. Note that the hole-transporting substance is a substance whose hole mobility is higher than electron mobility and whose value of a ratio of hole mobility with respect to electron mobility (=hole mobility/electron mobility) is preferably larger than 100. As a specific example of a substance that can be used for the hole-transporting layer 8264, the following can be given: 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA), phthalocyanine (abbreviation: H$_2$Pc), copper phthalocyanine (abbreviation: CuPc), vanadyl phthalocyanine (abbreviation: VOPc), 4,4'-bis[N-(4-biphenylyl)-N-phenylamino]biphenyl (abbreviation: BBPB), or the like. Note that the hole-transporting layer 8264 may have a single-layer structure or a stacked structure.

The light emitting layer 8266 is a layer having a light-emitting function, which contains a light emitting material formed of an organic compound. Alternatively, the light emitting layer 8266 may contain an inorganic compound. The organic compound contained in the light emitting layer 8266 is not particularly limited as long as it is an organic compound with a light-emitting property. Various low molecular organic compounds and high molecular organic compounds can be used. Further, either a fluorescent light emitting material or a phosphorescent light emitting material may be used for the organic compound with a light-emitting property. The light emitting layer 8266 may be a layer containing only an organic compound with a light-emitting property or may be a layer that has a structure in which an organic compound with a light-emitting property is dispersed in a host material having a larger energy gap than the organic compound. In a case where the light emitting layer 8266 is a layer in which a plurality of compounds are mixed, like a layer containing a light emitting material formed of the organic compound and the host material, the light emitting layer 8266 can be formed by a co-evaporation method. Here, a co-evaporation method is an evaporation method in which materials are vaporized from a plurality of evaporation sources that are provided in one treatment chamber, and the vaporized materials are mixed in a vapor phase state and then deposited on the processing object.

The electron-transporting layer 8268 is a layer having a function for transporting electrons that are injected from the second electrode layer 8250 to the light emitting layer 8266. The electron-transporting layer 8268 is provided as described-above, whereby a distance between the second electrode layer 8250 and the light emitting layer 8266 can be created. As a result, quenching of light emission caused by metal included in the second electrode layer 8250 and the like can be prevented. The electron-transporting layer 8268 is preferably formed using an electron-transporting substance, particularly using a substance that has an electron mobility of $1\times10^{-6}$ cm$^2$/Vs or more. Note that the electron-transporting substance is a substance whose electron mobility is higher than hole mobility and whose value of a ratio of electron mobility with respect to hole mobility (=electron mobility/hole mobility) is larger than 100. As a specific example of a substance that can be used for forming the electron-transporting layer 8268, the following can be given: 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4-bis(5-methylbenzoxazol-2-yl)stilbene (abbreviation: BzOs), or the like as well as a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)benzoxazolato]zinc (abbreviation: Zn(BOX)$_2$), or bis[2-(2-hydroxyphenyl)benzothiazolato]zinc (abbreviation: Zn(BTZ)$_2$). The electron-transporting layer 8268 may have a single-layer structure or a stacked structure.

The electron-injecting layer 8269 is a layer having a function for supporting injection of electrons from the second electrode layer 8250 to the electron-transporting layer 8268. The electron-injecting layer 8269 can be formed using a substance having relatively higher electron affinity than that of a substance used for forming the electron-transporting layer 8268, which is selected from substances that can be used for forming the electron-transporting layer 8268, such as BPhen, BCP, p-EtTAZ, TAZ, and BzOs. When the electron-injecting layer 8269 is formed in such a manner, a difference of electron affinity between the second electrode layer 8250 and the electron-transporting layer 8268 is relieved, and electrons are easily injected. In addition, the electron-injecting layer 8269 may contain an inorganic substance such as alkali metal like lithium (Li), cesium (Cs), or the like; oxide of alkali metal like lithium oxide, potassium oxide, sodium oxide, or the like; oxide of alkaline earth metal like calcium oxide, magnesium oxide, or the like; fluoride of alkali metal like lithium fluoride, cesium fluoride, or the like; fluoride of alkaline earth metal like calcium fluoride or the like; or alkaline earth metal like magnesium (Mg), calcium (Ca), or the like. In addition, the electron-injecting layer 8269 may have a structure containing the organic compound such as BPhen, BCP, p-EtTAZ, TAZ, or BzOs or may have a structure containing an inorganic compound such as fluoride of alkali metal such as LiF or fluoride of alkaline earth metal such as CaF$_2$. By providing the electron-injecting layer 8269 as a thin film having a thickness of 1 nm to 2 nm by using an inorganic compound such as fluoride of alkali metal such as LiF or fluoride of alkaline earth metal such as CaF$_2$, an energy band of the electron-injecting layer 8269 is bent, or a tunnel current flows through the electron-injecting layer 8269; accordingly, electrons are easily injected from the second electrode layer 8250 to the electron-transporting layer 8268.

Note that a hole-generating layer may be provided instead of the hole-injecting layer 8262, or an electron-generating layer may be provided instead of the electron-injecting layer 8269.

Here, the hole-generating layer is a layer for generating holes. The hole-generating layer can be formed by mixing at least one substance selected from hole-transporting substances and a substance showing an electron accepting property with respect to the hole-transporting substance. As the hole-transporting substance, a similar substance to the substance that can be used for forming the hole-transporting layer 8264 can be used. As the substance showing an electron accepting property, metal oxide such as molybdenum oxide, vanadium oxide, ruthenium oxide, or rhenium oxide is preferably used.

The electron-generating layer is a layer for generating electrons. The electron-generating layer can be formed by mixing at least one substance selected from electron-transporting substances and a substance showing an electron donating property with respect to the electron-transporting substance. Here, as the electron-transporting substance, a similar substance to the substance that can be used for forming the electron-transporting layer 8268 can be used. As the substance showing an electron donating property, a substance selected from alkali metal or alkaline earth metal, specifically lithium (Li), calcium (Ca), sodium (Na), potassium (K), magnesium (Mg), or the like can be used.

The hole-injecting layer 8262, the hole-transporting layer 8264, the light emitting layer 8266, the electron-transporting layer 8268, and the electron-injecting layer 8269 may be each formed by an evaporation method, a droplet discharge method, a coating method, or the like. The first electrode layer 8270 or the second electrode layer 8250 may be formed by a sputtering method, an evaporation method, or the like.

In this embodiment mode, it is acceptable as long as the layer 8260 includes at least the light emitting layer 8266, and the layers having other functions (the hole-injecting layer 8262, the hole-transporting layer 8264, the electron-transporting layer 8268, the electron-injecting layer 8269, and the like) may be provided as appropriate.

Further, the first electrode layer 8270 may be a cathode, and the second electrode layer 8250 may be an anode. In that case, the layer 8260 has a structure in which an electron-injecting layer, an electron-transporting layer, a light emitting layer, a hole-transporting layer, and a hole-injecting layer are sequentially stacked from the first electrode layer 8270 side.

Next, an inorganic EL element will be described with reference to FIGS. 34A to 34C and FIGS. 35A to 35C. The inorganic EL element is classified into a dispersion-type inorganic EL element and a thin-film-type inorganic EL element, depending on its element structure. The former and the latter are different in that the former has a light emitting layer in which particles of a light emitting material are dispersed in a binder, whereas the latter has a light emitting layer formed of a thin film of a light emitting material. However, the former and the latter are in common in that they need electrons accelerated by a high electric field. Note that, as a mechanism of light emission that is obtained, there are donor-acceptor recombination-type light emission that utilizes a donor level and an acceptor level, and localized-type light emission that utilizes inner-shell electron transition of a metal ion. In general, a dispersion-type inorganic EL exhibits donor-acceptor recombination-type light emission and a thin-film-type inorganic EL element exhibits localized-type light emission.

A light emitting material that can be used in the present invention includes a base material and an impurity element. The impurity element serves as a luminescent center. By the change of the impurity element to be contained, light emission of various colors can be obtained. Various methods such as a solid-phase method or a liquid-phase method (a coprecipitation method) can be used for forming the light emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, and the mixture is heated and baked in an electronic furnace to be reacted, so that the impurity element is contained in the base material. The baking temperature is preferably 700° C. to 1500° C. This is because the solid-phase reaction does not progress when the temperature is too low, whereas the base material is decomposed when the temperature is too high. Note that, although the baking may be carried out in a powder state, it is preferable that the baking be carried out in a pellet state. Although the solid-phase method needs baking at a comparatively high temperature, the solid-phase method is easy; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light emitting material are distributed uniformly, and the reaction can progress even when the grain size is small and the baking temperature is low.

As a base material used for a light emitting material, sulfide, oxide, or nitride can be used. For the sulfide, for example, zinc sulfide, cadmium sulfide, calcium sulfide, yttrium sulfide, gallium sulfide, strontium sulfide, barium sulfide, or the like can be used. For the oxide, for example, zinc oxide, yttrium oxide, or the like can be used. For the nitride, for example, aluminum nitride, gallium nitride, indium nitride, or the like can be used. Furthermore, as the base material used for the light emitting material, zinc selenide, zinc telluride, or the like can also be used. Alternatively, a ternary mixed crystal such as calcium gallium sulfide (CaGa$_2$S$_4$), strontium gallium sulfide (SrGa$_2$S$_4$), or barium gallium sulfide (BaGa$_2$S$_4$) may also be used.

For an impurity element of the localized-type light emission, manganese (Mn), copper (Cu), samarium (Sm), terbium (Th), erbium (Er), thulium (Tm), europium (Eu), cerium (Ce), praseodymium (Pr), or the like can be used. Note that a halogen element such as fluorine (F) or chlorine (Cl) may be added, which can serve as charge compensation.

On the other hand, for an impurity element of the donor-acceptor recombination-type light emission, a light emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light emitting material of the donor-acceptor recombination-type light emission is synthesized by a solid-phase method, each of a base material, a first impurity element or a compound containing the first impurity element, and a second impurity element or a compound containing the second impurity element is weighed and mixed in a mortar, and then heated and baked in an electronic furnace. The above-described base material can be used for the base material. As the first impurity element or the compound containing the first impurity element, for example, fluorine (F), chlorine (Cl), aluminum sulfide, or the like can be used. As the second impurity element or the compound containing the second impurity element, for example, copper (Cu), silver (Ag), copper sulfide, silver sulfide, or the like can be used. The baking temperature is preferably 700° C. to 1500° C. This is because the solid-phase reaction does not progress when the temperature is too low, whereas the base material is decomposed when the temperature is too high. Note that, although the baking may be carried out in a powder state, it is preferable that the baking be carried out in a pellet state.

As an impurity element in the case of utilizing solid-phase reaction, a compound including a first impurity element and a second impurity element may be used. In this case, the impurity element is easily diffused and solid-phase reaction easily progresses; thus, a uniform light emitting material can be obtained. Moreover, since an unnecessary impurity element does not enter, a light emitting material with high purity can be obtained. As the compound including the first impurity element and the second impurity element, for example, copper chloride, silver chloride, or the like can be used.

Note that these impurity elements may be contained at a concentration of 0.01 atom % to 10 atom %, preferably, 0.05 atom % to 5 atom % with respect to the base material.

In the case of the thin-film-type inorganic EL element, a light emitting layer, which contains the above-described light emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as a metal organic CVD method or a low-pressure hydride transport CVD method; an atomic layer epitaxy method (ALE); or the like.

Figure 34A:
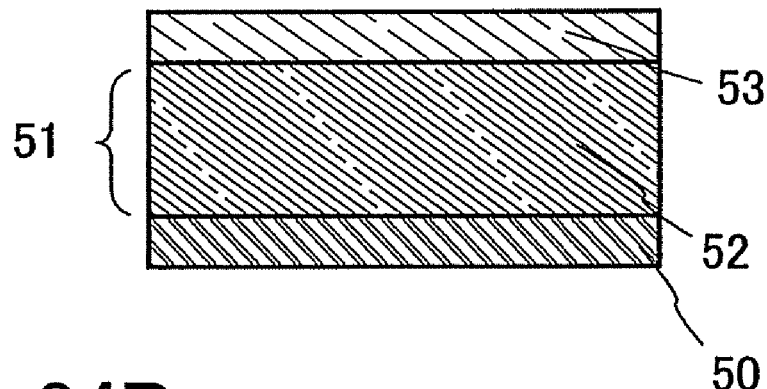
FIGS. 34A to 34C show structural examples of a light emitting element which can be applied to the present invention.
Figure 34B:
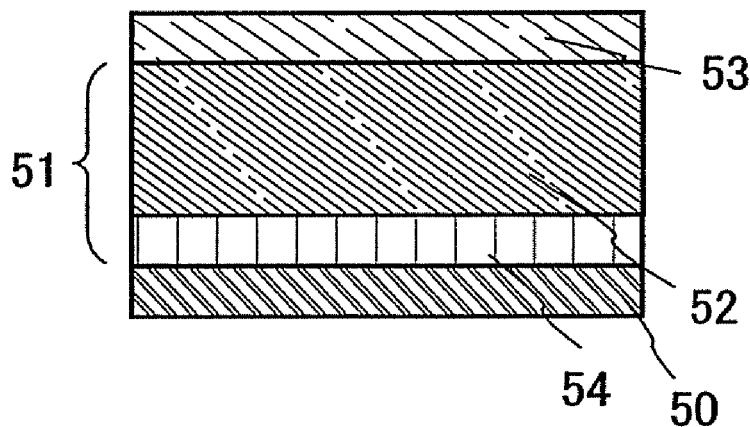
Figure 34C:
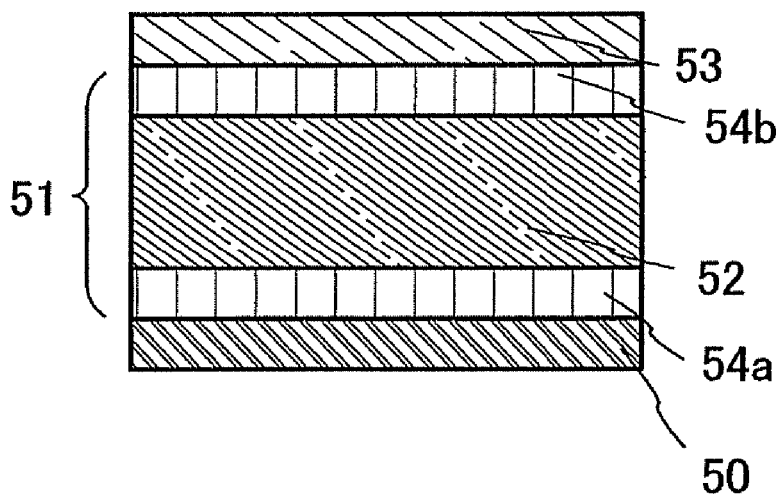

An example of a thin-film-type inorganic EL element that can be used as a light emitting element is shown in FIGS. 34A to 34C. In FIGS. 34A to 34C, each light emitting element includes a first electrode layer 50, a layer 51, and a second electrode layer 53. The layer 51 includes at least a light emitting layer 52.

In the light emitting element shown in FIG. 34A, the layer 51 including only the light emitting layer 52 is interposed between the first electrode layer 50 and the second electrode layer 53. The light emitting element shown in FIG. 34B has a structure in which an insulating layer 54 is provided between the first electrode layer 50 and the light emitting layer 52 in the light emitting element of FIG. 34A. The light emitting element shown in FIG. 34C has a structure in which an insulating layer 54a is provided between the first electrode layer 50 and the light emitting layer 52 and an insulating layer 54b is provided between the second electrode layer 53 and the light emitting layer 52 in the light emitting element of FIG. 34A. As the above, an insulating layer may be provided between the light emitting layer and one of a pair of the electrode layers that sandwiches the light emitting layer. Alternatively, an insulating layer may be provided between a light emitting layer and one of a pair of electrode layers that sandwich the light emitting layer and another insulating layer may be provided between the light emitting layer and the other one of the pair of electrode layers. The insulating layer may have a single-layer structure or a stacked structure.

In FIG. 34B, the insulating layer 54 is provided to be in contact with the first electrode layer 50; however, the order of the insulating layer and the light emitting layer may be reversed so that the insulating layer 54 is provided to be in contact with the second electrode layer 53.

Next, a dispersion-type inorganic EL element will be described. In the case of the dispersion-type inorganic EL element, particulate light emitting materials are dispersed in a binder, so that a film-shaped light emitting layer is formed. When particles having a desired size cannot be sufficiently obtained by a formation method of a light emitting material, the light emitting materials may be processed into particles by crushing in a mortar or the like. The binder is a substance for fixing the particulate light emitting materials in a dispersion state and holding the light emitting materials in a form of a light emitting layer. The light emitting materials are uniformly dispersed in the light emitting layer by the binder and are fixed.

In the case of the dispersion-type inorganic EL element, as a formation method of a light emitting layer, a droplet discharge method capable of selectively forming a light emitting layer; a printing method (such as screen printing or offset printing); or a coating method such as a spin coating method; a dipping method; a dispenser method; or the like can be used. Although there is no particular limitation on the thickness of the light emitting layer, the thickness thereof is preferably in a range of 10 nm to 1000 nm. The ratio of the light emitting material in the light emitting layer containing the light emitting material and the binder may be greater than or equal to 50 wt % and less than or equal to 80 wt %.

Figure 35A:
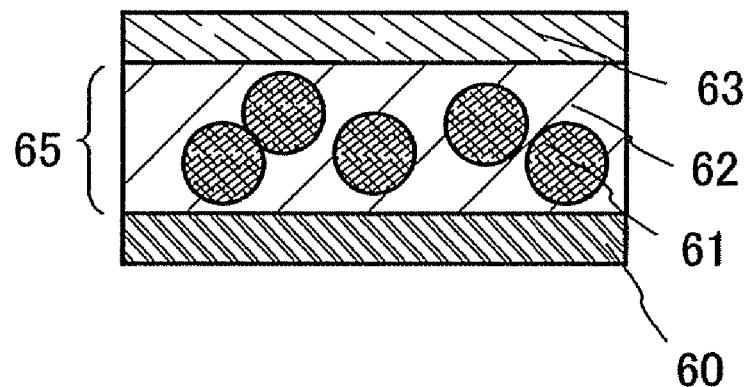
FIGS. 35A to 35C show structural examples of a light emitting element which can be applied to the present invention.
Figure 35B:
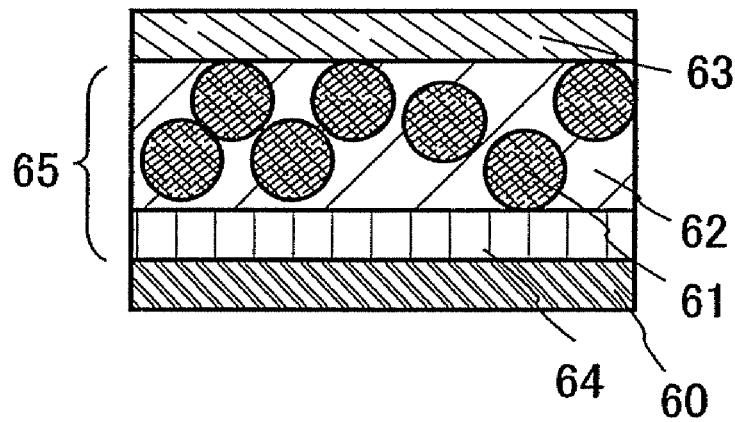
Figure 35C:
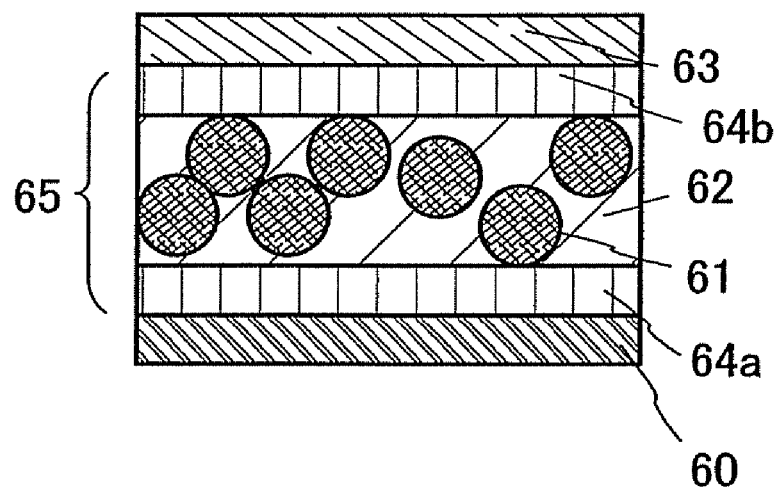

Examples of a dispersion-type inorganic EL element that can be used as a light emitting element are shown in FIGS. 35A to 35C. In FIGS. 35A to 35C, each light emitting element includes a first electrode layer 60, a layer 65, and a second electrode layer 63. The layer 65 includes at least a light emitting layer.

The light emitting element shown in FIG. 35A has a stacked structure of the first electrode layer 60, the light emitting layer 62, and the second electrode layer 63. In the light emitting layer 62, light emitting materials 61 held by a binder are included.

As a binder that can be used in this embodiment mode, an insulating material can be used. Specifically, an organic insulating material or an inorganic insulating material can be used, and a mixture material of an organic insulating material and an inorganic insulating material may be used. As the organic insulating material, polymer that has relatively high dielectric constant like a cyanoethyl cellulose-based resin; or a resin such as polyethylene, polypropylene, a polystyrene-based resin, a silicone resin, an epoxy resin, or vinylidene fluoride can be used. Alternatively, a heat-resistant polymer such as aromatic polyamide or polybenzoimidazole, or a siloxane resin may be used. Note that the siloxane resin corresponds to a resin having Si—O—Si bonds. Siloxane has a skeleton structure formed from a bond of silicon (Si) and oxygen (O) and has an organic group containing at least hydrogen (for example, an alkyl group or aromatic hydrocarbon) as a substituent. Alternatively, as the substituent, a fluoro group may be used. Further alternatively, as the substituent, an organic group containing at least hydrogen, and a fluoro group may be used. A vinyl resin such as polyvinyl alcohol or polyvinyl butyral, or another resin material such as a phenol resin, a novolac resin, an acrylic resin, a melamine resin, a urethane resin, or an oxazole resin (polybenzoxazole) may also be used. A dielectric constant can also be controlled by mixing these resins with microparticles having a high dielectric constant such as barium titanate ($BaTiO_3$) or strontium titanate ($SrTiO_3$) as appropriate.

As the inorganic material contained in the binder, the following can be used: a material selected from silicon oxide ($SiO_x$), silicon nitride ($SiN_x$), silicon containing oxygen and nitrogen, aluminum nitride, aluminum containing oxygen and nitrogen, aluminum oxide, titanium oxide, $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide, zirconium oxide, or other substances containing an inorganic material. When an inorganic material having high dielectric constant is mixed with an organic material (by addition or the like), a dielectric constant of a light emitting layer including a light emitting material and a binder can be further controlled and increased. A mixed layer of an inorganic material and an organic material is used for a binder, and the high dielectric constant is obtained, whereby further high electric charge can be induced by the light emitting material.

In the manufacturing process, the light emitting materials are dispersed in a solution containing a binder. As a solvent of the solution containing a binder that can be used in this embodiment, a solvent that dissolves a binder material and that can make a solution with a viscosity appropriate for a method of forming a light emitting layer (various wet processes) and for a desired thickness, is appropriately selected. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light emitting element shown in FIG. 35B has a structure in which an insulating layer 64 is provided between the first electrode layer 60 and the light emitting layer 62 in the light emitting element of FIG. 35A. The light emitting element shown in FIG. 35C has a structure in which an insulating layer 64a is provided between the first electrode layer 60 and the light emitting layer 62 and an insulating layer 64b is provided between the second electrode layer 63 and the light emitting layer 62 in the light emitting element of FIG. 35A. As described above, the insulating layer may be provided between the light emitting layer and one of a pair of electrode layers that sandwiches the light emitting layer. Alternatively, an insulating layer may be provided between the light emitting layer and one of a pair of electrode layers that sandwiches the light emitting layer and another insulating layer may be provided between the light emitting layer and the other one of the pair of electrode layers. The insulating layer may have a single-layer structure or a stacked structure.

In FIG. 35B, the insulating layer 64 is provided to be in contact with the first electrode layer 60; however, the order of the insulating layer and the light emitting layer may be reversed so that the insulating layer 64 is provided to be in contact with the second electrode layer 63.

Insulating layers such as the insulating layer 54 in FIGS. 34A to 34C and the insulating layer 64 in FIGS. 35A to 35C are not particularly limited; however, it is preferable that the insulating layer have high withstand voltage, be a dense film, and furthermore have high dielectric constant. For example, the insulating layer can be formed using silicon oxide ($SiO_x$), yttrium oxide, titanium oxide, aluminum oxide, hafnium oxide, tantalum oxide, barium titanate ($BaTiO_3$), strontium titanate ($SrTiO_3$), lead titanate ($PbTiO_3$), silicon nitride, zirconium oxide, or the like; a mixed layer thereof; or a stacked layer containing two or more kinds of these. These insulating layers can be formed by a sputtering method, an evaporating method, a CVD method, or the like. Alternatively, the insulating layer may be formed in such a manner that particles of these insulating materials are dispersed in a binder. A binder material may be a material that is similar to that of a binder contained in the light emitting layer and may be formed by a method that is similar thereto. Although there is no particular limitation on the thickness of the insulating layer, the thickness thereof is preferably in a range of 10 nm to 1000 nm.

The inorganic EL elements shown in FIGS. 34A to 34C and FIGS. 35A to 35C can obtain light emission by applying a voltage between a pair of electrode layers that sandwich the light emitting layer. The light emitting element can operate by both DC driving and AC driving.

The light emitting elements shown in this embodiment mode (FIGS. 33 to 35C) can be provided as a display element of a display device shown in the above embodiment modes.

For example, in a case where the organic EL element shown in FIG. 33 is applied to the display device shown in FIG. 15B, the first electrode layer 262 or the second electrode layer 270 corresponds to the first electrode layer 8270 or the second electrode layer 8250. The layer 268 corresponds to the layer 8260. In the case of the display device shown in FIGS. 27A and 27B, similarly, the first electrode layer 932 or the second electrode layer 936 corresponds to the first electrode layer 8270 or the second electrode layer 8250. The layer 934 corresponds to the layer 8260.

Further, the case, in which the inorganic EL elements shown in FIGS. 34A to 34C and FIGS. 35A to 35C are applied to the display device shown in FIG. 15B, is similar to the above. The first electrode layer 262 or the second electrode layer 270 corresponds to the first electrode layer 50 or the second electrode layer 53, or the first electrode layer 60 or the second electrode layer 63. The layer 268 corresponds to the layer 51 or the layer 65. In the case of the display device shown in FIGS. 27A and 27B, similarly, the first electrode layer 932 or the second electrode layer 936 corresponds to the first electrode layer 50 or the second electrode layer 53, or the first electrode layer 60 or the second electrode layer 63. The layer 934 corresponds to the layer 51 or the layer 65.

The present invention can be applied to formation of an opening for connecting the light emitting element of this embodiment mode to a transistor. By employing the present invention, throughput is improved in a manufacturing process of a display device including a light emitting element.

This embodiment mode can be appropriately combined with any of other embodiment modes described in this specification.

Embodiment Mode 9

In Embodiment Mode 9, a liquid crystal display device will be described.

Figure 29A:
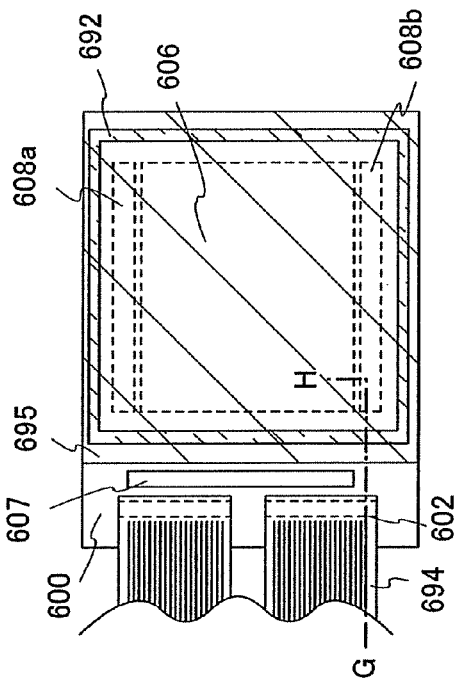
FIGS. 29A and 29B are a top view and a cross-sectional view showing an example of a display device according to the present invention.
Figure 29B:
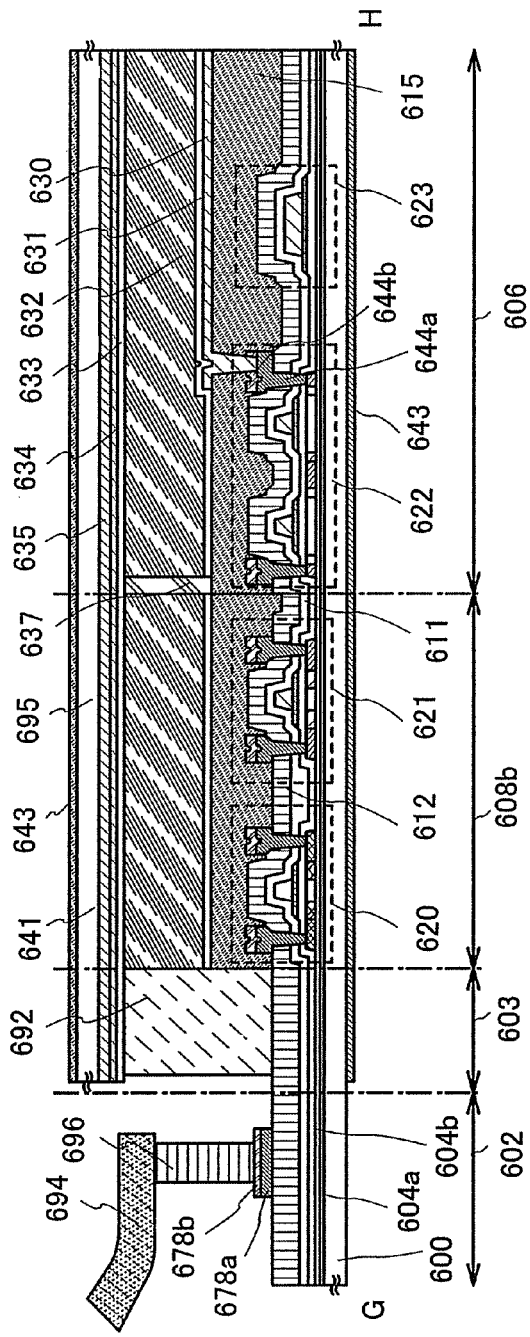

FIG. 29A is a top view of a liquid crystal display device, and FIG. 29 B is a cross-sectional view of FIG. 29A taken along a line G-H.

As shown in FIG. 29A, a pixel region 606, a driver circuit region 608a that is a scanning line driver circuit, and a driver circuit region 608b that is a scanning line driver region are sealed between a substrate 600 and a sealing substrate 695 with a sealant 692. A driver circuit region 607 that is a signal line driver circuit formed using an IC driver is provided over the substrate 600. In the pixel region 606, a transistor 622 and a capacitor 623 are provided, and in the driver circuit region 608b, a driver circuit including a transistor 620 and a transistor 621 is provided. A substrate similar to that in the above embodiment mode can be used as the substrate 600. In the case where a substrate made of a synthetic resin is used as the substrate 600, there is concern that the substrate generally has lower allowable temperature limit than other substrates. However, the substrate made of a synthetic resin can be employed by transfer after a manufacturing process using a high heat-resistant substrate.

In the pixel region 606, the transistor 622 functioning as a switching element is provided over the substrate 600 with a base insulating layer 604a and a base insulating layer 604b interposed therebetween. In this embodiment mode, the transistor 622 is a multi-gate thin film transistor, which includes a semiconductor layer including impurity regions that serve as a source region and a drain region, a gate insulating layer, a gate electrode layer having a stacked structure of two layers, and a source electrode layer and a drain electrode layer. The source electrode layer or the drain electrode layer is electrically connected to the impurity region of the semiconductor layer. In addition, the source electrode layers or the drain electrode layers 644a and 644b are electrically connected to a pixel electrode layer 630.

In this embodiment mode, a thin film processing method utilizing laser beam irradiation and the stress of a processing thin film according to the present invention as described in Embodiment Modes 1 to 5 can be applied to pattern formation of a semiconductor layer that forms a transistor to serve as a switching element and a conductive layer that forms a gate electrode layer, a source electrode layer, and a drain electrode layer; formation of an opening for various electric connection; and the like. By employing the present invention, the lithography process that uses a photoresist can be reduced or simplified, and thin film processing can be conducted with more accuracy.

Note that the thin film processing method utilizing laser beam irradiation and the stress of a processing thin film need not necessarily be applied to all thin film processing. A thin film may be processed into a desired shape by using a lithography process and conducting selective etching. Further, a desired layer may be selectively formed in a desired place by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

A thin film transistor (TFT) can be manufactured by various methods. For example, a crystalline semiconductor layer is employed as a semiconductor layer. A gate electrode layer is provided over the crystalline semiconductor layer with a gate insulating layer interposed therebetween. An impurity element is added to the crystalline semiconductor layer using the gate electrode layer as a mask, so that an impurity region is formed in the crystalline semiconductor layer. By addition of the impurity element using the gate electrode layer, a mask layer does not need to be formed for addition of an impurity element. The gate electrode layer can have a single-layer structure or a stacked structure. The impurity region can be formed into a high-concentration impurity region and a low-concentration impurity region by controlling the concentration thereof. A thin film transistor having a low-concentration impurity region in this manner is referred to as an LDD (Lightly Doped Drain) structure. The low-concentration impurity region can be formed to be overlapped with the gate electrode, and such a thin film transistor is referred to as a GOLD (Gate Overlapped LDD) structure. The thin film transistor is formed to have an n-type polarity by using phosphorus (P) in the impurity region. In a case of a p-type polarity, boron (B) or the like may be added. After that, an insulating film 611 and an insulating film 612 are formed to cover the gate electrode layer and the like. Dangling bonds of the crystalline semiconductor layer can be terminated by hydrogen mixed in the insulating layer 611 (and the insulating layer 612).

In order to further improve planarity, the insulating layer 615 may be formed as an interlayer insulating layer. The insulating layer 615 can be formed using an organic insulating material or an inorganic insulating material to have a single-layer structure or a stacked structure. For example, the insulating layer 615 can be formed of a material selected from substances including an inorganic insulating material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, a nitrogen-containing carbon (CN), phosphosilicate glass (PSG), borophosphosilicate glass (BPSG), or alumina. Alternatively, an organic insulating material may be used; an organic material may be either photosensitive or non-photosensitive; and polyimide, acrylic, polyamide, polyimide amide, a resist, benzocyclobutene, a siloxane resin, or the like can be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may also be used as the substituent. Alternatively, an organic group containing at least hydrogen and a fluoro group may be used as the substituent.

By using a crystalline semiconductor layer, the pixel region and the driver circuit region can be formed over the same substrate. In that case, the transistor in the pixel region and the transistor in the driver circuit region 608b are formed simultaneously. The transistor used in the driver circuit region 608b may constitute a part of a CMOS circuit. Although the thin film transistor formed in the driver circuit region 608b has a GOLD structure, it may have an LDD structure like the transistor 622.

Without limitation to this embodiment mode, the thin film transistor in the pixel region 606 may have a single-gate structure in which a single channel formation region is formed, a double-gate structure in which two channel formation regions are formed, or a triple-gate structure in which three channel formation regions are formed. In addition, the thin film transistor of a peripheral driver circuit region may also have a single-gate structure, a double-gate structure, or a triple-gate structure.

Note that without limitation to the formation method of a thin film transistor described in this embodiment mode, the present invention can be used in a top-gate structure (such as a staggered structure), a bottom-gate structure (such as an inverted staggered structure), a dual-gate structure including two gate electrode layers provided above and below a channel region each with a gate insulating film interposed therebetween, or another structure.

Next, an insulating layer 631 called an orientation film is formed by a printing method or a droplet discharge method to cover the pixel electrode layer 630. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 serving as an orientation film is similar to the insulating layer 631. Then, the sealant 692 is formed by a droplet discharge method in a peripheral region of the pixel region.

After that, the sealing substrate 695 provided with the insulating layer 633 serving as an orientation film, a conductive layer 634 serving as an opposite electrode, a colored layer 635 serving as a color filter, a polarizer 641 (also referred to as a polarizing plate), and a polarizer 642 is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided on a side of the substrate 600 opposite to the side of having elements. The polarizer can be provided over the substrate using an adhesive layer. The sealant may be mixed with a filler, and further, the sealing substrate 695 may be provided with a blocking film (black matrix), or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (IEDs) of RGB or the like are arranged as a backlight and a successive additive color mixing method (field sequential method) in which color display is performed by time division is employed. The black matrix is preferably provided so as to be overlapped with a transistor and a CMOS circuit for the sake of reducing reflection of external light by wirings of the transistor and the CMOS circuit. Note that the black matrix may be provided so as to be overlapped with a capacitor. This is because reflection by a metal film forming the capacitor can be prevented.

The liquid crystal layer can be formed by a dispenser method (dropping method), or an injecting method by which liquid crystal is injected using a capillary phenomenon after attaching the substrate 600 including an element to the sealing substrate 695. A dropping method is preferably employed when using a large-area substrate to which it is difficult to apply an injecting method.

Although the spacer may be provided in such a way that particles each having a size of several micrometers are sprayed, the spacer in this embodiment mode is formed by a method in which a resin film is formed over an entire surface of the substrate and then etched. A material of the spacer is applied by a spinner and then subjected to light exposure and development to form a predetermined pattern. Moreover, the material is heated at 150° C. to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the opposite substrate is attached. The shape can be conical, pyramidal, or the like, and there is no particular limitation on the shape.

Then, terminal electrode layers 678a and 678b electrically connected to the pixel region is provided with an FPC 694 that is a wiring board for connection, through an anisotropic conductive layer 696. The FPC 694 functions to transmit signals or potential from the outside. Through the above steps, a liquid crystal display device having a display function can be manufactured.

A wiring layer (conductive layer) and a gate electrode layer which are included in the transistor, the pixel electrode layer 630, and the conductive layer 634 that is an opposite electrode layer can be formed using a material selected from indium tin oxide (ITO), indium zinc oxide (IZO) formed using a target in which indium oxide is mixed with zinc oxide, a conductive material in which indium oxide is mixed with silicon oxide, organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy containing the above metal as its main component; or metal nitride thereof.

A retardation film may be stacked between the polarizing plate and the liquid crystal layer.

Although a TN liquid crystal panel is described in this embodiment mode, the above process can be similarly applied to a liquid crystal panel of another type. For example, this embodiment mode can be applied to a liquid crystal panel of a transverse electrical field type in which liquid crystal is orientated by applying an electric field parallel to a glass substrate. Further, this embodiment mode can be applied to a liquid crystal panel of a VA (Vertical Alignment) type.

Figure 18:
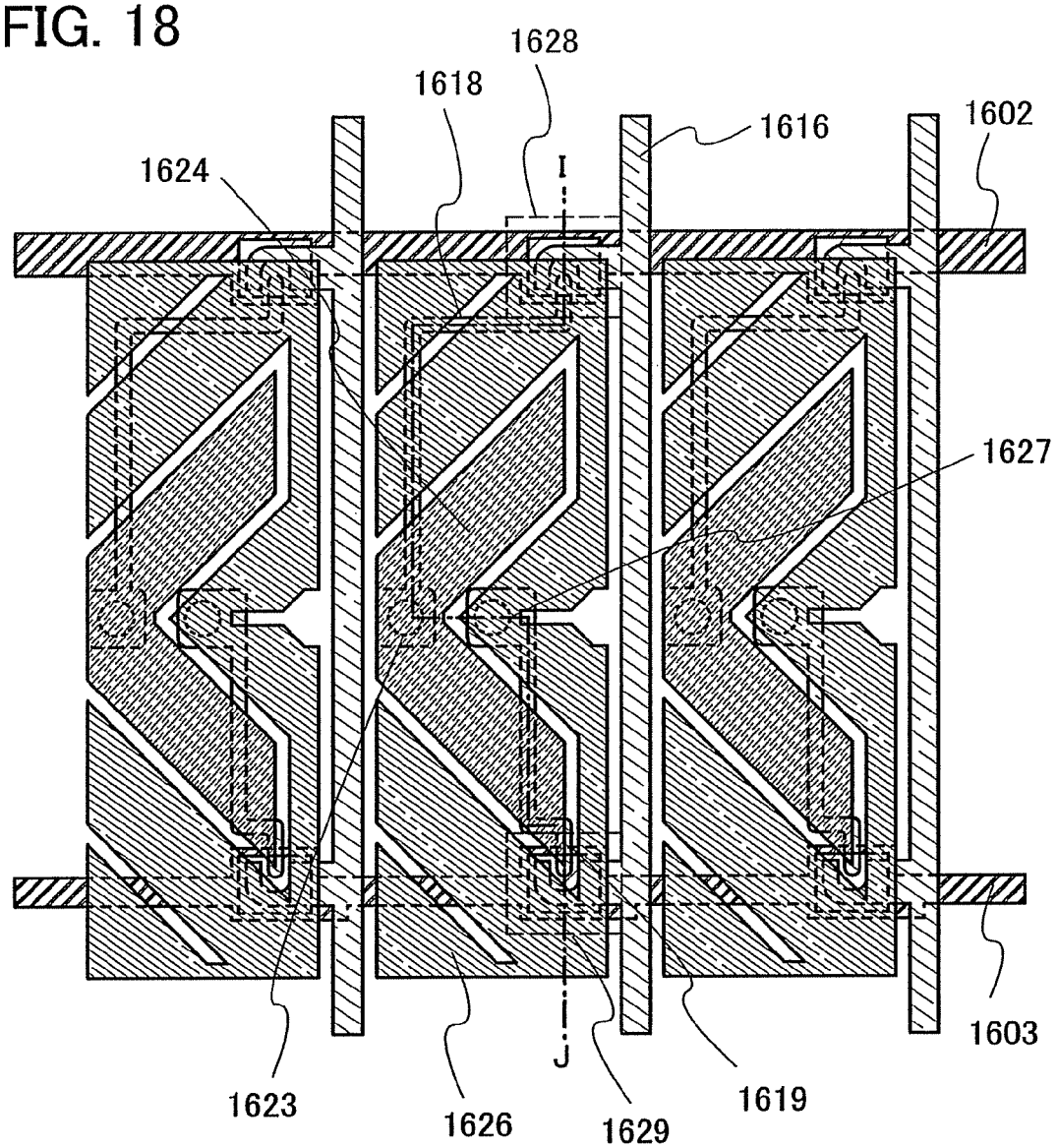
FIG. 18 shows an example of a display device according to the present invention.
Figure 32:
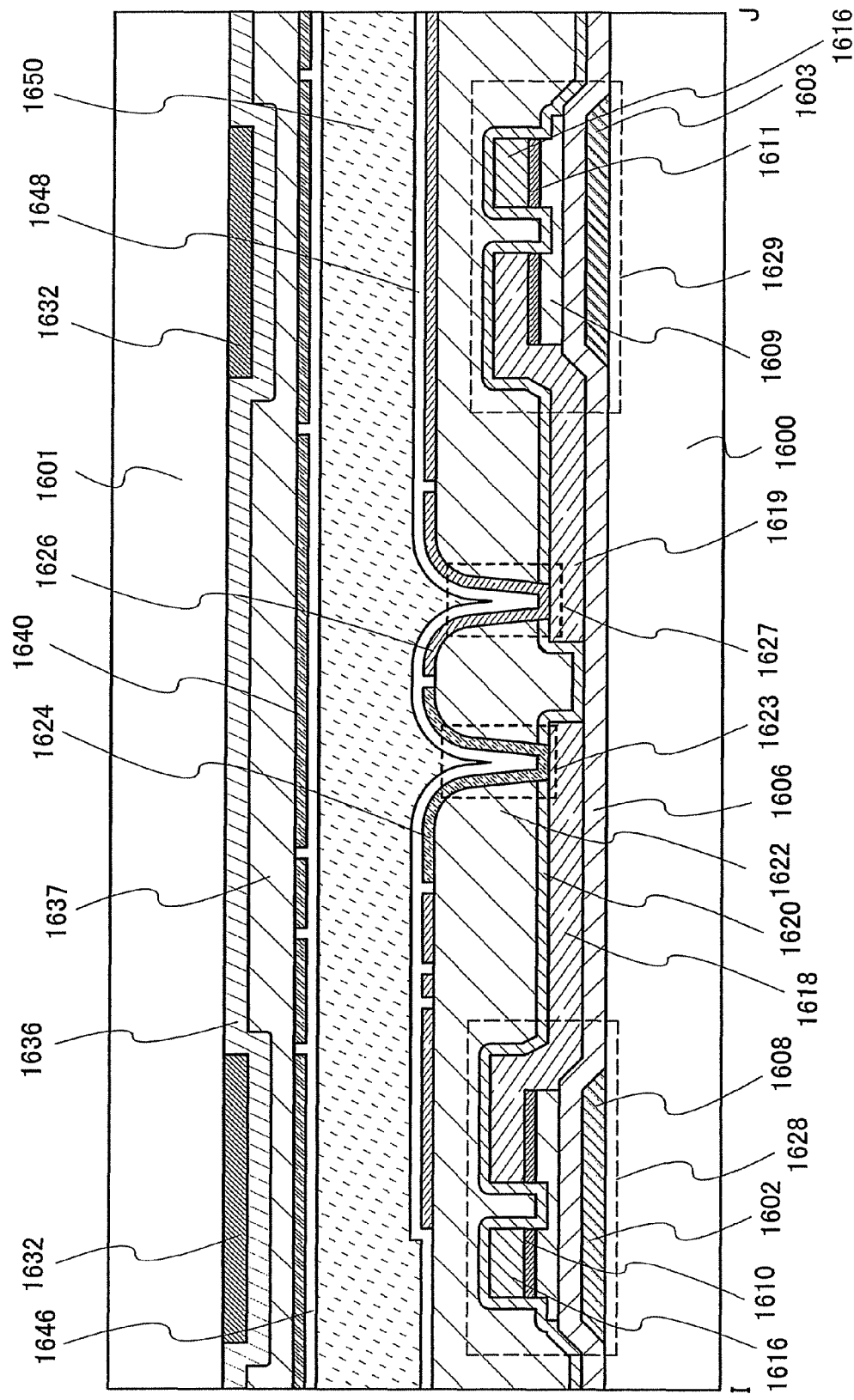
FIG. 32 shows an example of a display device according to the present invention.

FIGS. 18 and 32 show a pixel structure of a VA-type liquid crystal panel. FIG. 18 is a plane view, and FIG. 32 is a cross-sectional view of a structure taken along a line I-J in FIG. 18. Hereinafter, description is made with reference to both drawings.

In this pixel structure, a plurality of pixel electrodes are included in one pixel, and each of the pixel electrodes is connected to a respective TFT. Each of the TFTs is driven by a different gate signal. In other words, a multi-domain pixel has a structure in which signals applied to the pixel electrodes are individually controlled.

A pixel electrode layer 1624 is connected with a TFT 1628 through a wiring layer 1618 using an opening (contact hole) 1623. A pixel electrode layer 1626 is connected with a TFT 1629 through a wiring layer 1619 using an opening (contact hole) 1627. A gate wiring layer 1602 of the TFT 1628 and a gate electrode layer 1603 of the TFT 1629 are separated so that different gate signals can be given. On the other hand, a wiring layer 1616 serving as a data line is used in common for the TFT 1628 and the TFT 1629.

A thin film processing method utilizing laser beam irradiation and the stress of a processing thin film according to the present invention as described in Embodiment Modes 1 to 5 can be applied to pattern formation of a semiconductor layer that forms TFTs which are connected to respective pixel electrodes and a conductive layer that forms a gate electrode layer, a source electrode layer, and a drain electrode layer; formation of an opening for various electric connection; and the like. By employing the present invention, the lithography process that uses a photoresist can be reduced or simplified, and thin film processing can be conducted with more accuracy.

Note that the thin film processing method utilizing laser beam irradiation and the stress of a processing thin film need not necessarily be applied to all thin film processing. A thin film may be processed into a desired shape by using a lithography process and conducting selective etching. Further, a desired layer may be selectively formed in a desired place by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

Figure 19:
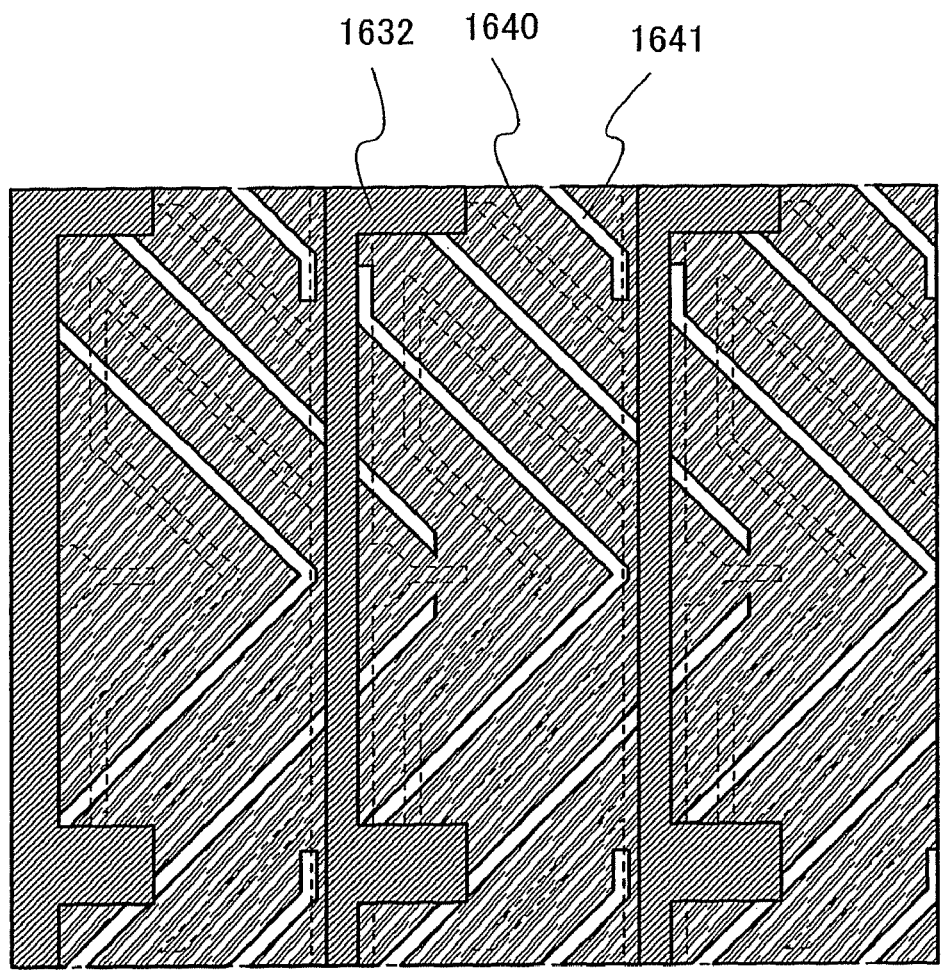
FIG. 19 shows an example of a display device according to the present invention.

The pixel electrode layer 1624 and the pixel electrode layer 1626 can be formed by formation of a conductive material over an entire surface and selective etching. A shape of the pixel electrode layer 1624 and a shape of the pixel electrode layer 1626 are different from each other, and those pixel electrode layers are separated by a slit 1625. The pixel electrode layer 1626 is formed so as to surround the external side of the pixel electrode layer 1624 that is spread in a V-shaped manner. Timing of voltage application is made to vary between the pixel electrode layer 1624 and the pixel electrode layer 1626 by the TFT 1628 and the TFT 1629, whereby orientation of liquid crystal is controlled. An opposite substrate 1601 is provided with a light-blocking layer 1632, a colored layer 1636, and an opposite electrode layer 1640. Furthermore, a planarization layer 1637 is formed between the colored layer 1636 and the opposite electrode layer 1640, whereby orientation disorder of liquid crystal is prevented. FIG. 19 shows a structure of the opposite substrate side. Although the opposite electrode layer 1640 is used in common between different pixels, a slit 1641 is formed. This slit 1641 and the slit 1625 on the pixel electrode layers 1624 and 1626 side are arranged to be meshed alternately, whereby an oblique electric field is efficiently generated, and orientation of liquid crystal can be controlled. Thus, directions in which liquid crystal is orientated can be varied depending on places, and a viewing angle is widened.

By the present invention, a layer having a desired pattern shape can be formed without using a lithography process that uses a photoresist. Therefore, the lithography process can be reduced or simplified; loss of a material such as a resist material or a developer can be prevented; and the number of photomasks that are necessary can be reduced. By controlling the stress of a process layer before and after ablation by laser beam irradiation, thin film processing can be conducted with accuracy and generation of a defect in a thin film pattern after processing can be prevented. Therefore, a display device with high reliability can be realized with high yield. In addition, throughput can be improved.

This embodiment mode can be appropriately combined with any of other embodiment modes described in this specification.

Embodiment Mode 10

In Embodiment Mode 10, a liquid crystal display device using a liquid crystal display element for a display element will be described.

Figure 30:
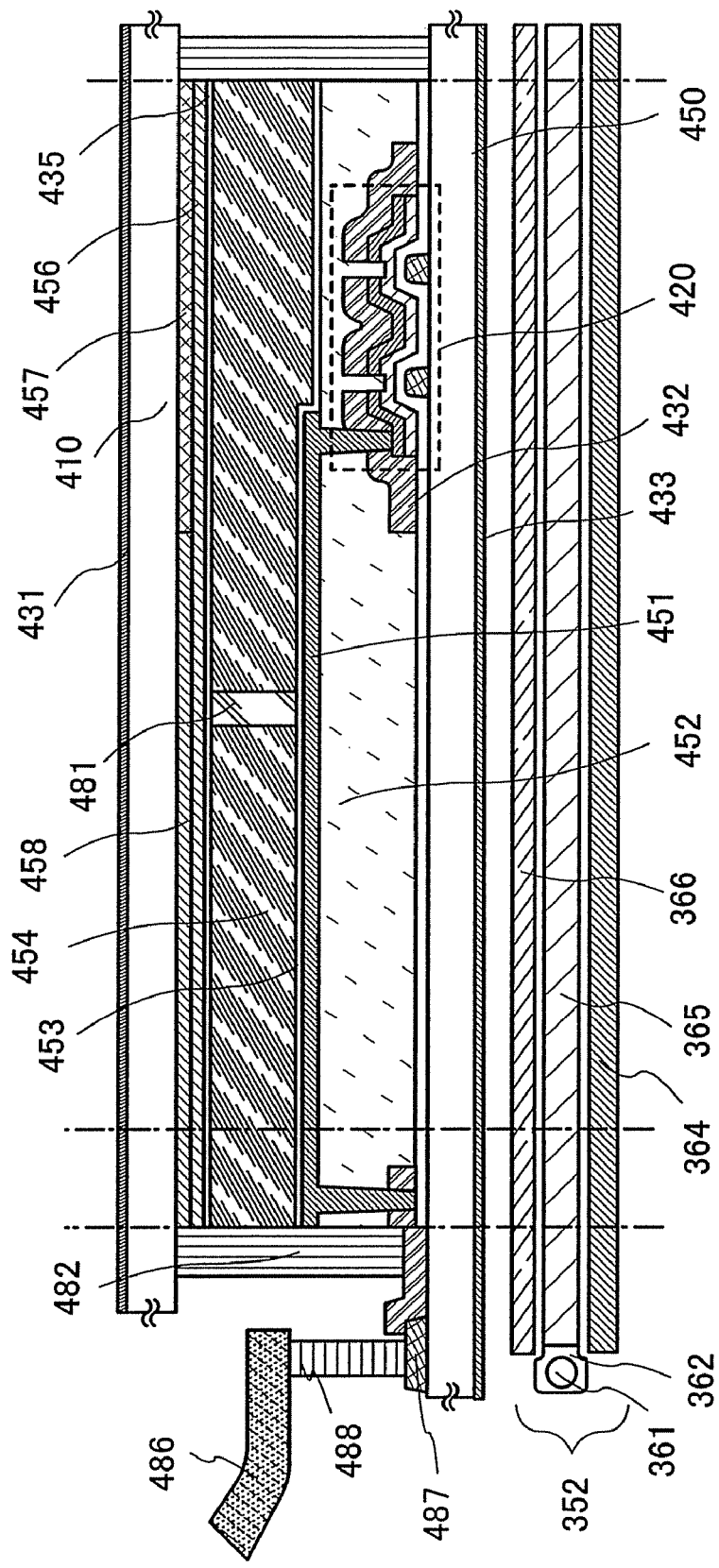
FIG. 30 shows an example of a display device according to the present invention.

In a display device shown in FIG. 30, the following is provided over a substrate 450: a transistor 420 that is an inverted staggered transistor, a pixel electrode layer 451, an insulating layer 452, an insulating layer 453, a liquid crystal layer 454, a spacer 481, an insulating layer 435, an opposite electrode layer 456, a color filter 458, a black matrix 457, an opposite substrate 410, a polarizing plate (polarizer) 431, a polarizing plate (polarizer) 433 in a pixel region; and a sealant 482, a terminal electrode layer 487, an anisotropic conductive layer 488, and an FPC 486 in a sealing region.

A gate electrode layer, a semiconductor layer, a source electrode layer, and a drain electrode layer of the transistor 420, and the pixel electrode layer 451 formed in this embodiment mode may be formed by a thin film processing method utilizing laser beam irradiation and the stress of a processing thin film according to the present invention as described in Embodiment Modes 1 to 5. By employing the present invention, the lithography process that uses a photoresist can be reduced or simplified, and thin film processing can be conducted with more accuracy.

Without using a laser beam, a thin film may be processed into a desired shape by using a lithography process and conducting selective etching. Further, a desired layer may be selectively formed in a desired place by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

In this embodiment mode, an amorphous semiconductor layer is used as a semiconductor layer for forming a channel. A semiconductor layer having one conductivity type provided between a source electrode layer or a drain electrode layer and the semiconductor layer for forming a channel may be formed as needed. In this embodiment mode, a semiconductor layer and an amorphous n-type semiconductor layer as a semiconductor layer having one conductivity type are stacked. Moreover, an NMOS structure of an n-channel thin film transistor where an n-type semiconductor layer is formed as a semiconductor layer having one conductivity type, a PMOS structure of a p-channel thin film transistor where a p-type semiconductor layer is formed, or a CMOS structure of an n-channel thin film transistor and a p-channel thin film transistor can be manufactured.

In order to impart conductivity, an element for imparting a conductivity type is added by doping, and an impurity region is formed in the semiconductor layer, whereby an n-channel transistor or a p-channel transistor can be formed. By plasma treatment using a $PH_3$ gas, a conductivity type may be imparted to the semiconductor layer.

In this embodiment mode, the transistor 420 is an n-channel inversely staggered thin-film transistor. A channel protection-type inversely staggered thin-film transistor can be used, where a protective layer is provided over a channel region of a semiconductor layer.

Next, a structure of a backlight unit 352 is explained. The backlight unit 352 includes a cold cathode tube, a hot cathode tube, a light-emitting diode, an inorganic EL, or an organic EL as a light source 361 that emits fluorescence; a light conducting plate 365 by which fluorescence is totally reflected and led to the entire surface; a lamp reflector 362 for effectively leading fluorescence to the light conducting plate 365; a diffusing plate 366 for reducing variations in brightness; and a reflector plate 364 for reusing light leaked under the light conducting plate 365.

A control circuit for controlling luminance of the light source 361 is connected to the backlight unit 352. The luminance of the light source 361 can be controlled by a signal supplied from the control circuit.

The source electrode layer or the drain electrode layer of the transistor 420 is electrically connected to the pixel electrode layer 451 by the opening formed in the insulating layer 452. The opening can be formed by a thin film processing method utilizing laser beam irradiation and the stress of a processing thin film according to the present invention as described in Embodiment Modes 1 to 5. Of course, the opening may be formed by utilizing a lithography process.

The pixel electrode layer 451 is formed in the opening formed in the insulating layer 452, so that the pixel electrode layer 451 is electrically connected to the source electrode layer or the drain electrode layer.

By the present invention, a layer having a desired pattern shape can be formed without using a lithography process that uses a photoresist. Therefore, the lithography process can be reduced or simplified; loss of a material such as a resist material or a developer can be prevented; and the number of photomasks that are necessary can be reduced. By controlling the stress of a process layer before and after ablation by laser beam irradiation, thin film processing can be conducted with accuracy and generation of a defect in a thin film pattern after processing can be prevented. Therefore, a display device with high reliability can be realized with high yield. In addition, throughput can be improved.

This embodiment mode can be appropriately combined with any of other embodiment modes described in this specification.

Embodiment Mode 11

In Embodiment Mode 11, an example of a display device different from that of the above embodiment mode will be described.

Figure 20:
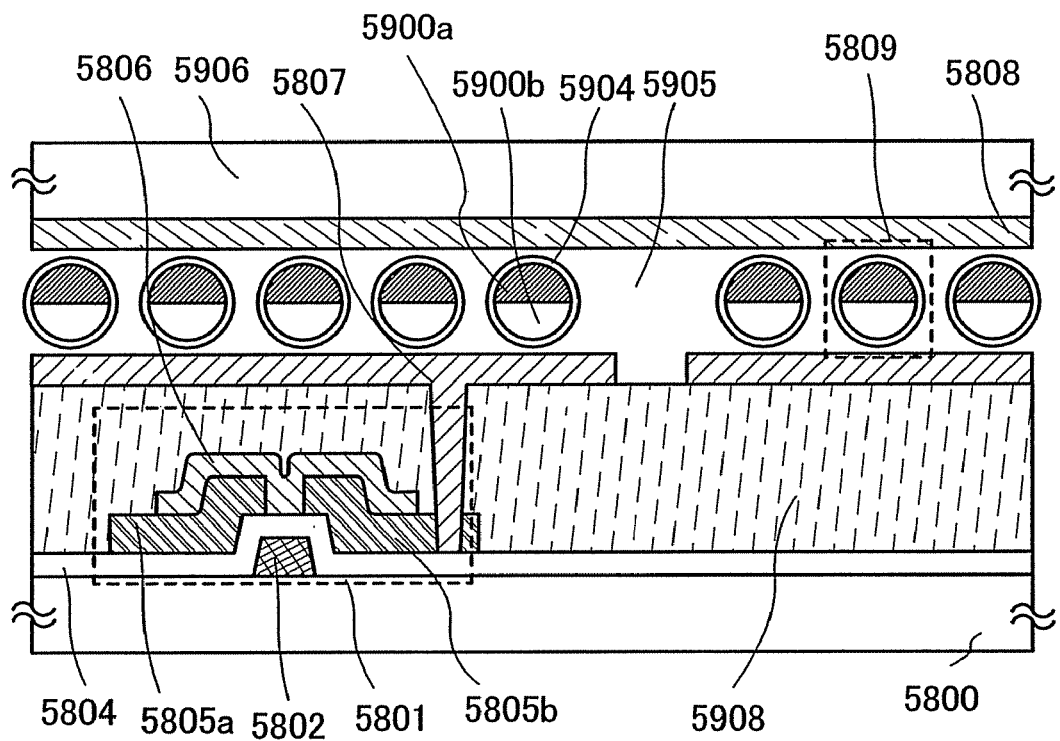
FIG. 20 shows an example of a display device according to the present invention.

FIG. 20 shows an active-matrix electronic paper to which the present invention is applied. Although in FIG. 20, the active-matrix electronic paper is shown, the present invention can be applied to a passive-matrix electronic paper.

As the electronic paper, a twisting ball display system can be used. A twisting ball display system is a method in which display is performed by arranging spherical particles, each of which is colored separately in black and white, between a first electrode layer and a second electrode layer, and generating a potential difference between the first electrode layer and the second electrode layer so as to control the directions of the spherical particles.

A transistor 5801 is an inverted coplanar thin film transistor, which includes a gate electrode layer 5802, a gate insulating layer 5804, wiring layers 5805*a* and 5805*b*, and a semiconductor layer 5806. The wiring layers 5805*a* and 5805*b* serve as a source electrode layer and drain electrode layer. In addition, the wiring layer 5805*b* is electrically connected to a first electrode layer 5807 through an opening formed in an insulating layer 5908. Between the first electrode layer 5807 and a second electrode layer 5808, spherical particles 5809, each of which includes a black region 5900*a* and a white region 5900*b*, and a cavity 5904 which is filled with liquid around the black region 5900*a* and the white region 5900*b*, are provided. A space around the spherical particle 5809 is filled with a filler 5905 such as a resin.

In this embodiment mode, a thin film processing method utilizing laser beam irradiation and the stress of a processing thin film according to the present invention as described in Embodiment Modes 1 to 5 can be applied to pattern formation of the gate electrode layer 5802, the semiconductor layer 5806, the wiring layers 5805*a* and 5805*b*, ant the like included in the transistor 5801; formation of an opening for various electric connection; and the like. By employing the present invention, the lithography process that uses a photoresist can be reduced or simplified, and thin film processing can be conducted with more accuracy.

Note that the thin film processing method utilizing laser beam irradiation and the stress of a processing thin film need not necessarily be applied to all thin film processing. A thin film may be processed into a desired shape by using a lithography process and conducting selective etching. Further, a desired layer may be selectively formed in a desired place by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like.

Instead of the twisting ball, an electrophoretic element can also be used. A microcapsule having a diameter of approximately 10 μm to 200 μm, in which a transparent liquid, and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is called electronic paper in general. The electrophoretic display element has higher reflectance than a liquid crystal display element, and thus, an auxiliary light is unnecessary, less power is consumed, and a display portion can be recognized in a dusky place. Even when power is not supplied to the display portion, an image which has been displayed once can be maintained. Thus, it is possible that a displayed image can be stored, even if a display device having a display function is distanced from a source of an electric wave.

Any structure is acceptable for the transistor as long as the transistor can serve as a switching element. The semiconductor layer may be formed using various semiconductors such as an amorphous semiconductor, a crystalline semiconductor, a polycrystalline semiconductor, and a microcrystalline semiconductor, or an organic transistor may be formed using an organic compound.

Although a case in which a structure of a display device is an active-matrix type is specifically described in this embodiment mode, the present invention can be naturally applied to a passive-matrix display device, as well.

By the present invention, a layer having a desired pattern shape can be formed without using a lithography process that uses a photoresist. Therefore, the lithography process can be reduced or simplified; loss of a material such as a resist material or a developer can be prevented; and the number of photomasks that are necessary can be reduced. By controlling the stress of a process layer before and after ablation by laser beam irradiation, thin film processing can be conducted with accuracy and generation of a defect in a thin film pattern after processing can be prevented. Therefore, a display device with high reliability can be realized with high yield. In addition, throughput can be improved.

This embodiment mode can be appropriately combined with any of other embodiment modes described in this specification.

Embodiment Mode 12

Next, a mode in which a driver circuit for driving is mounted on a display panel manufactured in accordance with Embodiment Modes 6 to 11 will be described.

First, a display device employing a COG method is described with reference to FIG. 17A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 17A shows a mode of mounting a plurality of driver ICs 2751 and FPCs 2750 mounted on the end of the driver ICs 2751. In addition, the size obtained after division may be made almost equal to the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 17B. Similarly to the case of a COG method, a single driver IC may be mounted on a single tape. In this case, a metal piece or the like for fixing the driver IC may be attached together in terms of the strength.

A plurality of driver ICs to be mounted on a display panel are preferably formed over a rectangular substrate having a size of 300 mm to 1000 mm, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or a length obtained by adding a side length of the pixel portion to a side length of each driver circuit.

An advantage of the driver IC over an IC chip is the length of the long side of the external dimension. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased because the shape of a substrate used as a mother body is not limited. This is a great advantage compared with the case of taking IC chips out of a circular silicon wafer.

When a scanning line driver circuit 3702 is formed in an integrated manner over a substrate as shown in FIG. 16B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with a continuous oscillation laser beam. Therefore, a continuous oscillation solid-state or gas laser is used for an oscillator for generating the laser beam. There are almost no crystal defects when continuous oscillation laser is used, and as a result, a polycrystalline semiconductor layer with a large grain size can be obtained. When a transistor is manufactured using such a semiconductor layer, high-speed driving is possible because mobility or response speed is high, and it is possible to further improve an operating frequency of an element than that of the conventional element. Therefore, high reliability can be obtained because variation in characteristics is little. Note that the channel-length direction of the transistor and a scanning direction of a laser beam may be arranged in the same direction to further improve the operating frequency. This is because the highest mobility can be obtained when a channel length direction of a transistor and a scanning direction of a laser beam over a substrate are almost parallel to each other (preferably, greater than or equal to −30° and less than or equal to 30°) in a step of laser crystallization with continuous oscillation laser. Note that the channel length direction corresponds to a current flowing direction, in other words, a direction in which an electric charge moves in a channel formation region. The thus manufactured transistor has a semiconductor layer including a polycrystalline semiconductor layer in which a crystal grain is extended in the channel direction, and this means that a crystal grain boundary is formed almost along the channel direction.

In order to perform laser crystallization, it is preferable to significantly narrow down the laser beam, and the shape of the laser beam (beam spot) preferably has the same width as that of a short side of the driver ICs, approximately 1 mm or more and 3 mm or less. In addition, in order to secure an enough and effective energy density for an irradiation object, a region irradiated with the laser beam preferably has a linear shape. The term "linear" used herein refers to not a line in a strict sense but a rectangle or an oblong with a large aspect ratio. For example, the linear shape refers to a shape with an aspect ratio of 2 or more (preferably greater than or equal to 10 and less than or equal to 10000). Thus, by making a width of the laser beam shape (beam spot) the same length as a short side of the driver ICs, a method for manufacturing a display device, of which productivity is improved, can be provided.

As shown in FIGS. 17A and 17B, driver ICs may be mounted as both the scanning line driver circuit and the signal line driver circuit. In this case, it is preferable to use the driver ICs having different specifications for the scanning line driver circuit and the signal line driver circuit.

In the pixel region, the signal line and the scanning line intersect to form a matrix, and transistors are arranged corresponding to each intersection. One feature of this embodiment mode is that a TFT having an amorphous semiconductor or a semiamorphous semiconductor as a channel portion is used as the transistor arranged in the pixel region. The amorphous semiconductor is formed by a method such as a plasma CVD method or a sputtering method. The semiamorphous semiconductor can be formed by a plasma CVD method at a temperature of 300° C. or less. A film thickness necessary to form the transistor is formed in a short time even in the case of using, for example, a non-alkaline glass substrate having an external size of 550 mm×650 mm. The feature of such a manufacturing technique is effective for manufacturing a large-sized display device. In addition, a semiamorphous TFT can obtain a field effect mobility of 2 $cm^2$/V·sec to 10 $cm^2$/V·sec by forming a channel formation region using a SAS. Thus, a display panel in which system-on-panel is realized can be manufactured.

The scanning line driver circuit can also be formed in an integrated manner over the substrate by using a TFT having a semiconductor layer formed of a SAS. In the case of using a TFT having a semiconductor layer formed of a SAS, the driver ICs may be mounted on both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, a drive frequency thereof is 100 kHz or less, and high-speed operation is not comparatively required. Therefore, it is preferable to set a channel length (L) of the transistor included in the scanning line driver sufficiently long. On the other hand, a transistor of the signal line driver IC is required to withstand a voltage of only approximately 12 V; however, a drive frequency thereof is around 65 MHz at 3 V, and high-speed operation is required. Therefore, it is preferable to set a channel length or the like of the transistor included in a driver on a micron rule.

A method for mounting the driver IC is not particularly limited, and a COG method, a wire bonding method, or a TAB method can be employed.

When the thicknesses of the driver IC and the opposite substrate are set equal to each other, the heights thereof are almost same, which contributes to thinning of a display device as a whole. When substrates are formed of the same material, thermal stress is not generated and characteristics of a circuit formed of a TFT are not damaged even when a temperature change is caused in the display device. Furthermore, the number of the driver ICs to be mounted on one pixel region can be reduced by mounting longer driver ICs than IC chips as driver circuits as described in this embodiment mode.

In this manner, a driver circuit can be incorporated in a display panel.

Embodiment Mode 13

In a display panel (EL display panel or liquid crystal display panel) manufactured in accordance with Embodiment Modes 6 to 12, an example will be shown, in which a semiconductor layer is formed of an amorphous semiconductor or a SAS, and a scanning line driver circuit is formed over a substrate.

Figure 22:
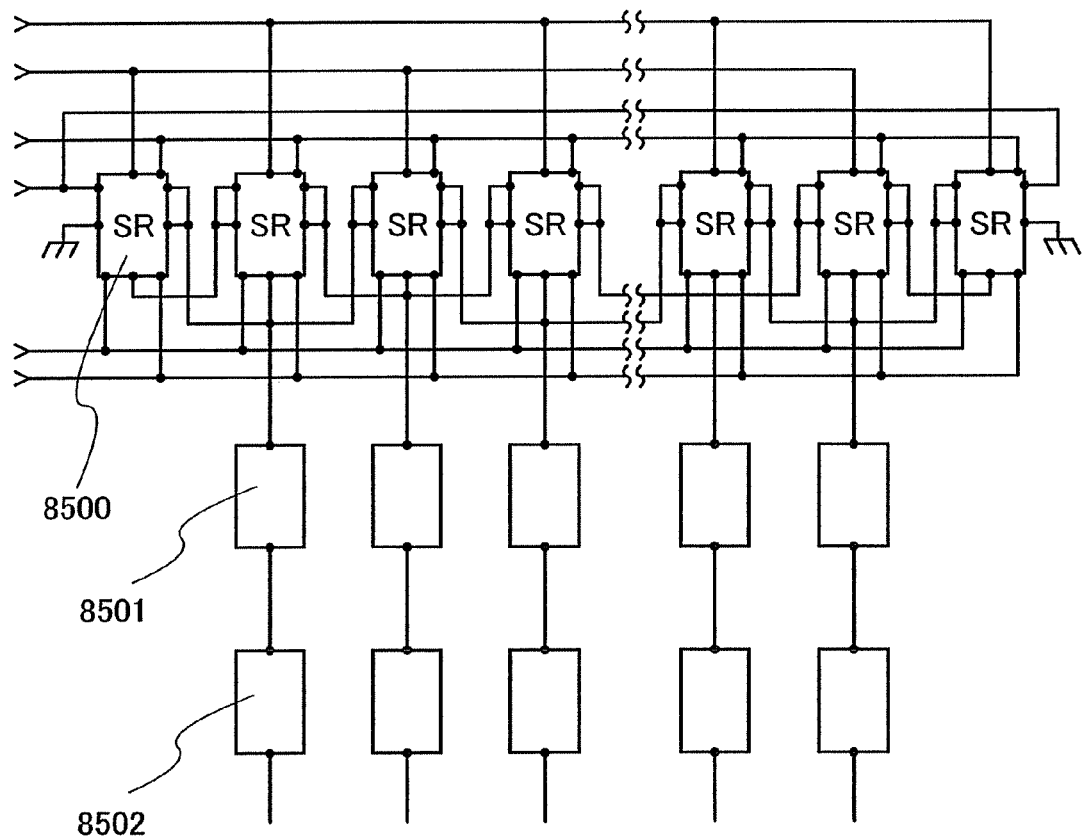
FIG. 22 shows an example of a circuit configuration of a display device according to the present invention.

FIG. 22 is a block diagram of a scanning line driver circuit that includes an n-channel TFT using a SAS in which a field-effect mobility of 1 $cm^2/V \cdot sec$ to 15 $cm^2/V \cdot sec$ can be obtained.

In FIG. 22, a block denoted by reference numeral 8500 corresponds to a pulse-output circuit that outputs a sampling pulse for one stage, and a shift register includes n pieces of pulse-output circuits. Reference numeral 8501 denotes a buffer circuit, and a pixel 8502 is connected to the end thereof.

Figure 23:
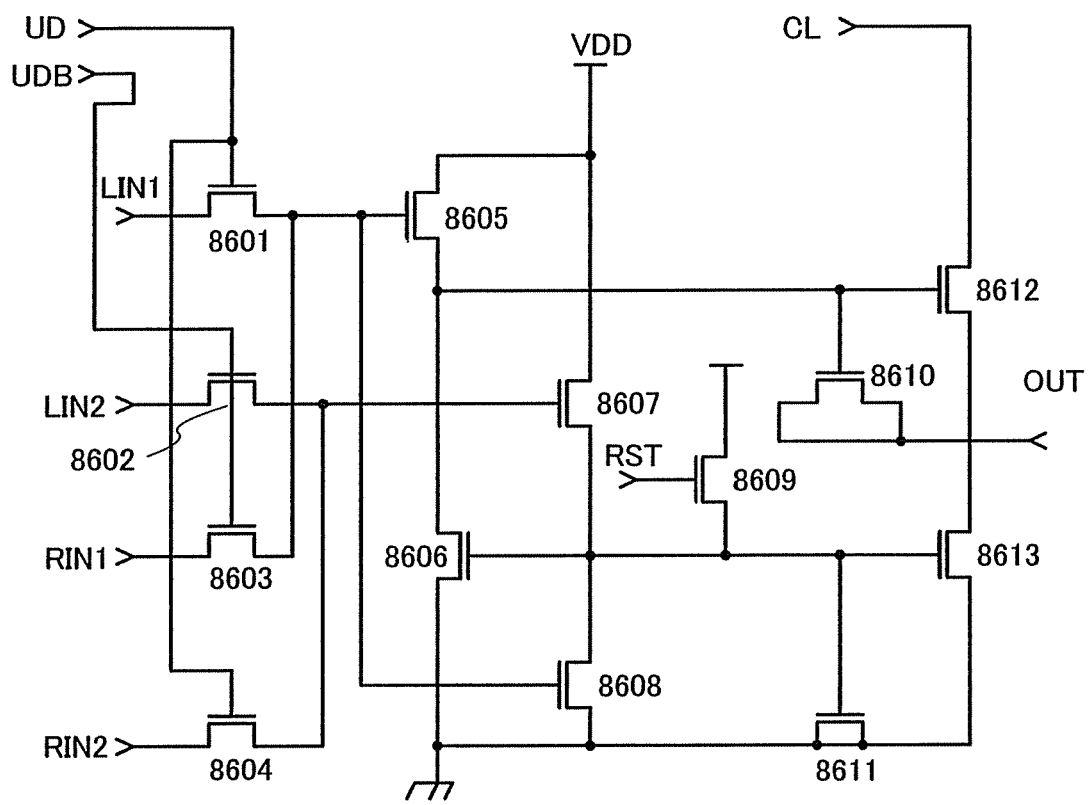
FIG. 23 shows an example of a circuit configuration of a display device according to the present invention.

FIG. 23 shows a specific structure of the pulse-output circuit 8500, which includes n-channel TFTs 8601 to 8613. At this point, a size of the TFTs may be determined in consideration of operation characteristics of the n-channel TFTs using a SAS. For example, when the channel length is 8 μm, the channel width can be set in a range of 10 μm to 80 μm.

Figure 24:
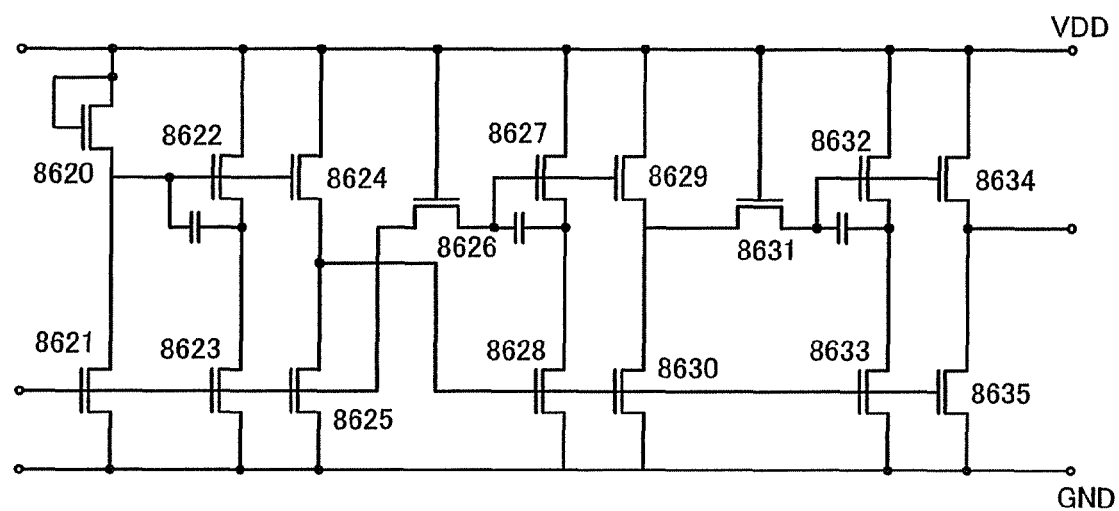
FIG. 24 shows an example of a circuit configuration of a display device according to the present invention.

Furthermore, a specific structure of the buffer circuit 8501 is shown in FIG. 24. Similarly, the buffer circuit includes n-channel TFTs 8620 to 8635. At this point, a size of the TFTs may be determined in consideration of operation characteristics of the n-channel TFTs using a SAS. For example, when the channel length is 10 μm, the channel width is to be set in a range of 10 μm to 1800 μm.

In order to realize such a circuit, it is necessary to connect the TFTs with one another by a wiring.

In such a manner, a driver circuit can be incorporated in a display panel.

Embodiment Mode 14

Embodiment Mode 14 will be described with reference to FIG. 28. FIG. 28 shows an example in which an EL display module is formed using a TFT substrate 2800 manufactured in accordance with the present invention. In FIG. 28, a pixel portion including pixels is formed over the TFT substrate 2800.

In FIG. 28, a TFT that has a similar structure to that formed in the pixel, or a protective circuit portion 2801 is provided between a driver circuit and the pixel and outside the pixel portion. The protective circuit portion 2801 operates in a similar manner to a diode by connecting either a source electrode layer or a drain electrode layer to a gate electrode layer of the TFT similar to that formed in the pixel. A driver IC formed of a single crystalline semiconductor, a stick driver IC formed of a polycrystalline semiconductor layer over a glass substrate, a driver circuit formed of a SAS, or the like is applied to a driver circuit 2809.

The TFT substrate 2800 is fixed to a sealing substrate 2820 with spacers 2806a and 2806b formed by a droplet discharge method interposed therebetween. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803 respectively may be filled with a resin material having a light-transmitting property to at least light of a visible region and the resin material may be solidified. Alternatively, the space may be filled with anhydrous nitrogen or an inert gas.

FIG. 28 shows a case where the light-emitting elements 2804 and 2805 have a top-emission structure, in which light is emitted in the direction of arrows shown in the drawing. Multicolor display can be performed by making the pixels emit light of different colors of red, green, and blue. At this time, color purity of the light emitted to the outside can be improved by forming colored layers 2807a to 2807c corresponding to respective colors on the sealing substrate 2820 side. Moreover, pixels that emit white light may be used and may be combined with the colored layers 2807a to 2807c.

The driver circuit 2809 that is an external circuit is connected by a wiring board 2810 to a scanning line or signal line connection terminal that is provided at one end of an external circuit substrate 2811. In addition, a heat pipe 2813, which is a high-efficiency heat conduction device having a pipe-like shape, and a heat sink 2812, each of which is used for conducting heat to the outside of the device, may be provided in contact with or adjacent to the TFT substrate 2800 to enhance a heat dissipation effect.

Note that FIG. 28 shows the top-emission EL display module; however, a bottom emission structure may be employed by changing the structure of the light-emitting element or the disposition of the external circuit board. Naturally, a dual emission structure in which light is emitted from both the top and bottom surfaces may be used. In the case of the top emission structure, the insulating layer serving as a partition may be colored and used as a black matrix. This partition can be formed by a droplet discharge method and it may be formed by mixing a black resin of a pigment material, carbon black, or the like into a resin material such as polyimide. A stack thereof may alternatively be used.

In addition, in the EL display module, reflected light of light that is incident from outside may be blocked by using a retardation film or a polarizing plate. In a top-emission display device, an insulating layer serving as a partition may be colored and used as a black matrix. This partition can be formed by a droplet discharge method or the like. Carbon black or the like may be mixed into a black resin of a pigment material or a resin material such as polyimide, and a stack thereof may also be used. By a droplet discharge method, different materials may be discharged to the same region plural times to form the partition. A quarter-wave plate or a half-wave plate may be used as the retardation film and may be designed to be able to control light. As the structure, a TFT element substrate, the light-emitting element, the sealing substrate (sealant), the retardation film (a quarter-wave plate or a half-wave plate), and the polarizing plate are sequentially stacked, through which light emitted from the light-emitting element passes and is emitted to the outside from the polarizing plate side. The retardation film or polarizing plate may be provided on a side where light is emitted or may be provided on both sides in the case of a dual emission display device in which light is emitted from the both surfaces. In addition, an anti-reflection film may be provided on the outer side of the polarizing plate. Accordingly, a more high-definition and accurate image can be displayed.

A resin film may be attached to the side of the TFT substrate 2800 where the pixel portion is formed, with the use of a sealant or an adhesive resin, to form a sealing structure. Although glass sealing using a glass substrate is used in this embodiment mode, various sealing methods such as resin sealing using a resin, plastic sealing using plastics, and film sealing using a film can be used. A gas barrier film that prevents water vapor from penetrating the resin film is preferably provided over the surface of the resin film. By employing a film sealing structure, further reductions in thickness and weight can be achieved.

In a display device provided with a TFT substrate or the like manufactured in accordance with the present invention, part of processes are simplified, and throughput in manufacturing is improved. In addition, a defect in manufacturing can be prevented, and yield is improved. Therefore, a display module with high reliability can be manufactured with high mass productivity.

This embodiment mode can be appropriately combined with any of other embodiment modes described in this specification.

Embodiment Mode 15

Embodiment Mode 15 will be described with reference to FIGS. 31A and 31B. FIGS. 31A and 31B show an example of forming a liquid crystal display module by using a TFT substrate 2600 manufactured by the present invention.

FIG. 31A shows an example of a liquid crystal display module, in which the TFT substrate 2600 and an opposite substrate 2601 are fixed to each other with a sealant 2602, and a pixel portion 2603 and a liquid crystal layer 2604 are provided therebetween to form a display region. A colored layer 2605 is necessary to perform color display. In the case of the RGB system, respective colored layers corresponding to colors of red, green, and blue are provided for corresponding pixels. The outer side of the TFT substrate 2600 is provided with a polarizing plate 2607 and a diffuser plate 2613, and the outer side of the opposite substrate 2601 is provided with a polarizing plate 2606. A light source includes a cold cathode tube 2610 and a reflector plate 2611. A circuit board 2612 is connected to the TFT substrate 2600 by a flexible wiring board 2609. External circuits such as a control circuit and a power supply circuit are incorporated in the circuit board 2612. The polarizing plate and the liquid crystal layer may be stacked with a retardation film interposed therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

FIG. 31B shows an example of applying an OCB mode to the liquid crystal display module of FIG. 31A, so that this liquid crystal display module is an FS-LCD (Field Sequential-LCD). The FS-LCD performs red, green, and blue light emissions in one frame period. Color display can be performed by composing an image by a time division method. Also, emission of each color is performed using a light-emitting diode, a cold cathode tube, or the like; hence, a color filter is not required. There is no necessity for arranging color filters of three primary colors and limiting a display region of each color. Display of all three colors can be performed in any region. On the other hand, since light emission of three colors is performed in one frame period, high speed response of liquid crystal is needed. When an FLC mode using an FS system and the OCB mode are applied to the display device of the present invention, a display device or a liquid crystal television device having higher performance and high image quality can be completed.

A liquid crystal layer of the OCB mode has a so-called $\pi$ cell structure. In the $\pi$ cell structure, liquid crystal molecules are oriented such that pretilt angles of the molecules are symmetrical with respect to the center plane between the active matrix substrate and the opposite substrate. The orientation in the $\pi$ cell structure is a splay orientation when a voltage is not applied between the substrates, and shifts into a bend orientation when the voltage is applied. White display is performed in this bend orientation. Further voltage application makes the liquid crystal molecules in the bend orientation orientated perpendicular to the substrates, which does not allow light to pass therethrough. Note that a response speed approximately ten times as high as that of a conventional TN mode can be achieved by using the OCB mode.

Further, as a mode corresponding to the FS system, an HV(HalfV)-FLC, an SS(Surface Stabilized)-FLC, or the like using a ferroelectric liquid crystal (FLC) that can operate at high speed can also be used. A nematic liquid crystal that has relatively low viscosity can be used for the OCB mode. A smectic liquid crystal that has a ferroelectric phase can be used for the HV-FLC or the SS-FLC.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch of a pixel region of a TN-mode liquid crystal display module is 30 μm or less. The optical response speed can be further increased by an overdrive method in which an applied voltage is increased (or decreased) only for a moment.

The liquid crystal display module of FIG. 31B is a transmissive liquid crystal display module, in which a red light source 2910a, a green light source 2910b, and a blue light source 2910c are provided as light sources. A control portion 2912 is provided for the light sources, to separately control the red light source 2910a, the green light source 2910b, and the blue light source 2910c to be turned on or off. The light emission of each color is controlled by the control portion 2912, and light enters the liquid crystal to compose an image using the time division, thereby performing color display.

The TFT substrate 2600 of the liquid crystal display module described above can be manufactured by the present invention. By employing the present invention, an opening for connecting the TFT substrate 2600 to the pixel portion or the like can be formed. Accordingly, part of processes can be simplified, and throughput is improved. In addition, a defect in manufacturing can be prevented, and yield is improved. Therefore, a display module with high reliability can be manufactured with high mass productivity.

This embodiment mode can be appropriately combined with any of other embodiment modes described in this specification.

Embodiment Mode 16

Figure 21:
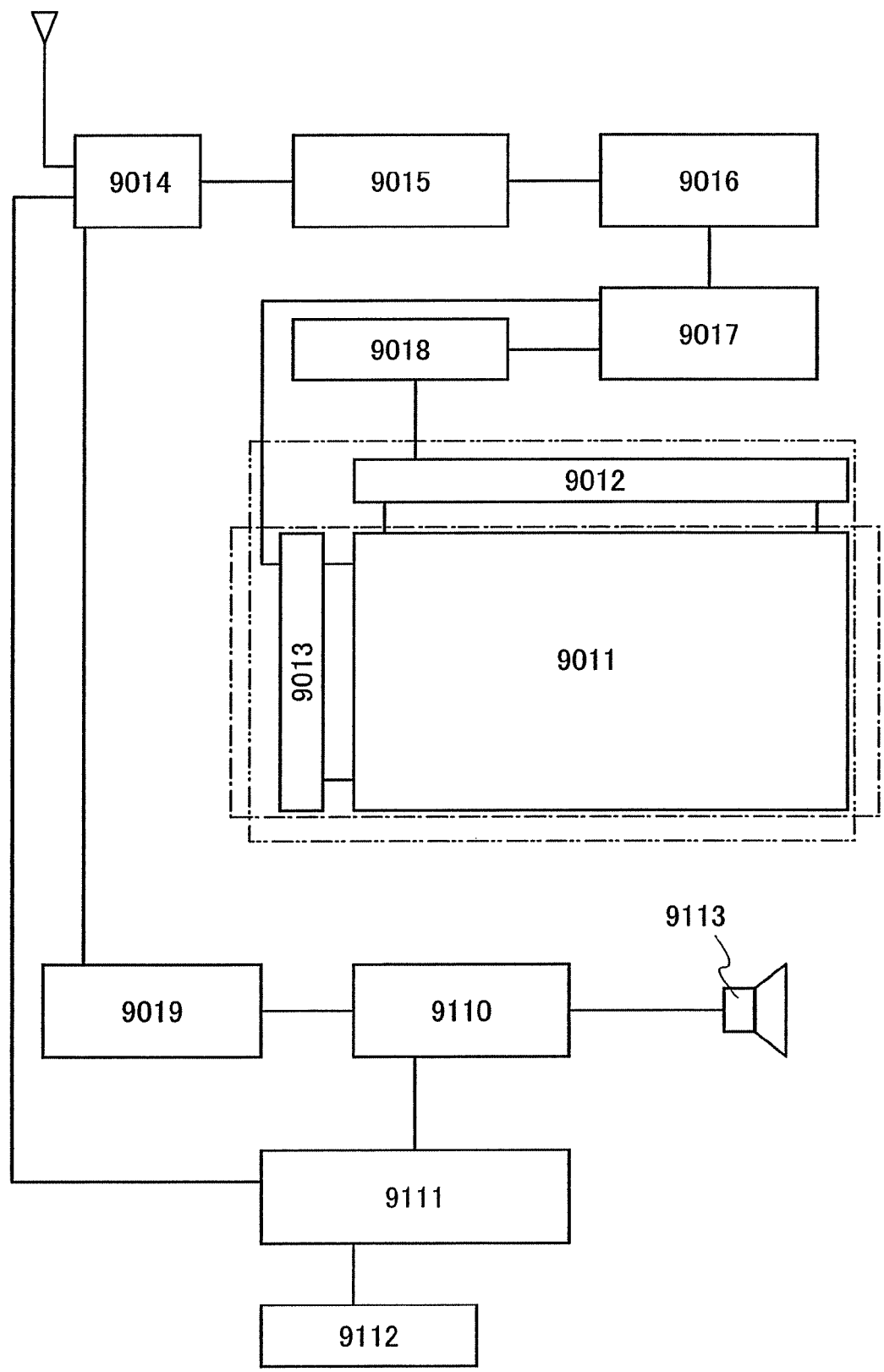
FIG. 21 is a block diagram showing a main structure of an electronic device according to the present invention.

With the display device formed by the present invention, a television device (also simply referred to as a television, or a television receiver) can be completed. FIG. 21 is a block diagram showing a main structure of the television device.

The display panel for forming a television device of this embodiment mode includes a pixel portion 9011, a signal line side driver circuit 9012, and a scanning line side driver circuit 9013. In the display panel, the signal line side driver circuit 9012 and the scanning line side driver circuit 9013 may be external driver circuits as shown in FIG. 16A, they may be additionally mounted as driver ICs by a COG method as shown in FIG. 17A, or they may be mounted as driver ICs by a TAB method as shown in FIG. 17B. Alternatively, the scanning line side driver circuit may be formed using TFTs integrally with the pixel portion over the substrate as shown in FIG. 16B, or the signal line side driver circuit and the scanning line side driver circuit may be formed using TFTs integrally with the pixel portion over the substrate as shown in FIG. 16C. Since detailed explanation of FIGS. 16A to 17B has been made in the above embodiment mode, it is omitted here.

As another external circuit in FIG. 21, a video signal amplifier circuit 9015 that amplifies a video signal among signals received by a tuner 9014, a video signal processing circuit 9016 that converts the signals output from the video signal amplifier circuit 9015 into chrominance signals corresponding to respective colors of red, green, and blue, a control circuit 9017 that converts the video signal into an input specification of the driver IC, and the like are provided on an input side of the video signal. The control circuit 9017 outputs signals to both a scanning line side and a signal line side. In the case of digital drive, a signal dividing circuit 9018 may be provided on the signal line side and an input digital signal may be divided into m pieces and supplied.

An audio signal among signals received by the tuner 9014 is sent to an audio signal amplifier circuit 9019 and is supplied to a speaker 9113 through an audio signal processing circuit 9110. A control circuit 9111 receives control information of a receiving station (reception frequency) or sound volume from an input portion 9112 and transmits signals to the tuner 9014 and the audio signal processing circuit 9110.

Figure 25A:
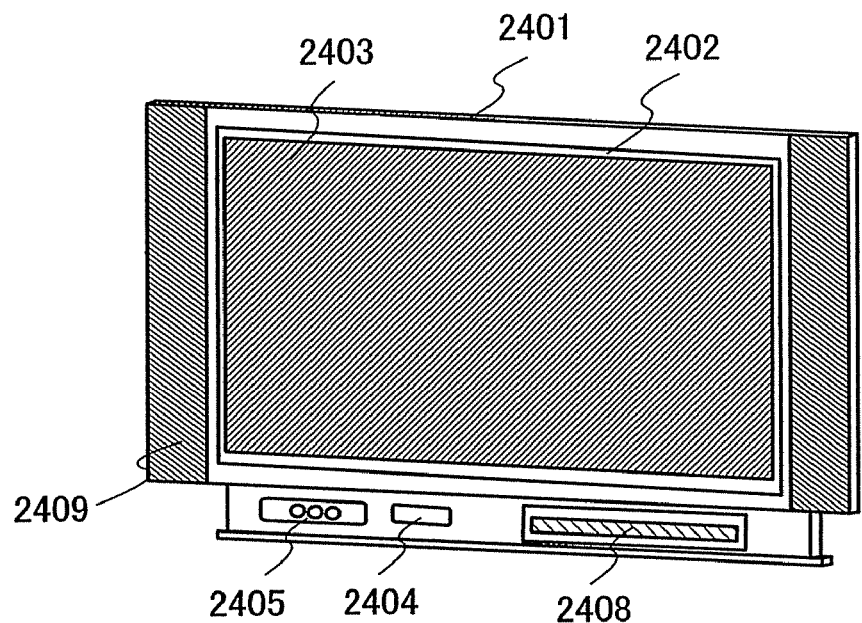
FIGS. 25A and 25B are examples of an electronic device according to the present invention.
Figure 25B:
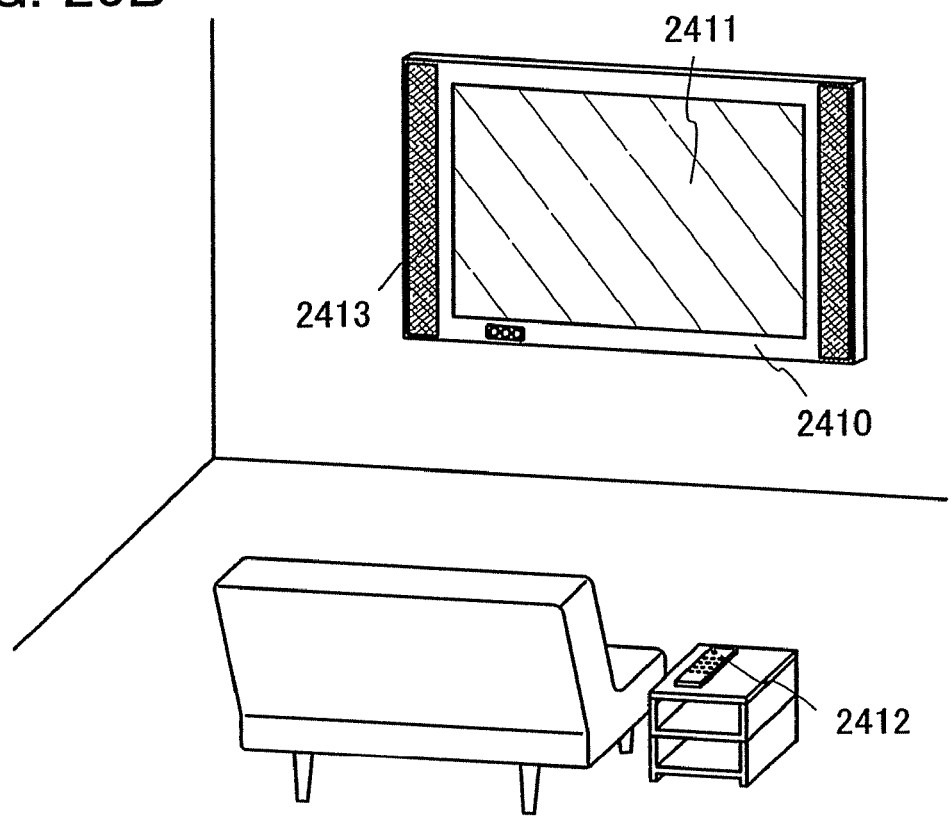

A television device can be completed by incorporating the display module into a chassis as shown in FIGS. 25A and 25B. When a liquid crystal display module is used as a display module, a liquid crystal television device can be manufactured. When an EL display module is used, an EL television device can be manufactured. Further, a plasma television, electronic paper, or the like can be manufactured. In FIG. 25A, a main screen 2403 is formed by using the display module, and a speaker portion 2409, an operation switch, and the like are provided as its accessory equipment. Thus, a television device can be completed in accordance with the present invention.

In FIG. 25A, a display panel 2402 is incorporated in a chassis 2401, and general TV broadcast can be received by a receiver 2405. When the display device is connected to a communication network by wired or wireless connections via a modem 2404, one-way (from a sender to a receiver) or two-way (between a sender and a receiver or between receivers) information communication can be performed. The television device can be operated by using a switch built in the chassis 2401 or a remote control unit 2406 that is separately formed. A display portion 2407 for displaying output information may also be provided in the remote control device 2406.

Further, the television device may include a sub screen 2408 formed using a second display panel so as to display channels, volume, or the like, in addition to the main screen 2403. In this structure, both the main screen 2403 and the sub screen 2408 can be formed using the liquid crystal display panel of the present invention or an EL display panel. Alternatively, the main screen 2403 may be formed using an EL display panel having a wide viewing angle, and the sub screen 2408 may be formed using a liquid crystal display panel capable of displaying images with less power consumption. In order to reduce the power consumption preferentially, the main screen 2403 may be formed using a liquid crystal display panel, and the sub screen may be formed using an EL display panel, which can be switched on and off. In accordance with the present invention, a highly reliable display device can be manufactured at a reduced manufacturing cost even when a large-area substrate is used and a large number of TFTs or electronic components are used.

FIG. 25B shows a television device having a large-sized display portion, for example, a 20-inch to 80-inch display portion. The television device includes a chassis 2410, a display portion 2411, a remote control device 2412 that is an operation portion, a speaker portion 2413, and the like. The present invention is applied to manufacture of the display portion 2411. Since the television device in FIG. 25B is a wall-hanging type, it does not require a large installation space.

Naturally, the present invention is not limited to the television device, and can be applied to various use applications as a large-sized display medium such as an information display board at a train station, an airport, or the like, or an advertisement display board on the street, as well as a monitor of a personal computer.

By employing the present invention, an opening for connecting a TFT to a pixel in a display device, or the like can be formed. Accordingly, the process can be simplified, and throughput can be improved in manufacturing a display device.

This embodiment mode can be appropriately combined with any of other embodiment modes described in this specification.

Embodiment Mode 17

Examples of electronic devices in accordance with the present invention are as follows: television devices (also simply referred to as a television, or a television receiver), cameras such as a digital camera and a digital video camera, cellular telephone devices (also simply referred to as a cellular phone or a cell-phone), portable information terminals such as PDA, portable game machines, computer monitors, computers, sound reproducing devices such as a car audio system, image reproducing devices including a recording medium, such as a home-use game machine, and the like. Specific examples of them are described with reference to FIGS. 26A to 26E.

Figure 26A:
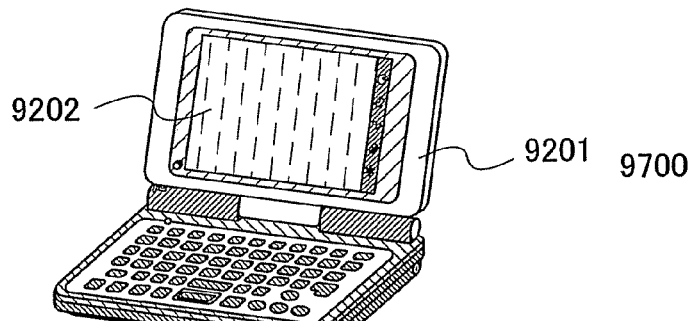
FIGS. 26A to 26E show examples of an electronic device according to the present invention.

A portable information terminal device shown in FIG. 26A includes a main body 9201, a display portion 9202, and the like. A display device according to the present invention can be applied to the display portion 9202. As a result, a defect in manufacturing can be prevented and yield can be improved. Therefore, a portable information terminal device can be manufactured with high mass productivity.

Figure 26B:
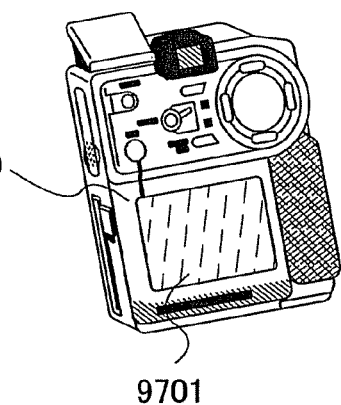

A digital video camera shown in FIG. 26B includes a main body 9700, a display portion 9701, and the like. A display device according to the present invention can be applied to the display portion 9701. As a result, a defect in manufacturing can be prevented and yield can be improved. Therefore, a digital video camera can be manufactured with high mass productivity.

Figure 26C:
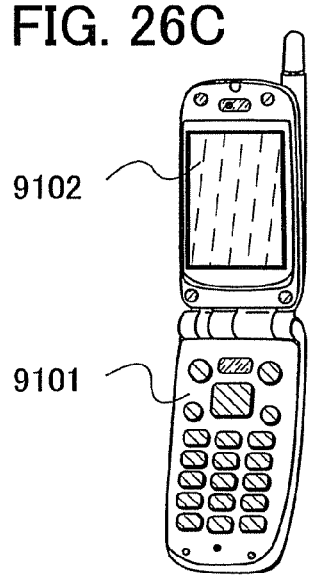

A cellular phone shown in FIG. 26C includes a main body 9101, a display portion 9102, and the like. A display device according to the present invention can be applied to the display portion 9102. As a result, a defect in manufacturing can be prevented and yield can be improved. Therefore, a cellular phone can be manufactured with high mass productivity.

Figure 26D:
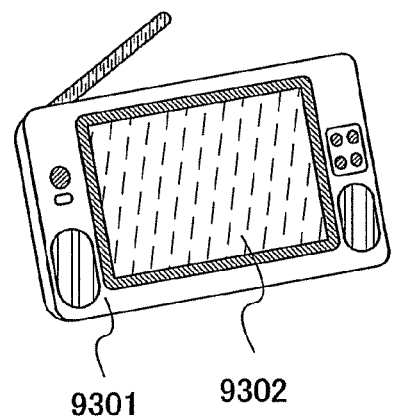

A portable television device shown in FIG. 26D includes a main body 9301, a display portion 9302, and the like. A display device according to the present invention can be applied to the display portion 9302. As a result, a defect in manufacturing can be prevented and yield can be improved. Therefore, a portable television device can be manufactured with high mass productivity. The display device according to the present invention can be applied to a wide range of television devices ranging from a small-sized television device mounted on a portable terminal such as a cellular phone, a medium-sized television device which can be carried, to a large-sized (for example, 40-inch or larger) television device.

Figure 26E:
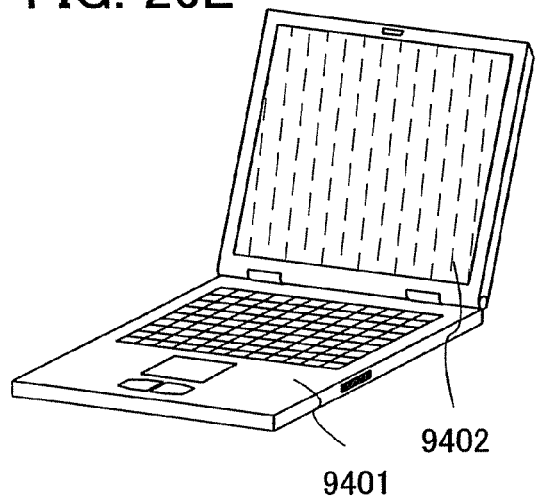

A portable computer shown in FIG. 26E includes a main body 9401, a display portion 9402, and the like. A display device according to the present invention can be applied to the display portion 9402. As a result, a defect in manufacturing can be prevented and yield can be improved. Therefore, a portable computer can be manufactured with high mass productivity.

In this manner, by employing the display device according to the present invention, electronic devices can be manufactured with high mass productivity. In addition, highly reliable electronic devices can be manufactured.

This embodiment mode can be appropriately combined with any of other embodiment modes described in this specification.

Embodiment 1

In Embodiment 1, the result obtained by observing change of stresses of conductive layers that can serve as light absorption layers, will be described.

Conductive layers of a film A, a film B, and a film C each having a thickness of 100 nm were formed by a sputtering method over quartz substrates. Then, an impurity element or an inert element was added to the conductive layers by an ion implantation method under any of doping conditions I, II, and III; accordingly, samples 1 to 9 were manufactured. The films and doping conditions for the samples 1 to 9 are shown in Table 1 below. The sample 1 was formed in such a way that a conductive layer of the film A was formed and an impurity element or an inert element was added to the conductive layer under the doping condition I. The sample 2 was formed in such a way that a conductive layer of the film A was formed and an impurity element or an inert element was added to the conductive layer under the doping condition II. The sample 3 was formed in such a way that a conductive layer of the film A was formed and an impurity element or an inert element was added to the conductive layer under the doping condition III. The sample 4 was formed in such a way that a conductive layer of the film B was formed and an impurity element or an inert element was added to the conductive layer under the doping condition I. The sample 5 was formed in such a way that a conductive layer of the film B was formed and an impurity element or an inert element was added to the conductive layer under the doping condition II. The sample 6 was formed in such a way that a conductive layer of the film B was formed and an impurity element or an inert element was added to the conductive layer under the doping condition III. The sample 7 was formed in such a way that a conductive layer of the film C was formed and an impurity element or an inert element was added to the conductive layer under the doping condition I. The sample 8 was formed in such a way that a conductive layer of the film C was formed and an impurity element or an inert element was added to the conductive layer under the doping condition II. The sample 9 was formed in such a way that a conductive layer of the film C was formed and an impurity element or an inert element was added to the conductive layer under the doping condition III.

TABLE 1

| sample No. | film type | doping condition |
|---|---|---|
| 1 | A | I |
| 2 | A | II |
| 3 | A | III |
| 4 | B | I |
| 5 | B | II |
| 6 | B | III |
| 7 | C | I |
| 8 | C | II |
| 9 | C | III |

As the film A, a tungsten (W) layer was formed. The film formation conditions were such that a tungsten target was used, the film formation power was 4.0 kW, the film formation pressure was 2.0 Pa, the flow rate of an argon (Ar) gas was 100 sccm, and the flow rate of a heated Ar gas from the back side of the substrate was 10 sccm.

As the film B, a molybdenum (Mo) layer was formed. The film formation conditions were such that a molybdenum target is used, the film formation power was 1.5 kW, the film formation pressure was 0.4 Pa, the flow rate of an Ar gas was 30 sccm, and the flow rate of a heated Ar gas from the back side of the substrate was 10 sccm.

As the film C, a molybdenum (Mo) layer was formed. The film formation conditions were such that a molybdenum target is used, the film formation power was 1.5 kW, the film formation pressure was 0.8 Pa, the flow rate of an Ar gas was 50 sccm, and the flow rate of a heated Ar gas from the back side of the substrate was 10 sccm. The materials, the film formation powers, and the film formation pressures for the films A to C are shown in Table 2.

TABLE 2

| film type | material | film formation power (kW) | film formation pressure (Pa) |
|---|---|---|---|
| A | W | 4.0 | 2.0 |
| B | Mo | 1.5 | 0.4 |
| C | Mo | 1.5 | 0.8 |

In the doping condition I, argon (Ar) was added to the conductive layer as the impurity element or the inert element. The doping condition was such that an Ar gas was used as a doping gas, the gas flow rate was 30 sccm, the beam current was 5 µA/cm$^2$, the acceleration voltage was 15 kV, and the dose amount was $5.0 \times 10^{14}$ atoms/cm$^2$.

In the doping condition II, boron (B) was added to the conductive layer as the impurity element or the inert element. The doping condition was such that a diborane ($B_2H_6$) gas (the doping gas was formed by diluting $B_2H_6$ with hydrogen ($H_2$), and the rate of $B_2H_6$ in the doping gas was 5%) was used as a doping gas, the gas flow rate was 30 sccm, the high frequency power source was 20 W, the acceleration voltage was 10 kV, and the dose amount was $2.0 \times 10^{15}$ atoms/cm$^2$.

In the doping condition III, phosphorus (P) was added to the conductive layer as the impurity element or the inert element. The doping condition was such that a phosphine ($PH_3$) gas (the doping gas was formed by diluting $PH_3$ with hydrogen ($H_2$), and the rate of $PH_3$ in the doping gas was 5%) was used as a doping gas, the gas flow rate was 20 sccm, the high frequency power source was 20 W, the acceleration voltage was 10 kV, and the dose amount was $1.0 \times 10^{15}$ atoms/cm$^2$. The elements added and the dose amounts for the doping conditions I to III are shown in Table 3.

TABLE 3

| doping condition | element | dose amount |
|---|---|---|
| I | Ar | $5.0 \times 10^{14}$ |
| II | B | $2.0 \times 10^{15}$ |
| III | P | $1.0 \times 10^{15}$ |

Figure 36:
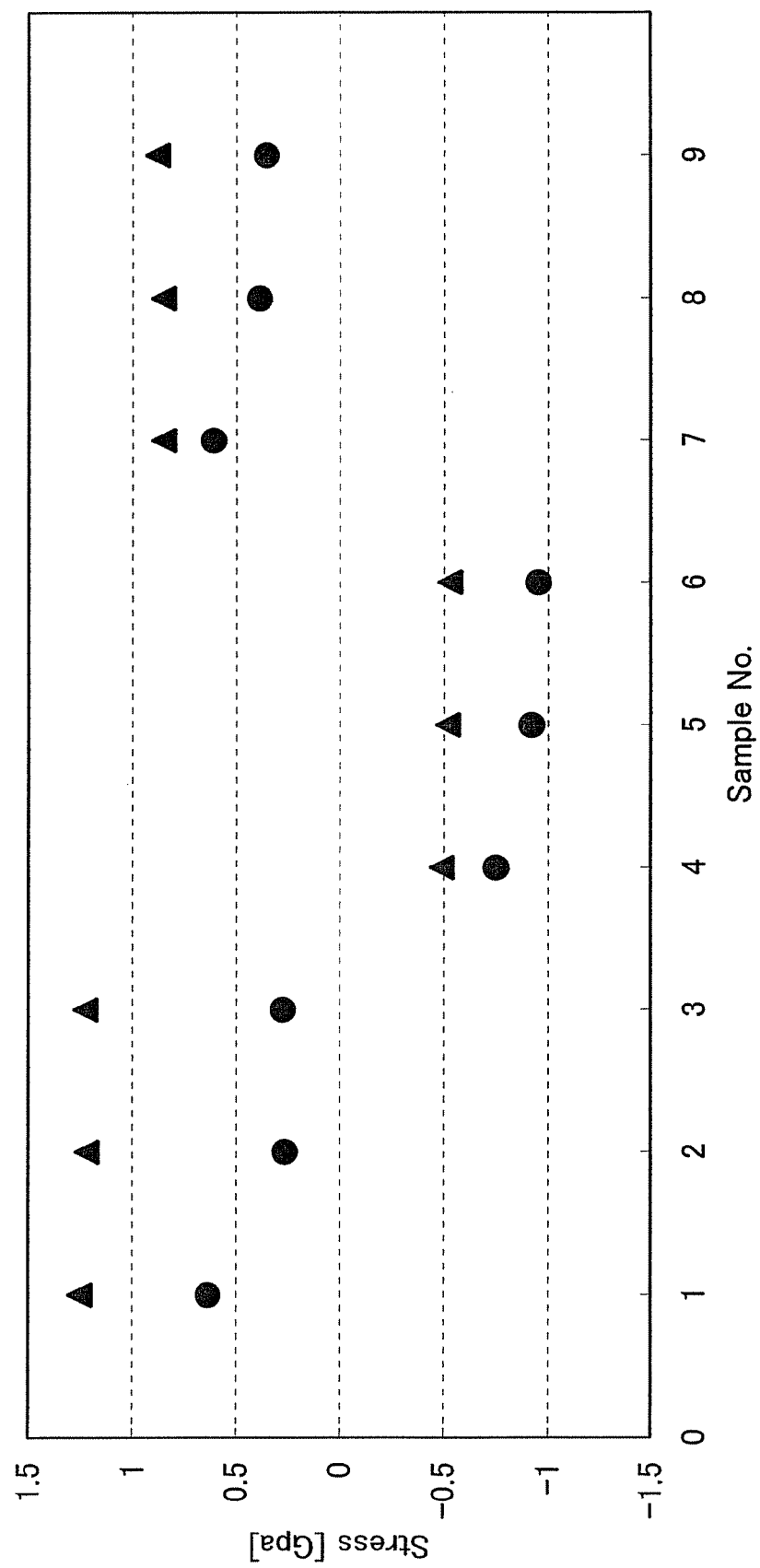
FIG. 36 shows stress change of conductive layers.

FIG. 36 shows the result obtained by measuring the stress after formation of the conductive layers and the stress after addition of the impurity element or the inert element, of the samples 1 to 9. In the graph shown in FIG. 36, the horizontal axis represents the sample number, and the vertical axis represents the stress (GPa). In the samples 1 to 9, the stresses measured after formation of the conductive layers were plotted with triangular marks. In the samples 1 to 9, the stresses measured after addition of the impurity element or the inert element were plotted with circular marks. In FIG. 36, it is assumed that when there is no stress, the value of the stress is zero; when the tensile stress exists, the value of the stress is positive (+; plus); and when the compressive stress exists, the value of the stress is negative (−; minus).

As apparent from FIG. 36, in the samples 1 to 3 and the samples 7 to 9, it can be found that the stresses after addition of the impurity element or the inert element become close to zero from the positive side, compared to the stresses after formation of the conductive layers. Therefore, it can be found that addition of the impurity element or the inert element makes the tensile stress lower.

Further, in the samples 4 to 6, it can be found that the stresses after addition of the impurity element or the inert element become far from zero to the negative side, compared to the stresses after formation of the conductive layers. Therefore, it can be found that addition of the impurity element or the inert element makes the compressive stress higher. That is, it can be understood that by adding the impurity element or the inert element, the tensile stress becomes low.

From the above-described result, it can be found that by adding an impurity element or an inert element to a conductive layer, the tensile stress of the conductive layer can be lowered.

This application is based on Japanese Patent Application serial no. 2006-343418 filed with Japan Patent Office on Dec. 20, 2006, the entire contents of which are hereby incorporated by reference.

What is claimed is:

1. A manufacturing method of a semiconductor device, comprising the steps of:
   forming a light absorption layer of conductive material or semiconductor material;
   selectively irradiating at least one region of the light absorption layer with a laser beam to thereby removing the irradiated region of the light absorption layer; and
   adding an impurity element imparting one conductivity type or an inert element to a remaining part of the light absorption layer to reduce a tensile stress of the light absorption layer.

2. The manufacturing method of a semiconductor device according to claim 1, further comprising the steps of:
   forming a first material layer before forming the light absorption layer; and
   selectively etching the first material layer using a remaining part of the light absorption layer as a mask.

3. The manufacturing method of a semiconductor device according to claim 2, wherein the first material layer is formed using a conductive material or a semiconductor material.

4. The manufacturing method of a semiconductor device according to claim 1, wherein the light absorption layer is formed so as to have tensile stress.

5. The manufacturing method of a semiconductor device according to claim 1, wherein a tensile stress of the light absorption layer is made lower than that before the irradiating step by adding the impurity element or the inert element.

6. The manufacturing method of a semiconductor device according to claim 1, wherein phosphorus (P) or arsenic (As), which is an impurity element imparting n-type conductivity, is added as the impurity element imparting one conductivity type.

7. The manufacturing method of a semiconductor device according to claim 1, wherein boron (B), aluminum (Al), or gallium (Ga), which is an impurity element imparting p-type conductivity, is added as the impurity element imparting one conductivity type.

8. The manufacturing method of a semiconductor device according to claim 1, wherein nitrogen (N), helium (He), neon (Ne), argon (Ar), krypton (Kr), or xenon (Xe) is added as the inert element.

9. The manufacturing method of a semiconductor device according to claim 1, wherein the light absorption layer is to be used as a conductive layer or a semiconductor layer.

10. A manufacturing method of a semiconductor device, comprising the steps of:
    sequentially forming a light absorption layer and a light-transmitting layer;
    selectively irradiating at least one region of the light absorption layer with a laser beam to remove at least a region of the light-transmitting layer adjacent to the irradiated region of the light absorption layer; and
    adding an impurity element imparting one conductivity type or an inert element to a remaining part of the light-transmitting layer to reduce a tensile stress of the light-transmitting layer.

11. The manufacturing method of a semiconductor device according to claim 10,
    wherein the irradiated region of the light absorption layer is also removed by the irradiating step, and
    wherein the method further comprises the steps of:
    forming a first material layer before forming the light absorption layer; and
    selectively etching the first material layer using a remaining part of the light-transmitting layer and the light absorption layer as a mask.

12. The manufacturing method of a semiconductor device according to claim 11, wherein the first material layer is formed using a conductive material or a semiconductor material.

13. The manufacturing method of a semiconductor device according to claim 10, further comprising the step of:
    forming a conductive layer over the light-transmitting layer so that the conductive layer is electrically connected to the light absorption layer through the removed region of the light-transmitting layer.

14. The manufacturing method of a semiconductor device according to claim 10,
    wherein the irradiated region of the light absorption layer is also removed by the irradiating step, and
    wherein the method further comprises the steps of:
    forming a first material layer before forming the light absorption layer; and
    forming a conductive layer over the light-transmitting layer so that the conductive layer is electrically connected to the first material layer through the removed region of the light-transmitting layer and the light absorption layer.

15. The manufacturing method of a semiconductor device according to claim 14, wherein the first material layer is formed using a conductive material or a semiconductor material.

16. The manufacturing method of a semiconductor device according to claim 10, wherein the light absorption layer is formed using a conductive material or a semiconductor material.

17. The manufacturing method of a semiconductor device according to claim 10, wherein a tensile stress of the light-transmitting layer is made lower than that before the irradiating step by adding the impurity element or the inert element.

18. The manufacturing method of a semiconductor device according to claim 10, wherein phosphorus (P) or arsenic (As), which is an impurity element imparting n-type conductivity, is added as the impurity element imparting one conductivity type.

19. The manufacturing method of a semiconductor device according to claim 10, wherein boron (B), aluminum (Al), or gallium (Ga), which is an impurity element imparting p-type conductivity, is added as the impurity element imparting one conductivity type.

20. The manufacturing method of a semiconductor device according to claim 10, wherein nitrogen (N), helium (He), neon (Ne), argon (Ar), krypton (Kr), or xenon (Xe) is added as the inert element.

21. A manufacturing method of a semiconductor device, comprising the steps of:
sequentially forming a first material layer and a separation layer;
selectively irradiating at least one region of the separation layer with a laser beam to decrease adhesiveness of the irradiated region of the separation layer;
removing, after the step of selective irradiation, the irradiated region of the separation layer;
selectively etching the first material layer using a remaining part of the separation layer as a mask; and
adding an impurity element imparting one conductivity type or an inert element to the remaining part of the separation layer to reduce a tensile stress of the separation layer.

22. The manufacturing method of a semiconductor device according to claim 21, wherein a tensile stress of the separation layer is made lower than that before the irradiating step by adding the impurity element or the inert element.

23. The manufacturing method of a semiconductor device according to claim 21, wherein a layer that absorbs the laser beam is formed as the separation layer.

24. The manufacturing method of a semiconductor device according to claim 21, wherein a metal oxide layer is formed as the separation layer.

25. The manufacturing method of a semiconductor device according to claim 21, wherein the first material layer is formed using a conductive material or a semiconductor material.

26. The manufacturing method of a semiconductor device according to claim 21, wherein phosphorus (P) or arsenic (As), which is an impurity element imparting n-type conductivity, is added as the impurity element imparting one conductivity type.

27. The manufacturing method of a semiconductor device according to claim 21, wherein boron (B), aluminum (Al), or gallium (Ga), which is an impurity element imparting p-type conductivity, is added as the impurity element imparting one conductivity type.

28. The manufacturing method of a semiconductor device according to claim 21, wherein nitrogen (N), helium (He), neon (Ne), argon (Ar), krypton (Kr), or xenon (Xe) is added as the inert element.

29. A manufacturing method of a semiconductor device, comprising the steps of:
sequentially forming a first material layer, a separation layer, and a light-transmitting layer;
selectively irradiating at least one region of the separation layer with a laser beam to decrease adhesiveness of the irradiated region of the separation layer
removing the irradiated region of the separation layer and a region of the light-transmitting layer adjacent to the irradiated region of the separation layer;
selectively etching the first material layer using a remaining part of the light-transmitting layer and the separation layer as a mask; and
adding an impurity element imparting one conductivity type or an inert element to the remaining part of the light-transmitting layer and the separation layer to reduce a tensile stress of the separation layer.

30. The manufacturing method of a semiconductor device according to claim 29, wherein a tensile stress of the separation layer is made lower than that before the irradiating step by adding the impurity element or the inert element.

31. The manufacturing method of a semiconductor device according to claim 29, wherein a layer that absorbs the laser beam is formed as the separation layer.

32. The manufacturing method of a semiconductor device according to claim 29, wherein a metal oxide layer is formed as the separation layer.

33. The manufacturing method of a semiconductor device according to claim 29, wherein the first material layer is formed using a conductive material or a semiconductor material.

34. The manufacturing method of a semiconductor device according to claim 29, wherein phosphorus (P) or arsenic (As), which is an impurity element imparting n-type conductivity, is added as the impurity element imparting one conductivity type.

35. The manufacturing method of a semiconductor device according to claim 29, wherein boron (B), aluminum (Al), or gallium (Ga), which is an impurity element imparting p-type conductivity, is added as the impurity element imparting one conductivity type.

36. The manufacturing method of a semiconductor device according to claim 29, wherein nitrogen (N), helium (He), neon (Ne), argon (Ar), krypton (Kr), or xenon (Xe) is added as the inert element.

* * * * *